(12) United States Patent
Kinoshita

(10) Patent No.: US 9,117,826 B2
(45) Date of Patent: Aug. 25, 2015

(54) METHOD OF MANUFACTURING SEMICONDUCTOR DEVICE, AND SEMICONDUCTOR DEVICE

(71) Applicant: Renesas Electronics Corporation, Kawasaki-shi, Kanagawa (JP)

(72) Inventor: Nobuhiro Kinoshita, Kanagawa (JP)

(73) Assignee: Renesas Electronics Corporation, Kawasaki-shi (JP)

(*) Notice: Subject to any disclaimer, the term of this patent is extended or adjusted under 35 U.S.C. 154(b) by 0 days.

(21) Appl. No.: 14/194,890

(22) Filed: Mar. 3, 2014

(65) Prior Publication Data

US 2014/0284780 A1    Sep. 25, 2014

(30) Foreign Application Priority Data

Mar. 22, 2013   (JP) .................. 2013-061087

(51) Int. Cl.
  *H01L 23/544* (2006.01)
  *H01L 23/00* (2006.01)
  *H01L 25/065* (2006.01)

(52) U.S. Cl.
  CPC .............. *H01L 23/544* (2013.01); *H01L 24/97* (2013.01); *H01L 25/0657* (2013.01); *H01L 2223/5442* (2013.01); *H01L 2223/54426* (2013.01); *H01L 2223/54473* (2013.01); *H01L 2224/16225* (2013.01); *H01L 2224/83192* (2013.01); *H01L 2924/07802* (2013.01); *H01L 2924/15174* (2013.01); *H01L 2924/15311* (2013.01)

(58) Field of Classification Search
  CPC .... H01L 23/544; H01L 25/0657; H01L 24/97
  See application file for complete search history.

(56) References Cited

U.S. PATENT DOCUMENTS

| | | | |
|---|---|---|---|
| 2011/0193086 A1* | 8/2011 | Lee et al. | 257/48 |
| 2013/0082399 A1* | 4/2013 | Kim et al. | 257/774 |
| 2013/0249085 A1* | 9/2013 | Ide | 257/737 |
| 2014/0287541 A1* | 9/2014 | Yasumura et al. | 438/15 |

FOREIGN PATENT DOCUMENTS

| | | |
|---|---|---|
| JP | 2001-217387 A | 8/2001 |
| JP | 2011-187574 A | 9/2011 |

\* cited by examiner

*Primary Examiner* — William Coleman
(74) *Attorney, Agent, or Firm* — Miles Stockbridge P.C.

(57) ABSTRACT

Provided is a semiconductor device with improved reliability. A logic chip (first semiconductor chip) and a laminated body (second semiconductor chip) are stacked in that order over a wiring substrate. An alignment mark formed over the wiring substrate is aligned with an alignment mark formed on a front surface of the logic chip, whereby the logic chip is mounted over the wiring substrate. An alignment mark formed on a back surface of the logic chip is aligned with an alignment mark formed on a front surface of the laminated body, whereby the laminated body is mounted over the back surface of the logic chip LG.

20 Claims, 45 Drawing Sheets

METHOD OF MANUFACTURING SEMICONDUCTOR DEVICE, AND SEMICONDUCTOR DEVICE

CROSS-REFERENCE TO RELATED APPLICATIONS

The disclosure of Japanese Patent Application No. 2013-061087 filed on Mar. 22, 2013 including the specification, drawings and abstract is incorporated herein by reference in its entirety.

BACKGROUND

The present invention relates to manufacturing techniques of semiconductor devices, and more specifically, to a technique effectively applied to a semiconductor device with a semiconductor chip mounted over another semiconductor chip.

Japanese Unexamined Patent Publication No. 2001-217387 (Patent Document 1) discloses a method for stacking semiconductor chips which involves respectively forming alignment marks on the surface of a parent chip (fixed device) and on the surface of a child chip (semiconductor chip), and stacking the child chip over the parent chip based on the result of detection of the alignment marks such that the respective alignment marks on both chips face each other.

Japanese Unexamined Patent Publication No. 2011-187574 (Patent Document 2) discloses a semiconductor device including a semiconductor chip with a penetrating electrode between a wiring substrate and a laminated body of a plurality of memory chips.

RELATED ART DOCUMENTS

[Patent Document 1]
Japanese Unexamined Patent Publication No. 2001-217387
[Patent Document 2]
Japanese Unexamined Patent Publication No. 2011-187574

SUMMARY

The inventors of the present application have studied about techniques for improving the performance of a semiconductor device including a laminated body of semiconductor chips stacked over a wiring substrate. As one of the techniques, the so-called system in package (SiP) semiconductor device has been studied, which forms a system only by one semiconductor device having a plurality of semiconductor chips (for example, a memory chip and a control chip for controlling the memory chip) mounted therein.

Methods for stacking semiconductor chips includes a method which involves arranging and stacking an electrode of one (upper) semiconductor chip to face the other (lower) semiconductor chip, and electrically connecting the respective electrodes via a conductive member, such as solder material. This method connects the stacked semiconductor chips together without wirings, and thus can decrease a transmission distance between the semiconductor chips.

In order to electrically connect the electrodes from the viewpoint of improving the reliability of the semiconductor device, it is necessary to improve the alignment accuracy of the upper semiconductor chip with respect to the lower semiconductor chip.

Other problems and new features of the present invention will be better understood after a reading of the following detailed description in connection with the accompanying drawings.

A method for manufacturing a semiconductor device according to one embodiment of the invention includes the step of (a) mounting a first semiconductor chip over a wiring substrate such that a first main surface of the first semiconductor chip faces the wiring substrate. The manufacturing method also includes the step of (b) mounting a second semiconductor chip over a wiring substrate such that a second main surface of the second semiconductor chip faces a first back surface of the first semiconductor chip. In the above step (a), after detection and alignment of a first alignment mark formed on the wiring substrate and a second alignment mark formed on the first main surface side of the first semiconductor chip, the first semiconductor chip is mounted. In the above (b) step, after detection and alignment of a third alignment mark formed on the first back surface side of the first semiconductor chip and a fourth alignment mark formed at the second main surface side of the second semiconductor chip, the second semiconductor chip is mounted. A plurality of first back surface side pads are formed on the first back surface, and a plurality of second main surface side pads are formed on the second main surface. In the above step (b), the first back surface side pads are electrically connected with the second main surface, side pads via external terminals respectively formed on the second main surface side pads.

According to the one embodiment of the present invention, the reliability of the semiconductor device can be improved.

Figure 1:
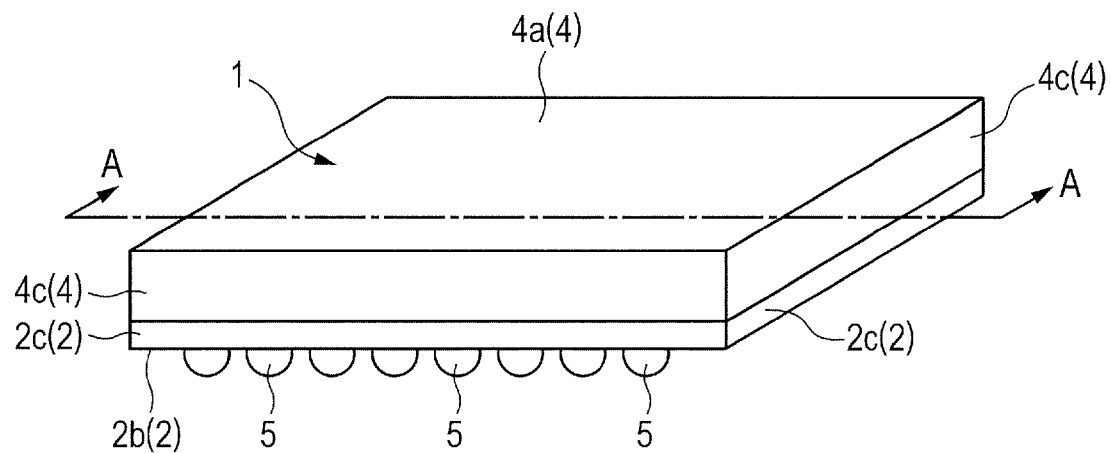
FIG. 1 is a perspective view of a semiconductor device according to one embodiment of the invention.

DETAILED DESCRIPTION (Explanation of Description Format and Basic Terms and Usage in Present Application)

In the present application, the following preferred embodiments may be described below by being divided into a plurality of sections or the like for convenience, if necessary, which are not independent from each other unless otherwise specified. Regardless of the order of the description of these sections, the sections indicate respective parts in a single example. Alternatively, one of the sections may be the details of a part of the other, or a modified example of a part or all of the other. In principle, parts having the same function will not be described repeatedly. Respective components of the preferred embodiments are not essential unless otherwise specified, except when limiting the number of the components in theory, and except when considered not to be definitely so from the context thereof.

Similarly, in the description of the embodiments, the term "X formed of A" or the like as to material, composition, and the like does not exclude elements other than the element "A", unless otherwise specified and except when considered not to be definitely so from the context. For example, as to the component, the above term means "X containing A as a principal component". For example, the term "silicon member" is not limited to pure silicon, and may obviously include a SiGe (silicon-germanium) alloy, or a multi-component alloy containing silicon as a principal component, and another additive. The term "gold plating", "Cu layer", or "nickel plating" is not limited to pure one, but include a member containing gold, Cu, or nickel as a principal component unless otherwise specified.

Even when referring to a specific numeral value or amount, the number of elements or the like may be greater than, or less than the specific numeral number, unless otherwise specified, except when limited to the specific number in theory, and except when considered not to be definitely so from the context.

In each drawing of the embodiments, the same or like parts are indicated by the same or similar reference character or number, and its description will not be repeated in principle.

In the accompanying drawings, even a cross-sectional view may omit hatching in some cases if the hatching possibly makes the sectional view complicated, or when a cavity or hole is easy to discriminate. In this context, the outline of a hole closed in a planar manner to and from the background may be omitted when clearly seen from the description or the like. Further, in order to represent a part which is not a cavity or hole, or in order to clearly represent a boundary between regions, a hatching or dot pattern is sometimes given even when the figure is not a cross-sectional view.

The following embodiments will describe as one example of a SiP semiconductor device, a semiconductor package in which a semiconductor chip (memory chip) with a memory circuit and another semiconductor chip (control chip) with a control circuit for controlling the operation of the memory circuit are mounted.

Embodiments

Figure 2:
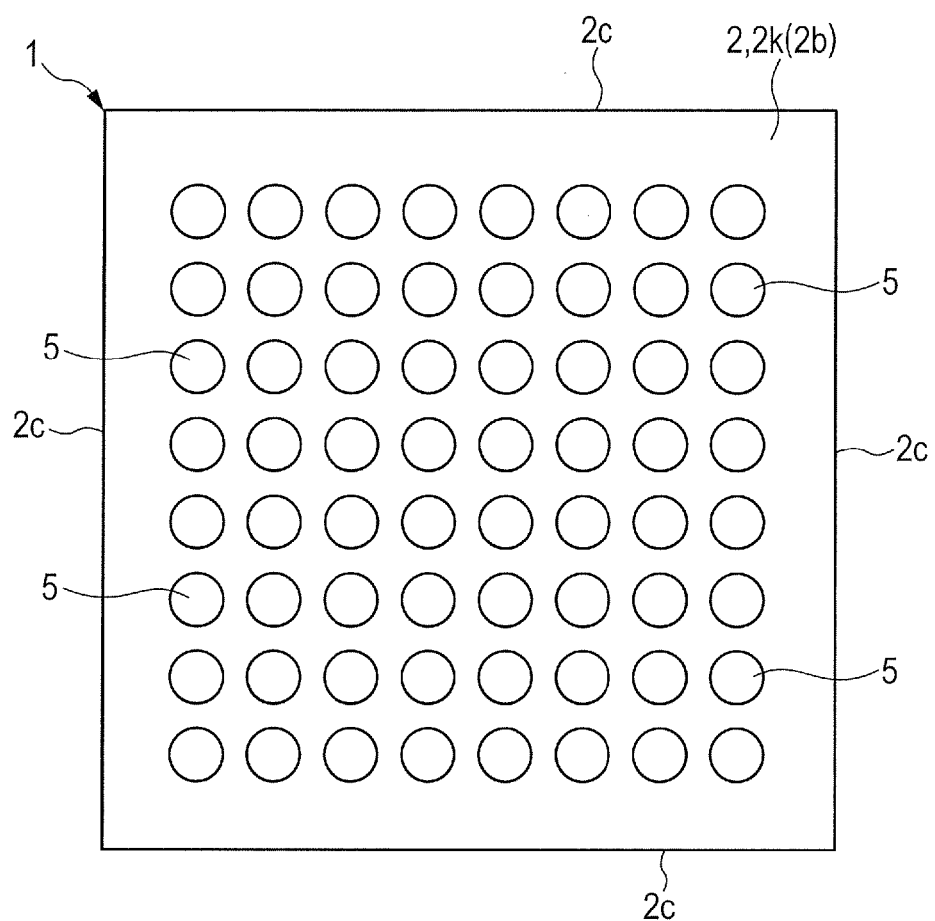
FIG. 2 is a bottom view of the semiconductor device shown in FIG. 1.
Figure 3:
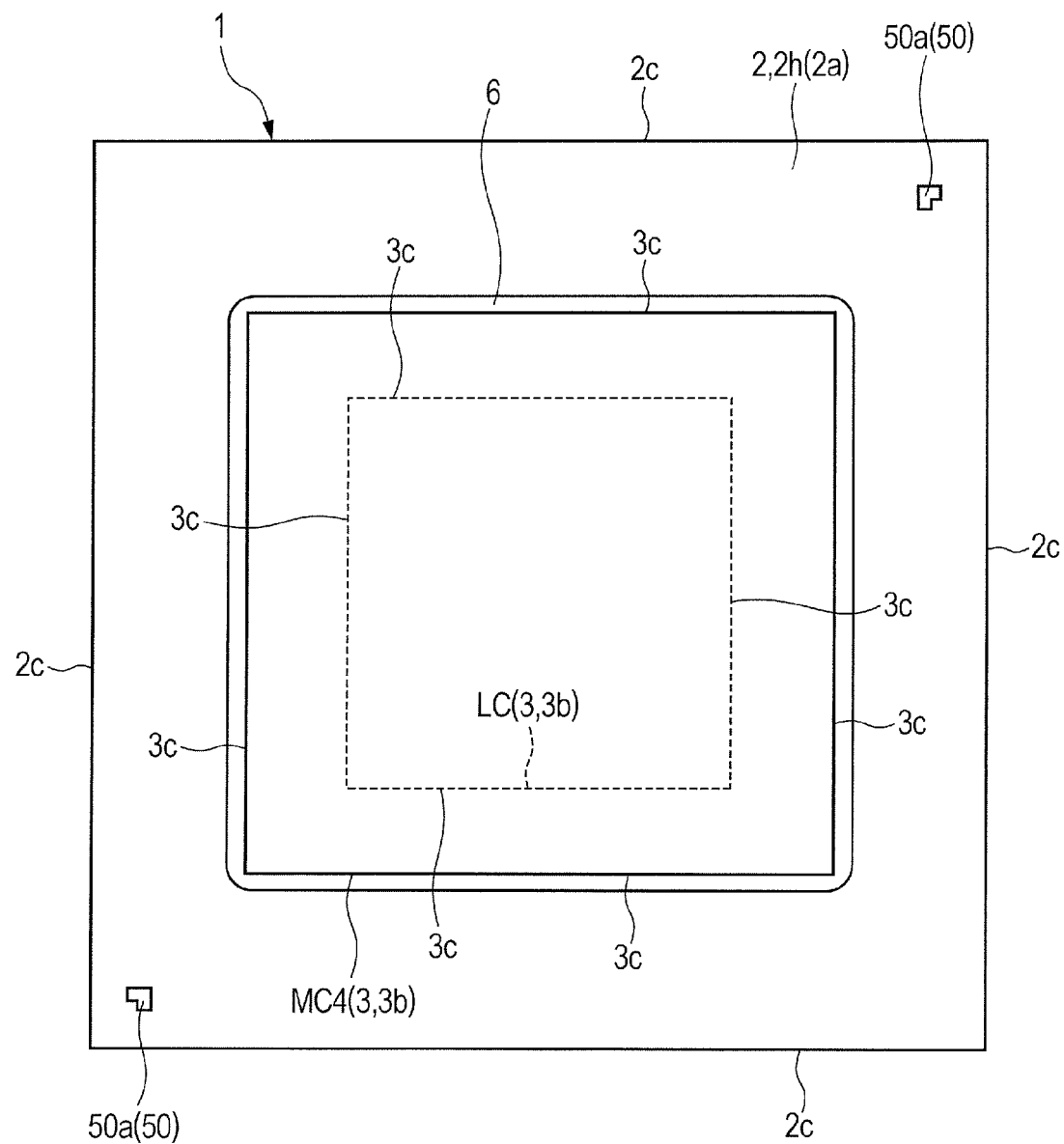
FIG. 3 is a perspective plan view showing an internal structure of the semiconductor device over a wiring substrate with a seal member shown in FIG. 1 removed therefrom.
Figure 4:
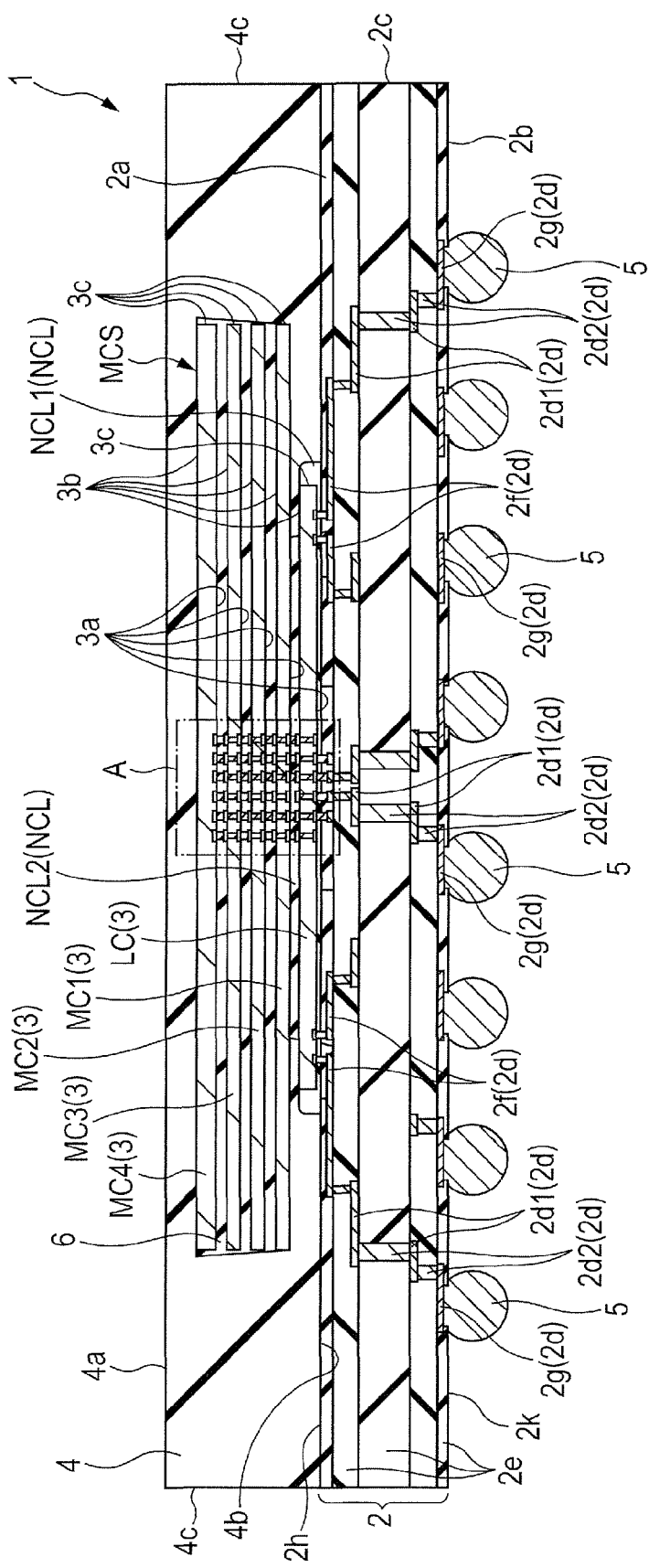
FIG. 4 is a cross-sectional view taken along the line A-A of FIG. 1.

As an example of the semiconductor device with a laminated body of a plurality of semiconductor chips, this embodiment is directed to a semiconductor device in which semiconductor chips having memory circuits formed therein are stacked over another semiconductor chip with an arithmetic processing circuit formed therein. FIG. 1 shows a perspective view of a semiconductor device of this embodiment. FIG. 2 is a bottom view of the semiconductor device shown in FIG. 1. FIG. 3 shows a perspective plan view of an internal structure of the semiconductor device over a wiring substrate with a seal member shown in FIG. 1 removed therefrom. FIG. 4 is a cross-sectional view taken along the line A-A of FIG. 1. For easy understanding, although the number of terminals is shown to be small in FIGS. 1 to 4, the number of terminals (bonding leads 2f, lands 2g, and solder balls 5) are not limited to those shown in FIGS. 1 to 4. FIG. 3 shows the contour of the logic chip LC by a dotted line for easy understanding of the positional relationship and a difference in planar size between the logic chip LC and the memory chip MC4 in plan view.

<Semiconductor Device>

As shown in FIG. 4, the wiring substrate 2 has an upper surface (surface, chip mounting surface) 2a over which semiconductor chips 3 are mounted, a lower surface (surface, mounting surface) 2b opposite to the upper surface 2a, and side surfaces 2c positioned between the upper surface 2a and the lower surface 2b. The wiring substrate 2 has a quadrilateral contour in the plan view shown in FIGS. 2 and 3. In the example shown in FIGS. 2 and 3, the wiring substrate 2 is formed in a square shape having a planar size (size in plan view, sizes of the upper surface 2a and the lower surface 2b, contour size) of about 14 mm on a side. The wiring substrate 2 has a thickness (height), that is, a distance from the upper surface 2a to the lower surface 2b shown in FIG. 4, for example, of about 0.3 to 0.5 mm.

The wiring substrate 2 serves as an interposer for electrically connecting the semiconductor chips 3 mounted over the upper surface 2a side with a mounting substrate (not shown), and has a plurality of wiring layers (four layers in an example shown in FIG. 4) electrically connecting the upper surface 2a side with the lower surface 2b side. The respective wiring layers have insulating layers 2e for insulating the adjacent wirings 2d as well as the adjacent wiring layers from each other. The wiring substrate 2 of this embodiment includes three insulating layers 2e with the center insulating layer 2e made of a core layer (core material). Alternatively, the wiring substrate 2 may be the so-called coreless substrate which does not have the core insulating layer 2e. The wirings 2d include wirings 2d1 formed on the upper or lower surface of the insulating layer 2e, and via wirings 2d2 serving as an interlayer conductive path penetrating the insulating layer 2e in the thickness direction.

The upper surface 2a of the wiring substrate 2 is provided with a plurality of bonding leads (terminals, chip mounting surface side terminals, electrodes) 2f, which are terminals electrically connected with the semiconductor chips 3. On the other hand, the lower surface 2b of the wiring substrate 2 is provided with lands 2g bonded to the solder balls 5 serving as a terminal for electrical connection to the mounting substrate (not shown), that is, as a terminal for external connection of the semiconductor device 1. The bonding leads 2f are electrically connected with the lands 2g via the wirings 2d. The wiring 2d connected with the bonding lead 2f or land 2g is integrally formed with the bonding lead 2f or land 2g, whereby the bonding lead 2f and land 2g shown in FIG. 4 serve as a part of the wiring 2d.

The upper surface 2a and lower surface 2b of the wiring substrate 2 are covered with insulating films (solder resist films) 2h and 2k. The wiring 2d formed on the upper surface 2a of the wiring substrate 2 is covered with the insulating film 2h. The insulating film 2h is provided with openings, and at the openings, at least parts (bonding portions or bonding regions with the semiconductor chip 3) of the bonding leads 2f are exposed from the insulating film 2h. The wiring 2d formed on the lower surface 2b of the wiring substrate 2 is covered with the insulating film 2k. The insulating film 2k is provided with openings, and at the openings, at least parts (bonding portions with the solder balls 5) of the lands 2g are exposed from the insulating film 2k.

As shown in FIG. 4, the solder balls (external terminals, electrodes, external electrodes) 5 bonded to the lands 2g at the lower surface 2b of the wiring substrate 2 are arranged in columns and rows (array or matrix) as shown in FIG. 2. Although not shown in FIG. 2, the lands 2g bonded to the solder balls 5 (see FIG. 4) are also arranged in columns and rows (matrix). The semiconductor device including the external terminals (solder balls 5, lands 2g) arranged on the mounting surface side of the wiring substrate 2 in the columns and rows are called an area array type semiconductor device. The area array type semiconductor device can effectively use the mounting surface (lower surface 2b) side of the wiring substrate 2 as an arrangement space for the external terminals. Thus, the area array type semiconductor device is preferable in that an increase in mounting area of the semiconductor device can be suppressed even when the number of external terminals is increased. That is, together with higher functionality and higher integration, the semiconductor device whose number of external terminals is increased can be mounted while saving space.

The semiconductor device 1 includes the semiconductor chips 3 mounted over the wiring substrate 2. The semiconductor chips 3 are stacked over the upper surface 2a of the wiring substrate 2. Each of the semiconductor chips 3 has a quadrilateral contour in plan view of FIG. 3 having a front surface (main surface, upper surface) 3a, a back surface (main surface, lower surface) 3b opposite to the front surface 3a, and side surfaces 3c positioned between the front surface 3a and the back surface 3b. The semiconductor chips are stacked, which can reduce a mounting area of the semiconductor device 1 even when the semiconductor device 1 has higher functionality.

In the example shown in FIGS. 3 and 4, the semiconductor chip 3 mounted as the lowermost level (in a position closest to the wiring substrate 2) is a logic chip (semiconductor chip) LC in which the arithmetic processing circuit PU (see FIG. 5) is formed. The semiconductor chips 3 mounted at the upper level of the logic chip LC include memory chips (semiconductor chips) MC1, MC2, MC3, and MC4 provided with main storage circuits (storage circuits) MM (see FIG. 5) for storing therein data for communicating with the logic chip LC. The logic chip LC is provided with a control circuit for controlling the operation of the main storage circuit of each of the memory chips MC1, MC2, MC3, and MC4, in addition to the above arithmetic processing circuit. The example of the circuit structure of the semiconductor device 1 will be described below.

As shown in FIG. 4, an adhesive material NCL (insulating adhesive material) is arranged between the adjacent semiconductor chips 3. The adhesive material NCL is disposed to fill in a space between a front surface 3a of the upper semiconductor chip 3 and a back surface 3b of the lower semiconductor chip 3 (or, upper surface 2a of the wiring substrate 2). Specifically, the adhesive material NCL includes an adhesive material (insulating adhesive material) NCL1 bonding and fixing the logic chip LC to the wiring substrate 2, and an adhesive material (insulating adhesive material) NCL2 bonding and fixing a laminated body MCS with the memory chips MC1, MC2, MC3, and MC4 to over the logic chip. The adhesive materials NCL1 and NCL2 are made of insulating (non-conductive) material (for example, resin). The adhesive material NCL is disposed at a bonding portion between the logic chip LC and the wiring substrate 2, and another bonding portion between the laminated body MCS and the logic chip LC, which can electrically insulate the electrodes provided in the respective bonding portions from each other.

In the example shown in FIG. 4, a seal member (seal member for the chip laminated body, resin for the chip laminated body) 6 other than the seal member 4 is arranged between the memory chips MC1, MC2, MC3, and MC4, so that the laminated body MCS of the memory chips MC1, MC2, MC3, and MC4 are sealed with the seal member 6. The seal member 6 is embedded in intimate contact with the front surface 3a and the back surface 3b of each of the memory chips MC1, MC2, MC3, and MC4. The laminated body MCS of the memory chips MC1, MC2, MC3, and MC4 is integral with each other by the bonding portion and the seal member 6 between the respective semiconductor chips 3. The seal member 6 is made of insulating (non-conductive) material (for example, resin). The seal member 6 is arranged in the respective bonding portions between the memory chips MC1, MC2, MC3, and MC4, so that the electrodes provided in the bonding portions can be electrically insulated from each other. As shown in FIG. 4, the surface 3a of the memory chip MC1 mounted at the lowermost level (in the position closest to the logic chip LC) in the laminated body MCS of the memory chips MC1, MC2, MC3, and MC4 is exposed from the seal member 6. As shown in FIGS. 3 and 4, the back surface 3b of the memory chip MC4 mounted at the uppermost level in the laminated body MCS of the memory chips MC1, MC2, MC3, and MC4 is exposed from the seal member 6.

The semiconductor device 1 includes the seal member 4 for sealing the semiconductor chips 3. The seal member 4 has a quadrilateral contour in plan view having an upper surface (surface, front surface) 4a, a lower surface (surface, back surface, mounting surface) 4b opposite to the upper surface 4a (see FIG. 4), and side surfaces 4c positioned between the upper surface 4a and the lower surface 4b. In the example shown in FIG. 1, the planar size of the seal member 4 (size in plan view from the upper surface 4a side, contour size of the upper surface 4a) is the same as that of the wiring substrate 2. The side surface 4c of the seal member 4 continues into the side surface 2c of the wiring substrate 2. In the example shown in FIG. 1, the seal member 4 has a square shape having a planar size (size in plan view) of, for example, about 14 mm on a side.

The seal member 4 is a resin member for protecting the semiconductor chips 3. The seal member 4 is formed between the semiconductor chips 3 and in intimate contact with the semiconductor chip 3 and the wiring substrate 2, which can suppress the damage on the thin semiconductor chips 3. The seal member 4 is preferably formed, for example, of the following material from the viewpoint of improving the function as the protective member. The seal member 4 is required to be easily brought into intimate contact with the semiconductor chip 3, the wiring substrate 2, and the space between the semiconductor chips 3, and to have some hardness after sealing. For this reason, the seal member 4 preferably contains thermosetting resin, such as epoxy resin. In order to improve the function of the seal member 4 after being cured, for example, filler particles, such as silica (silicon dioxide: $SiO_2$) particles, are preferably mixed in the resin material. For example, the ratio of addition of the filler particles to the mixture is preferably adjusted to make a linear expansion coefficient of the semiconductor chip 3 equal to that of the seal member 4 for the purpose of suppressing the damage on the semiconductor chip 3 due to thermal deformation of the seal member 4 and chip 3 after formation of the seal member 4.

<Circuit Structure of Semiconductor Device>

Figure 5:
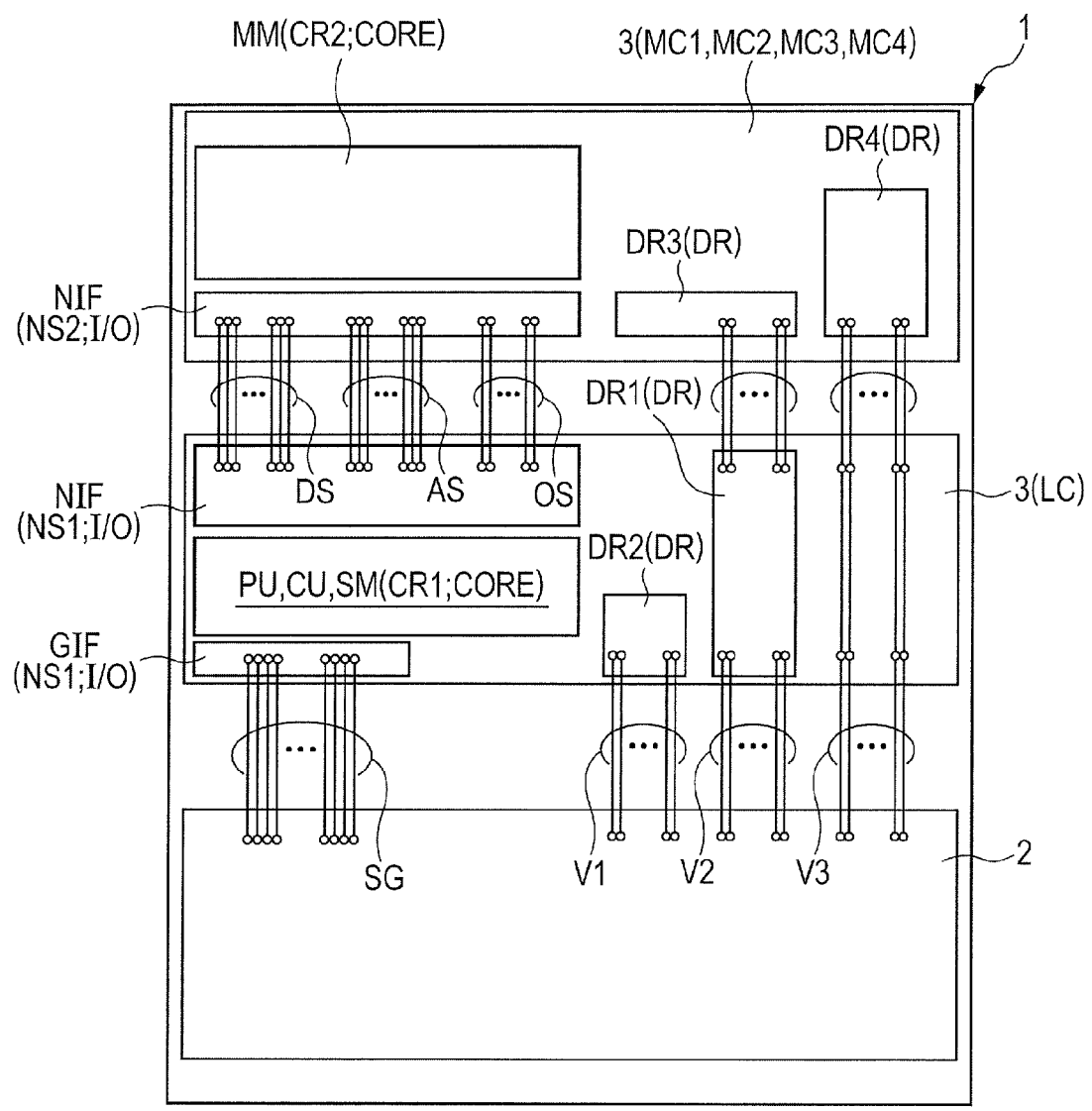
FIG. 5 is an exemplary explanatory diagram showing an example of a circuit structure of the semiconductor device shown in FIGS. 1 to 4.

Next, an example of the circuit structure of the semiconductor device 1 will be described. As shown in FIG. 5, the logic chip LC is provided with the control circuit CU for controlling the operation of the main storage circuit MM of each of the memory chips MC1, MC2, MC3, and MC4, in addition to the above arithmetic processing circuit PU. The logic chip LC is provided with an auxiliary storage circuit (storage circuit) SM having a smaller storage capacity than that of the main storage circuit MM, such as a cash memory for preliminary storing data. Referring to FIG. 5, the arithmetic processing circuit PU, the control circuit CU, and the auxiliary storage circuit SM are collectively called a core circuit (main circuit) CR1 by way of example. The circuits included in the core circuit CR1 may include circuits other than the circuit described above.

The logic chip LC is provided with an external interface circuit (external input/output circuit) GIF for inputting and outputting a signal to and from an external device (not shown). The external interface circuit GIF is connected with a signal line SG for transmitting a signal between the logic chip LC and the external device (not shown). The external interface circuit GIF is electrically connected with a core circuit CR1, and the core circuit CR1 can transfer a signal to the external device via the external interface circuit GIF.

The logic chip LC is provided with an internal interface circuit (internal input/output circuit) NIF for inputting and outputting a signal to and from internal devices (for example, memory chips MC1, MC2, MC3, and MC4). The internal interface circuit NIF is connected with a data line (signal line) DS for transmitting a data signal, an address line (signal line) AS for transmitting an address signal, and a signal line OS for transmitting other signals. The date line DS, the address line AS, and the signal line OS are respectively connected with the internal interface circuit NIF of each of the memory chips MC1, MC2, MC3, and MC4. Referring to FIG. 5, circuits for inputting/outputting a signal to and from electronic parts other than the logic chip LC, such as an external interface circuit GIF or an internal interface circuit NIF, are designated by an input/output circuit NS1.

The logic chip LC includes a power supply circuit DR for supplying a potential for driving a core circuit CR1 and the input/output circuit NS1. The power supply circuit DR includes a power supply circuit (power supply circuit for input/output) DR1 for supplying a voltage for driving the input/output circuit NS1 of the logic chip LC, and a power supply circuit (power supply circuit for a core) DR2 for supplying a voltage for driving the core circuit CR1 of the logic chip LC. For example, a plurality of different potentials (first power supply potential and second power supply potential) are supplied to the power supply circuit DR, and a difference in potential defines each of voltages to be applied to the core circuit CR1 and the input/output circuit NS1.

One semiconductor chip 3 into which circuits required for the operation of a device or system are integrated, such as a logic chip LC, is called a SoC (system on a chip). The formation of the main storage circuit MM shown in FIG. 5 in the logic chip LC can form the system using only one logic chip LC. However, a necessary capacity of the main storage circuit MM (see FIG. 5) varies depending on the device or system to be operated. For this reason, the formation of the main storage circuit MM in the semiconductor chip 3 other than the logic chip LC can improve the general versatility of the logic chip LC.

The memory chips MC1, MC2, MC3, and MC4 are connected according to a storage capacity required for the main storage circuit MM, which improves the flexibility in designing the capacity of the storage circuit included in the system. In the example shown in FIG. 5, each of memory chips MC1, MC2 MC3, and MC4 is provided with the corresponding main storage circuit MM. Referring to FIG. 5, the main storage circuit MM is designated as a core circuit (main circuit) CR2 of the memory chips MC1, MC2, MC3, and MC4. The circuits included in the core circuit CR2 may include circuits other than the main storage circuit MM.

Each of the memory chips MC1, MC2, MC3, and MC4 is provided with an internal interface circuit (internal input/output circuit) NIF for inputting and outputting a signal to and from internal devices (for example, logic chip LC). Referring to FIG. 5, the internal interface circuit NIF for inputting and outputting the signal to and from electronic devices other than the memory chips MC1, MC2, MC3, and MC4 is designated as the input/output circuit NS2.

Each of the memory chips MC1, MC2, MC3, and MC4 includes a power supply circuit (drive circuit) DR for supplying a potential for driving the core circuit CR2 and the input/output circuit NS2. The power supply circuit DR includes a power supply circuit (power supply circuit for input/output) DR3 for supplying a voltage for driving the input/output circuit NS2 of each of the memory chips MC1, MC2, MC3, and MC4, and a power supply circuit (power supply circuit for a core) DR4 for supplying a voltage for driving the core circuit CR2 of each of the memory chips MC1, MC2, MC3, and MC4. For example, a plurality of different potentials (first power supply potential and second power supply potential) are supplied to the power supply circuit DR, and a difference in potential defines each of voltages to be applied to the core circuit CR2 and the input/output circuit NS2.

In the example shown in FIG. 5, the power circuit DR1 of the logic chip LC and the power circuit DR3 of the memory chips MC1, MC2, MC3, and MC4 are shared. In other words, the same voltage supplied from the power wire V2 is applied to the input/output circuit NS1 of the logic chip LC and the input/output circuit NS2 of each of the memory chips MC1, MC2, MC3, and MC4 to drive the input/output circuits. In this way, a part or all of the power supply circuits DR can be shared to thereby decrease the number of power wires V1, V2, and V3 for supplying a potential (driving voltage) to the power supply circuit. The decrease in number of the power wires V1, V2, and V3 can decrease the number of electrodes formed in the logic chip LC.

One semiconductor device 1 into which circuits required for the operation of a device or system are integrated, such as the semiconductor device 1, is called a SiP (system in Package). Although four memory chips MC1, MC2, MC3, and MC4 are stacked over one logic chip LC in the example shown in FIG. 4, in various modified examples, the number of stacked semiconductor chips 3 can be modified as mentioned above. Although not shown in the figure, for example, the invention can be applied to a modified example as the minimum structure in which one memory chip MC1 is mounted over one logic chip LC.

From the viewpoint of improving the general versatility of the logic chip LC and the memory chips MC1, MC2, MC3, and MC4, the planar size (size in plan view, size of the front surface 3a and back surface 3b, or contour size) of each of the logic chip LC and the memory chips MC1, MC2, MC3, and MC4 is preferably minimized as long as the function of each semiconductor chip 3 can be achieved. The logic chip LC can have its planar size reduced by improving the integration degree of the circuit elements. Each of the memory chips MC1, MC2, MC3, and MC4 changes the capacity and transmission rate (for example, the amount of data transmitted depending on the width of a data bus) of the main storage circuit MM according to the planar size of the chip, and thus is limited in reduction of the planar size.

In the example shown in FIG. 4, the planar size of the memory chip MC4 is larger than that of the logic chip LC. For example, the memory chip MC 4 has a quadrilateral planar shape having a size of about 8 to 10 mm on a side, while the logic chip LC has a quadrilateral planar shape having a size of about 5 to 6 mm on a side. Although not shown, the planar size of each of the memory chips MC1, MC2, and MC3 shown in FIG. 4 is the same as that of the memory chip MC4.

As mentioned above, the logic chip LC is provided with an external interface circuit GIF for inputting and outputting a signal to and from an external device (not shown). From the viewpoint of reducing a transmission distance to the external device, the order of stacking the semiconductor chips 3 is preferably set such that the logic chip LC is positioned at the lowermost level, or closest to the wiring substrate 2. That is, the semiconductor chips 3 (memory chips MC1, MC2, MC3, MC4) having a larger planar size are preferably stacked over the semiconductor chip 3 (logic chip LC) having a smaller planar size, like the semiconductor device 1.

<Example of Structure of Semiconductor Chips>

Figure 6:
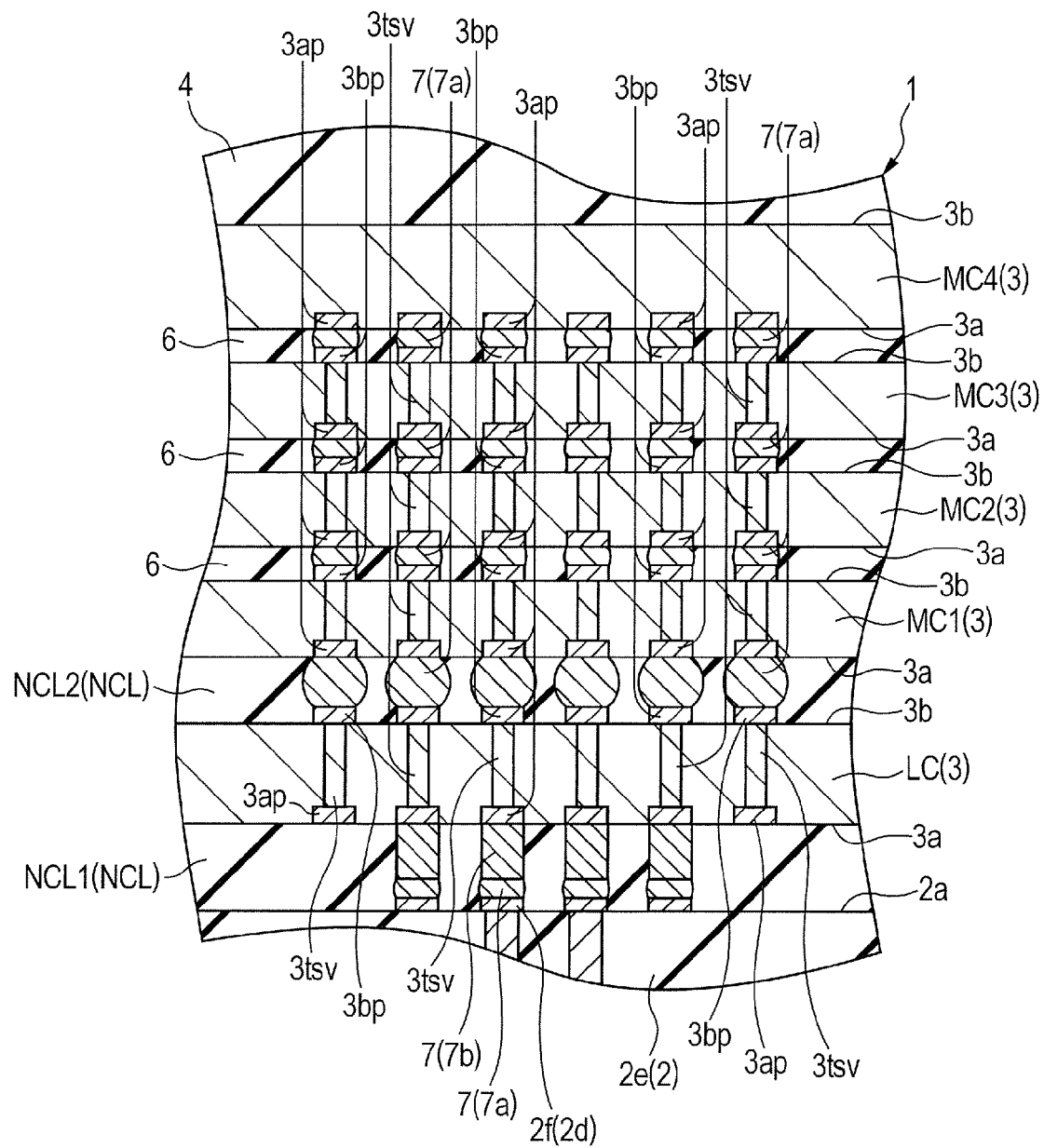
FIG. 6 is an enlarged cross-sectional view of a portion "A" shown in FIG. 4.
Figure 7:
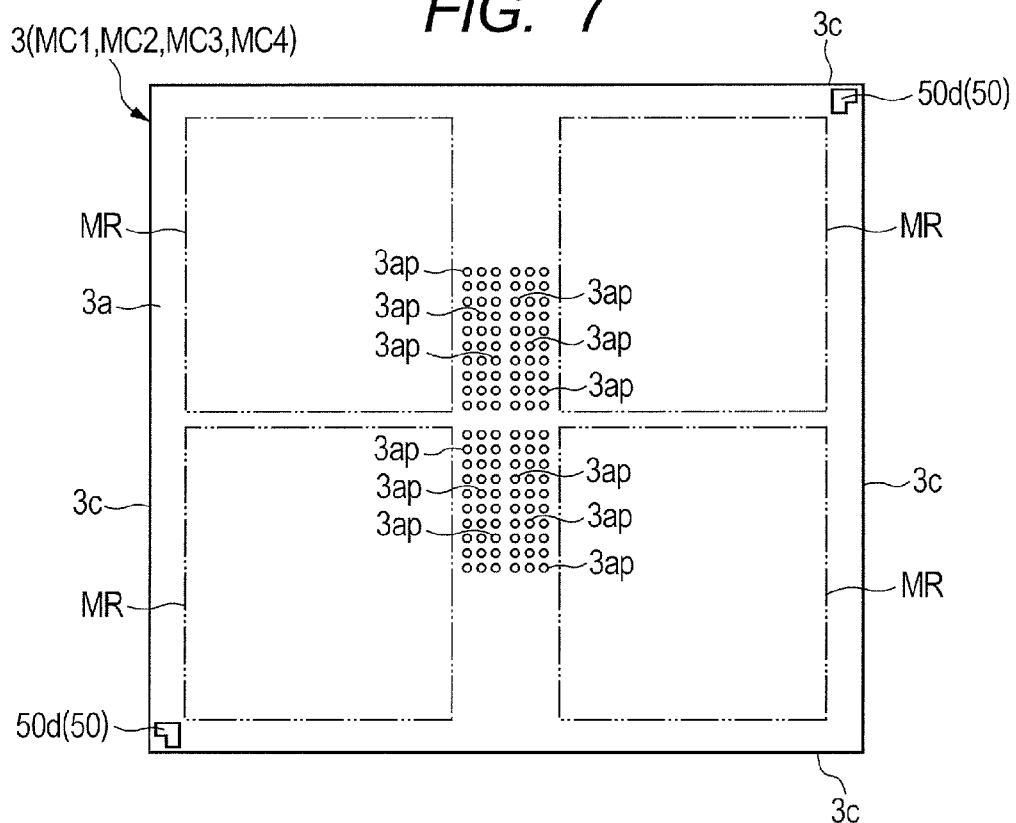
FIG. 7 is a plan view showing a front surface side of a memory chip shown in FIG. 4.
Figure 8:
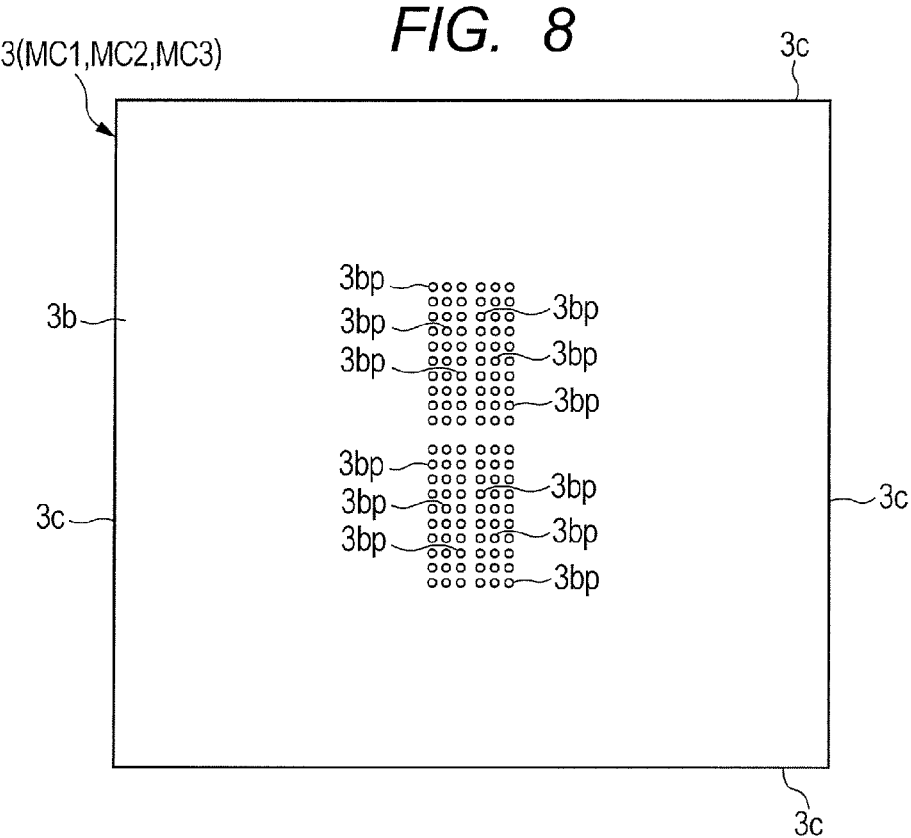
FIG. 8 is a plan view showing an example of a back surface side of a memory chip shown in FIG. 7.
Figure 9:
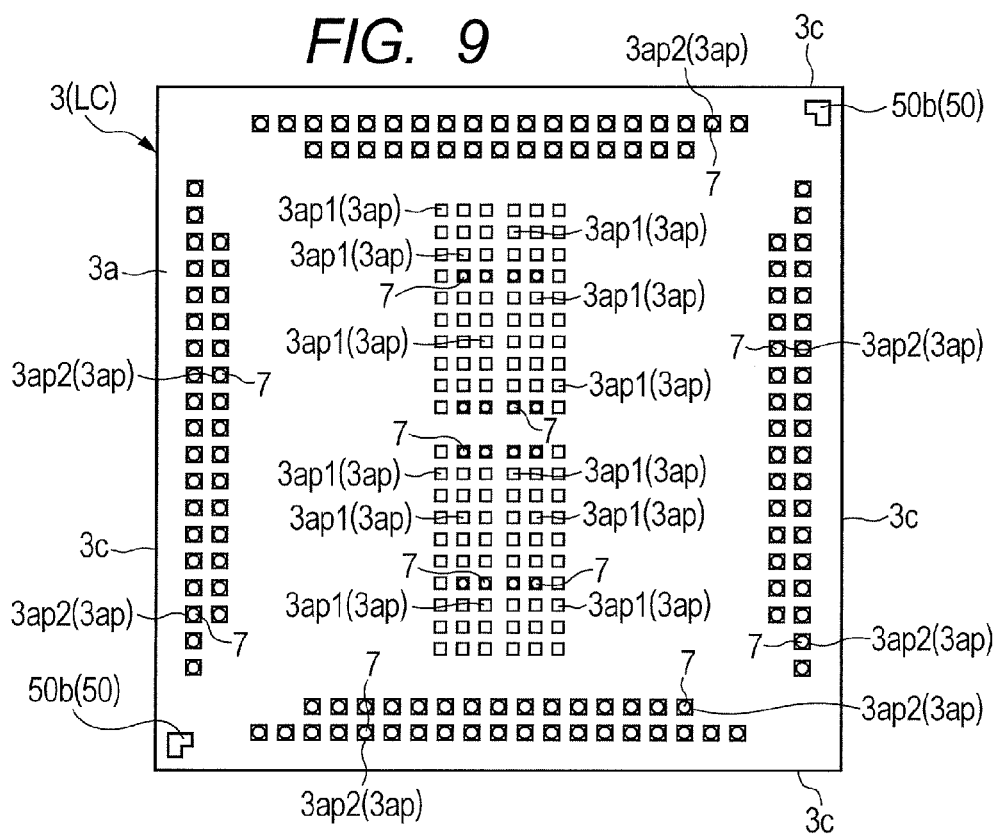
FIG. 9 is a plan view showing a front surface side of a logic chip shown in FIG. 4.
Figure 10:
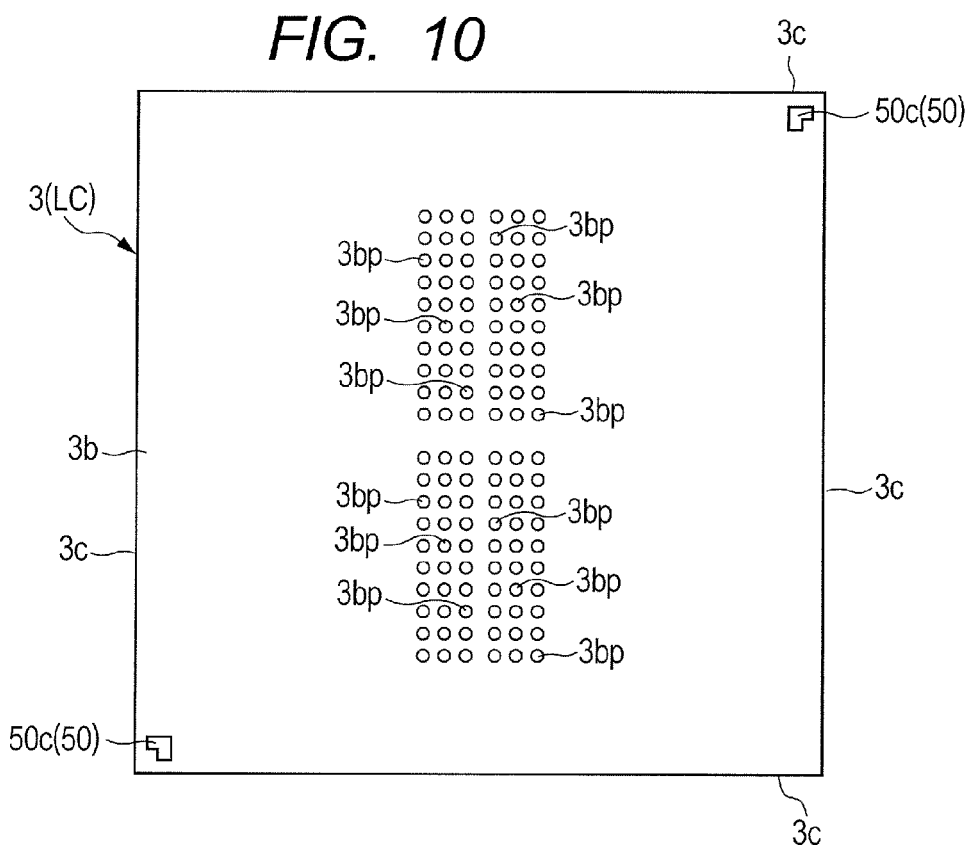
FIG. 10 is a plan view showing an example of a back surface side of a logic chip shown in FIG. 9.

The following will refer to the details of the logic chip LC and the memory chips MC1, MC2, MC3, and MC4 shown in FIG. 4, and the electric connection of the semiconductor chips 3. FIG. 6 shows an enlarged cross-sectional view of a portion "A" shown in FIG. 4. FIG. 7 shows a plan view of the front surface side of the memory chip shown in FIG. 4. FIG. 8 shows a plan view of one example of the back surface side of the memory chip shown in FIG. 7. FIG. 9 shows a plan view of the front surface side of the logic chip shown in FIG. 4. FIG. 10 shows a plan view of one example of the back surface side of the logic chip shown in FIG. 9. For easy understanding, although the number of electrodes is shown to be small in FIGS. 6 to 10, the number of electrodes (front surface electrodes 3ap, back surface electrodes 3bp, penetrating electrodes 3tsv) are not limited to those shown in FIGS. 6 to 10. FIG. 8 shows the back surface diagram of the memory chips MC1, MC2, and MC3. The structure of the back surface of the memory chip MC4 (see FIG. 4) without the back surface electrode 3bp is shown in FIG. 3, and thus its illustration will be omitted in the figure.

The inventors of the present application have studied about techniques for improving the performance of the SiP semiconductor device. One of the techniques is being studied to increase a signal transmission rate between the semiconductor chips mounted on SiP up to, for example, 12 Gbps (12 gigabit) or more. Methods for increasing a transmission rate between semiconductor chips mounted on the SiP includes a method which involves increasing the amount of data transmitted at one time by increasing the width of the data bus at the internal interface (hereinafter referred to as a "bus width increase"). Another method involves increasing the number of transmission per unit time (herein referred to as a "clock frequency increase"). Alternatively, a combination of the above bus width increase and the clock frequency increase can be applied. The semiconductor device 1 described with reference to FIGS. 1 to 5 uses the combination of the bus width increase and the clock frequency increase to thereby increase the transmission rate up to 12 Gbps or more at the internal interface.

For example, each of the memory chips MC1, MC2, MC3, and MC4 shown in FIG. 4 is the so-called wide I/O memory having a width of a data bus of 512 bit. Specifically, each of the memory chips MC1, MC2, MC3, and MC4 has a width of the date bus of 128 bit, so that the total bus width of the four channels is 512 bit. The number of transmission per unit time of each channel is increased to be, for example, 3 Gbps or more.

In using the combination of the clock frequency increase and the bus width increase, it is necessary to operate a number of data lines at high speeds. In order to reduce the influence of noise, the transmission distance for data needs to be shortened. As shown in FIG. 4, the logic chip LC is electrically connected with the memory chip MC1 via a conductive member arranged between the logic chip LC and the memory chip MC1. The memory chips MC1, MC2, MC3, and MC4 are electrically connected together via the conductive members arranged between the adjacent memory chips MC1, MC2, MC3, and MC4. In other words, the semiconductor device 1 does not include the wiring substrate 2 and a wire (not shown) (bonding wire) in a transmission path between the logic chip LC and the memory chip MC1. The semiconductor device 1 does not include the wiring substrate 2 and a wire (not shown) (bonding wire) in transmission paths among the memory chips MC1, MC2, MC3, and MC4.

In this embodiment, the direct connection between the semiconductor chips 3 employs the technique which involves forming penetrating electrodes penetrating the semiconductor chip 3 in the thickness direction, and connecting the semiconductor chips 3 together stacked via the penetrating electrodes. Specifically, as shown in FIG. 6, the logic chip LC includes front surface electrodes (electrodes, pads, front surface side pads) 3$ap$ formed on its front surface 3$a$, and back surface electrodes (electrodes, pads, back surface side pads) 3$bp$ formed on its back surface 3$b$. The logic chip LC further includes penetrating electrodes 3$tsv$ penetrating from one of the front surface 3$a$ and the back surface 3$b$ to the other and electrically connecting the front surface electrodes 3$ap$ with the back surface electrodes 3$bp$.

Various circuits (semiconductor element and wiring connected therewith) included in the semiconductor chip 3 are formed on the front surface side 3$a$ of the semiconductor chip 3. Specifically, the semiconductor chip 3 includes a semiconductor substrate (not shown) made of, for example, silicon (Si), and has a plurality of semiconductor elements (not shown), such as a transistor, formed on its main surface (element formation surface) of the semiconductor substrate. A wiring layer (not shown) including an insulating film for insulating the wirings from each other is stacked over the main surface of the semiconductor substrate (front surface 3$a$ side). A plurality of wirings of the wiring layers are respectively electrically connected with the semiconductor elements to form circuits. The front surface electrodes 3$ap$ formed on the front surfaces 3$a$ (see FIG. 4) of the semiconductor chips 3 are electrically connected with the semiconductor elements via the wiring layers provided between the semiconductor substrate and the front surface 3$a$ to thereby form parts of the circuits.

As shown in FIG. 6, each penetrating electrode 3$tsv$ is formed to penetrate the semiconductor chip 3 in the thickness direction, and the front surface electrode 3$ap$ is electrically connected with the back surface electrode 3$bp$ via the penetrating electrode 3$tsv$, so that the back surface electrode 3$bp$ can be electrically connected with the circuit of the semiconductor chip 3 formed on the front surface 3$a$ side. That is, as shown in FIG. 6, the front surface electrode 3$ap$ of the memory chip MC1 is electrically connected with the back surface electrode 3$bp$ of the logic chip LC via the conductive member, such as an external terminal (protrusion electrode, conductive member, bump electrode) 7, so that the circuit of the memory chip MC1 is electrically connected with the circuit of the logic chip LC via the penetrating electrodes 3$tsv$.

In this embodiment, the logic chip LC mounted in between the memory chip MC1 and the wiring substrate 2 includes a plurality of the penetrating electrodes 3$tsv$. The memory chip MC1 is electrically connected with the logic chip LC via the penetrating electrodes 3$tsv$, which can exclude the wiring substrate 2 and a wire (bonding wire) (not shown) from a transmission path between the logic chip LC and the memory chip MC1. As a result, an impedance component in the transmission path between the logic chip LC and the memory chip MC1 can be reduced to suppress the influence of noise caused by increase in clock frequency. In other words, even upon increasing the signal transmission rate between the logic chip LC and the memory chip MC1, the transmission reliability of the semiconductor device can be improved.

In the example shown in FIG. 6, the memory chips MC1, MC2, MC3, and MC4 are stacked over the logic chip LC. Thus, the signal transmission rate among the memory chips MC1, MC2, MC3, and MC4 is preferably improved or increased. The memory chips MC1, MC2, and MC3 under and above which the respective semiconductor chips 3 are arranged, among the memory chips MC1, MC2, MC3, and MC4, include a plurality of penetrating electrodes 3$tsv$, like the logic chip LC. Specifically, each of the memory chips MC1, MC2, and MC3 includes front surface electrodes (electrodes, pads) 3$ap$ formed on its front surface 3$a$, and back surface electrodes (electrodes, pads) 3$bp$ formed on its back surface 3$b$. The respective memory chips MC1, MC2, and MC3 include the penetrating electrodes 3$tsv$ penetrating from one of the front surface 3$a$ and the back surface 3$b$ to the other and electrically connecting the front surface electrodes 3$ap$ to the back surface electrodes 3$bp$.

Like the above logic chip LC, the front surface electrodes 3$ap$ of the upper semiconductor chip 3 among the memory chips MC1, MC2, MC3, and MC4 are electrically connected with the back surface electrode 3$bp$ of the lower semiconductor chip 3 via the conductive members, including external terminals 7, so that the circuits of the stacked semiconductor chips 3 are electrically connected with each other via the penetrating electrodes 3$tsv$.

The respective semiconductor chips 3 are connected with each other via the external terminals 7 (solder material 7$a$), which can exclude the wiring substrate 2 and the wires (bonding wires) (not shown) from the transmission paths among the memory chips MC1, MC2, MC3, and MC4. As a result, an impedance component in the transmission path between the stacked memory chips MC1, MC2, MC3, and MC4 can be reduced to suppress the influence of noise caused by increase in clock or clock frequency. In other words, even upon increasing the signal transmission rate among the memory chips MC1, MC2, MC3, and MC4, the transmission reliability of the semiconductor device can be improved.

In the example shown in FIG. 6, the memory chip MC4 mounted at the uppermost level is preferably connected with the memory chip MC3, whereby the surface electrodes 3ap are formed, but the back surface electrodes 3bp and the penetrating electrodes 3tsv are not necessarily formed. The memory chip MC4 mounted at the uppermost level takes the structure without having the back electrodes 3bp and the penetrating electrodes 3tsv, which can simplify the manufacturing process of the memory chip MC4. Although not shown, in a modified example, the memory chip MC4 can include the back surface electrodes 3bp and the penetrating electrodes 3tsv, like the memory chips MC1, MC2, and MC3. In this case, the stacked memory chips MC1, MC2, MC3, and MC4 have the same structure, which can improve the manufacturing efficiency.

Each external terminal 7 is arranged between the adjacent stacked semiconductor chips 3, and serves to electrically connect the front surface electrode 3ap of the semiconductor chip 3 positioned at the upper level with the back surface electrode 3bp of the semiconductor chip 3 positioned at the lower level. The external terminal 7 is made of the following material in the example shown in FIG. 6. That is, the external terminal 7 electrically connecting the logic chip LC with the wiring substrate 2 includes a columnar (for example, cylindrical) member (protruding electrode 7b) mainly formed of copper (Cu), and a metal member formed of a nickel (Ni) film and a solder (for example, SnAg) film (solder material 7a) stacked on the tip of the columnar member. The electric connection of the external terminal 7 is established by bonding the solder film at its tip to the back surface electrode 3bp.

In the example shown, the semiconductor chips are connected together via the solder material 7a without using the protruding electrode 7b except for the bonding portion between the logic chip LC and the wiring substrate 2. In this case, the solder material 7a is bonded to the exposed surface of the front surface electrode 3ap, and can serve as the external terminal (bump electrode called a microbump).

In various modified examples, the material for the external terminal 7 can be changed within the requirements of electrical characteristics, or bonding strength. For example, the protruding electrodes 7b are formed on the front surface electrode 3ap of each of the memory chips MC1, MC2, MC3, and MC4, so that the chips can be electrically connected together via the protruding electrode 7b and the solder material 7a. Alternatively, the solder material 7a is directly bonded to the exposed surface of the front surface electrode 3ap of the logic chip LC, so that the logic chip can be electrically connected with the wiring substrate 2 via the solder material 7a.

Like the logic chip LC and the memory chips MC1, MC2, and MC3 shown in FIG. 6, the semiconductor chip 3 including the penetrating electrodes 3tsv is preferably thin, that is, the distance between the front surface 3a and the back surface 3b is preferably thin (small). As the thickness of the semiconductor chip 3 is decreased, the transmission distance of the penetrating electrode 3tsv is shortened, which is preferable in reducing the impedance component. When openings (including a through hole and a non-penetrating hole) are formed in the semiconductor substrate in the thickness direction, the processing accuracy is reduced with increasing depth of the opening. In other words, as the semiconductor chip 3 becomes thinner, the processing accuracy of the opening for forming the penetrating electrodes 3tsv can be improved. As a result, the diameters of the penetrating electrodes 3tsv can be easily set to the same value (length or width of the semiconductor chip 3 in the direction perpendicular to the thickness direction), which facilitates the control of the impedance components of the transmission paths.

In the example shown in FIG. 6, the thickness of the logic chip LC is smaller than that of the laminated body MCS (see FIG. 4) formed of the memory chips MC1, MC2, MC3, and MC4 arranged over the logic chip LC. The thickness of the logic chip LC is also smaller than that of the memory chip MC4 located at the uppermost level of the memory chips MC1, MC2, MC3, and MC4, and not having the penetrating electrode 3tsv. For example, the thickness of the logic chip LC is 50 µm. In contrast, the thickness of the memory chip MC4 is in a range of about 80 to 100 µm. The thickness of the laminated body MCS (see FIG. 4) made of the memory chips MC1, MC2, MC3, and MC4 is about 260 µm.

As mentioned above, in producing the thinner semiconductor chip 3, the state of exposing the semiconductor chip 3 might lead to damage on the semiconductor chip 3. In this embodiment, as shown in FIG. 4, the seal member 4 is brought into intimate contact with the semiconductor chips 3 to seal the chips therewith. Thus, the seal member 4 can serve as a protection member for the semiconductor chips 3 to suppress the damage on the semiconductor chip 3. That is, according to this embodiment, the semiconductor chips 3 can be sealed with resin to thereby improve the reliability (durability) of the semiconductor device 1.

In the semiconductor device 1 including the laminated body of the semiconductor chips 3 with the penetrating electrodes 3tsv, the distance between the semiconductor chip 3 and the wiring substrate 2 is preferably narrow from the viewpoint of reducing the transmission distance. For example, in the example shown in FIG. 6, a distance between the front surface 3a of the logic chip LC and an upper surface 2a of the wiring substrate 2 is, for example, in a range of about 10 to 20 µm. The distance between the front surface 3a of the memory chip MC1 and the upper surface 2a of the wiring substrate 2 is, for example, in a range of about 70 to 100 µm. In the semiconductor device 1 including the laminated body of the semiconductor chips 3 with the penetrating electrodes 3tsv, it is preferable that the transmission distance is reduced by decreasing the distance between the semiconductor chips 3 and the thickness of each semiconductor chip 3.

In the layout of the front surface electrodes 3ap and the back surface electrodes 3bp in plan view of this embodiment, the transmission distance between the logic chip LC and each of the memory chips MC1, MC2, MC3, and MC4 can be reduced.

As shown in FIG. 7, the front surface electrodes 3ap included in the memory chips MC1, MC2, MC3, and MC4 are collectively arranged in the center of the front surface 3a. As shown in FIG. 8, the back surface electrodes 3bp included in the memory chips MC1, MC2, and MC3 are collectively arranged in the center of each back surface 3b. As shown in FIG. 6, the front surface electrodes 3ap of the memory chips MC1, MC2, MC3, and MC4, and the back surface electrodes 3bp of the memory chips MC1, MC2, and MC3 are arranged to be superimposed over each other in the thickness direction.

As shown in FIG. 9, some parts (front surface electrodes 3ap1) of the front surface electrodes 3ap included in the logic chip LC are collectively arranged in the center of the front surface 3a. Other parts (front surface electrodes 3ap2) of the front surface electrodes 3ap included in the logic chip LC are collectively arranged along each side (side surface 3c) of the front surface 3a located at the peripheral edges of the front surface 3a. The surface electrodes 3ap1 arranged in the center of the front surface 3a among the front surface electrodes 3ap shown in FIG. 9 are electrically connected with the back surface electrodes 3*bp* via the penetrating electrodes 3*tsv* shown in FIG. 6. That is, the front surface electrodes 3*ap*1 are electrodes for internal interface. The surface electrodes 3*ap*2 arranged at the peripheral edges of the front surface 3*a* among the front surface electrodes 3*ap* shown in FIG. 9 are electrically connected with the external device (not shown) via the wiring substrate 2 shown in FIG. 4. Specifically, the front surface electrode 3*ap*2 is electrically coupled to the bonding leads 2*f* (see FIG. 4) via the external terminals 7. That is, the front surface electrodes 3*ap*2 are electrodes for external interface.

From the viewpoint of reducing the transmission distance between the respective semiconductor chips 3, preferably, as shown in FIG. 6, the front surface electrodes 3*ap* and back surface electrodes 3*bp* for the internal interface are superimposed to each other in the thickness direction, and connected together via the external terminals 7.

As mentioned above, the planar size of the logic chip LC is smaller than that of each of the memory chips MC1, MC2, MC3, and MC4. In the semiconductor device 1 shown in FIG. 3, the center (central region) of the back surface 3*b* of the logic chip LC is arranged to be superimposed over the center (central region) of the Memory chip MC4 in plan view. That is, in plan view, four side surfaces 3*c* of the memory chip MC4 are arranged outside four side surfaces 3*c* of the logic chip LC. In other words, the semiconductor chips 3 are stacked over the wiring substrate 2 such that the four side surfaces 3*c* of the memory chip MC4 are positioned between the four side surfaces 3*c* of the logic chip LC and the four side surfaces 2*c* of the wiring substrate 2. The memory chips MC1, MC2, and MC3 shown in FIG. 4 are arranged to be superimposed over (in the same position) as the memory chip MC4 in plan view.

Thus, in plan view, the peripheral edges (peripheral edges of the front surface 3*a* and the back surface 3*b*) of the memory chips MC1, MC2, MC3, and MC4 are arranged to be superimposed over the outer periphery of the logic chip LC. In other words, there is no logic chip LC existing between the periphery of each of the memory chips MC1, MC2, MC3, and MC4 and the wiring substrate 2 (see, for example, FIG. 4).

In order to arrange the front surface electrodes 3*ap* and the back surface electrodes 3*bp* for internal interface of each semiconductor chip 3 shown in FIG. 6 such that the surface electrodes 3*ap* and 3*bp* are superimposed over each other in the thickness direction, at least the front surface electrodes 3*ap* and back surface electrodes 3*bp* for the internal interface are preferably arranged to be superimposed over the logic chip LC in the thickness direction. As shown in FIG. 9, the front surface electrodes 3*ap*2 for the external interface are arranged in the periphery of the logic chip LC. The front surface electrodes 3*ap*1 for the internal interface are preferably arranged collectively in the center of the front surface 3*a* of the logic chip LC.

As shown in FIG. 7, a plurality of memory regions (storage circuit element arrangement regions) MR are formed on the front surface 3*a* side (specifically, main surface of the semiconductor substrate) of each of the memory chips MC1, MC2, MC3, and MC4. In the example shown in FIG. 7, the four memory regions MR corresponding to the above four channels are formed. In each memory region MR, a plurality of memory cells (storage circuit elements) are arranged in an array. When as shown in FIG. 7, the front surface electrodes 3*ap* are collectively arranged in the center of the front surface 3*a*, the memory regions MR for the four channels can be arranged to enclose a region with a group of the front surface electrodes arranged. As a result, the distances from the respective memory regions MR to the front surface electrode 3*ap* can be equalized. That is, preferably, the transmission distances of the channels can be made equal, which can decrease an error between the respective transmission rates for the channels.

When using the front surface electrodes 3*ap*1 collectively arranged in the center of the front surface 3*a* of the logic chip LC shown in FIG. 9 as electrodes for the internal interface, the front surface electrode 3*ap*1 can act without being electrically connected with the wiring substrate 2 shown in FIG. 6. As shown in FIG. 6, a part of the front surface electrode 3*ap*1 is electrically connected with the bonding lead 2*f* of the wiring board 2, whereby the part of the front surface electrode 3*ap*1 can be preferably used as the electrode for the external interface.

For example, each of the memory chips MC1, MC2, MC3, and MC4 is provided with the power supply circuit DR for driving the main storage circuit MM shown in FIG. 5. The part of the front surface electrode 3*ap*1 shown in FIG. 9 is used as a terminal for supplying the power supply potential (first reference potential) and the reference potential (second reference potential different from the first reference potential, for example, ground potential) to the power supply circuits DR. In other words, in the example shown in FIG. 9, the surface electrodes 3*ap*1 arranged in the center, of the front surface 3*a* of the logic chip LC include a first reference potential electrode to which the first reference potential (for example, power supply potential) is supplied, and a second reference potential electrode to which the second reference potential (for example, ground potential) different from the first reference potential is supplied. In other words, in the example shown in FIG. 9, the front surface electrodes 3*ap*1 arranged in the center of the front surface 3*a* of the logic chip LC include power wires V2 and V3 (see FIG. 5) for supplying a voltage for driving a circuit formed in the memory chip MC1.

In order to suppress the instability of the operation due to an instant voltage drop in increasing the signal transmission rate, the transmission distance between a power supply source and a circuit consuming the power is preferably shortened. Preferably, the parts of the front surface electrodes 3*ap*1 of the logic chip LC are electrically connected with the wiring board 2 to supply the first reference potential (for example, power supply potential) and the second reference potential (for example, ground potential), which can shorten the distance from each of the memory chips MC1, MC2, MC3, and MC4 with the circuit consuming the power to the corresponding driving circuit. The first reference potential (for example, power supply potential) is supplied to the first reference potential electrode. The second reference potential (for example, ground potential) different from the first reference potential is supplied to the second reference potential electrode. The first reference potential electrode and the second reference potential electrode are arranged such that the front surface electrode 3*ap* is preferably superimposed over the back surface electrode 3*bp* in the thickness direction as shown in FIG. 6. The first reference potential electrode is preferably electrically connected with the second reference potential electrode via the penetrating electrodes 3*tsv*.

<Alignment Accuracy of Semiconductor Chips>

The inventors of the present application have studied and found that when the back surface electrode 3*bp* of the lower semiconductor chip 3 faces and is electrically connected with the front surface electrode 3*ap* of the upper semiconductor chip 3 via the external terminals 7, the stacking of the semiconductor chips 3 requires the high alignment accuracy.

As shown in FIG. 6, in order to electrically connect the back surface electrodes 3*bp* of the lower semiconductor chip 3 to the front surface electrodes 3*ap* of the upper semiconductor chip 3, the back surface electrodes 3*bp* need to be superimposed over the front surface electrodes 3*ap* in the thickness direction. When an area where the back surface electrode 3*bp* is superimposed over the front surface electrode 3*ap* is small, the bonding area between the solder material 7*a* and the back surface electrode 3*bp* (or front surface electrode 3*ap*) becomes small, which might reduce the electrical characteristics. Thus, it is necessary to improve the alignment accuracy between the back surface electrode 3*bp* of the lower semiconductor chip 3 and the front surface electrode 3*ap* of the upper semiconductor chip 3.

Referring to FIG. 10, when the number of the back surface electrodes 3*bp* of the logic chip LC is large, the number of the objects of interest requiring the adequate alignment accuracy is increased, which needs the high alignment accuracy. As a pitch between the back surface electrodes 3*bp* of the logic chip LC (distance between the adjacent electrodes) becomes small, one electrode might come into contact with adjacent another electrode due to the misalignment. In this case, the alignment needs to be performed with higher accuracy.

Figure 11:
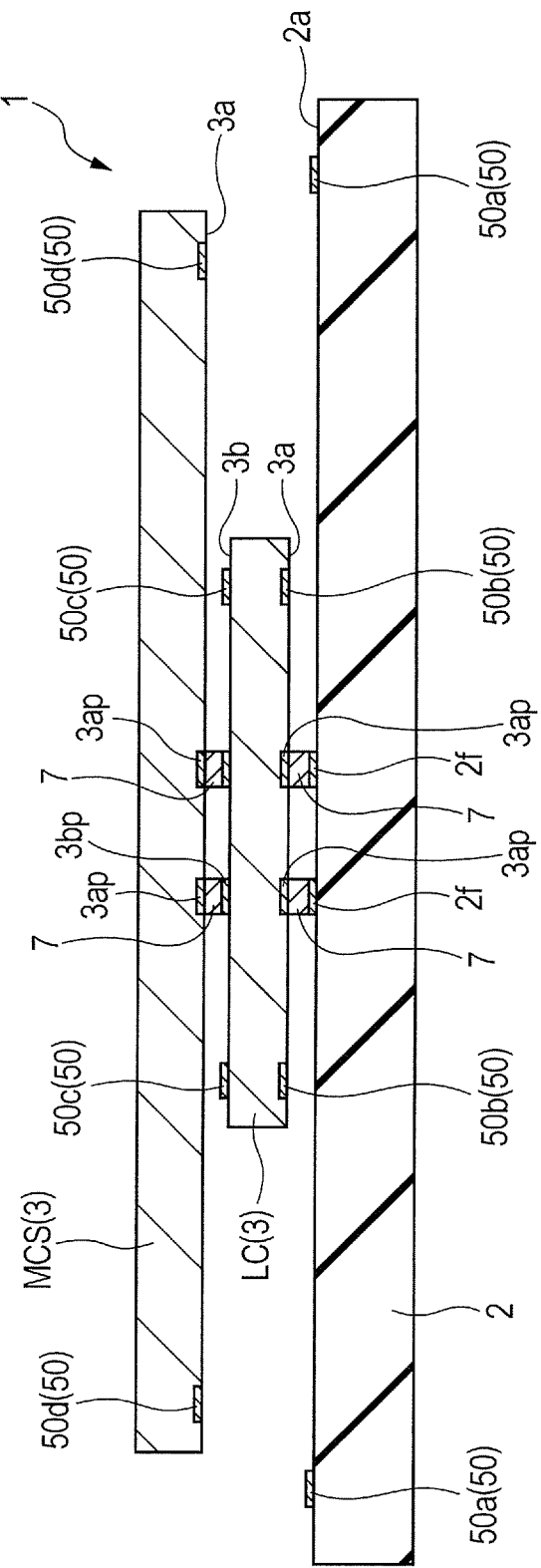
FIG. 11 is an exemplary explanatory diagram showing alignment means (alignment marks) used in assembling the semiconductor device shown in FIG. 4.
Figure 12:
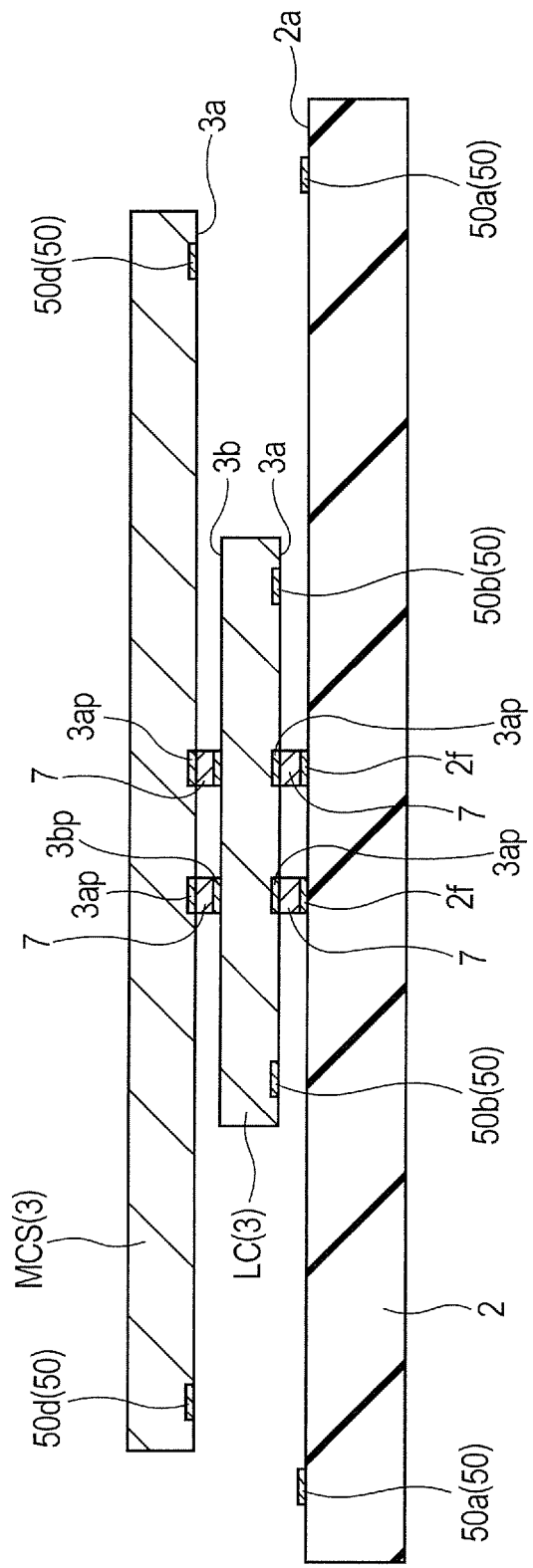
FIG. 12 is an explanatory diagram showing a studied example corresponding to FIG. 11.

For this reason, the inventors of the present application have studied techniques for improving the alignment accuracy in stacking the semiconductor chips 3 over the wiring substrate 2. FIG. 11 is an exemplary explanatory diagram showing alignment means (alignment marks) used in assembling the semiconductor device shown in FIG. 4. FIG. 12 is an explanatory diagram showing a studied example corresponding to FIG. 11.

As shown in FIG. 12, the inventors of the present application have studied methods for forming alignment marks 50 in the wiring substrate 2 and the front surfaces 3*a* of the semiconductor chips 3. In an alignment method shown in FIG. 12, first, an alignment mark 50*a* formed in the wiring substrate 2 and an alignment mark 50*b* formed in the front surface 3*a* of the logic chip LC are detected (identified), and then aligned with each other. Thereafter, the logic chip LC is mounted over the wiring substrate 2. Then, the alignment mark 50*a* formed in the wiring substrate 2 and an alignment mark 50*d* formed in the front surface 3*a* of the laminated body MCS are detected (identified), and then aligned with each other. Thereafter, the laminated body MCS is mounted over the logic chip LC.

In the method shown in FIG. 12, the alignment accuracy of the logic chip LC with respect to the wiring substrate 2 is defined mainly by a detection accuracy for detecting the positions of the alignment marks 50*a* and 50*b*, and a conveyance accuracy in mounting the logic chip LC. For example, when a pitch between the electrodes (distance between adjacent electrodes) is 60 μm, the alignment accuracy of the logic chip LC with respect to the wiring substrate 2 is set within a tolerance of about ±5 to 10 which can sufficiently ensure the electric connection reliability between the logic chip LC and the wiring substrate 2.

The alignment accuracy of the laminated body MCS with respect to the wiring substrate 2 is defined mainly by a detection accuracy for detecting the positions of the alignment marks 50*a* and 50*d*, and a conveyance accuracy in mounting the laminated body MCS. Thus, the use of the same detection device and mounting device as those in the step of mounting the above logic chip LC can set the alignment accuracy of the laminated body MCS with respect to the wiring substrate 2 within about a tolerance of ±5 to 10 μm.

In the method shown in FIG. 12, the alignment accuracy of the laminated body MCS with respect to the logic chip LC might be in a range of ±10 to 20 μm, taking into consideration the misalignment between the laminated body MCS and the logic chip LC. The alignment accuracy between the back surface electrode 3*bp* of the logic chip LC and the front surface electrode 3*ap* of the laminated body MCS needs to be determined by considering the formation positional accuracy of the respective electrodes. In the method shown in FIG. 12, as the number of the stacked semiconductor chips 3 is increased, the alignment accuracy might be reduced. Even when two semiconductor chips 3 are stacked as shown in FIG. 12, the reliability of electrical characteristics might be obviously reduced depending on a pitch between the electrodes.

The inventors of the present application have further studied and found the structure shown in FIG. 11. That is, the structure shown in FIG. 11 includes alignment marks 50*c* formed on the back surface 3*b* of the logic chip LC, in addition to the structure shown in FIG. 12. In an alignment method shown in FIG. 11, first, an alignment mark 50*a* formed in the wiring substrate 2 and an alignment mark 50*b* formed in the front surface 3*a* of the logic chip LC are detected (identified), and then aligned with each other. Thereafter, the logic chip LC is mounted over the wiring substrate 2. This point is the same as that in the alignment method shown in FIG. 12.

Then, the alignment mark 50*c* formed in the logic chip LC and the alignment mark 50*d* formed in the front surface 3*a* of the laminated body MCS are detected (identified), and then aligned with each other. Thereafter, the laminated body MCS is mounted over the logic chip LC. That is, the alignment method shown in FIG. 11 differs from the alignment method shown in FIG. 12 in that the alignment is performed based on the alignment mark 50*c* formed in the logic chip LC.

In the alignment method shown in FIG. 11, the alignment mark 50*c* formed on the back surface 3*b* of the logic chip LC is used as the reference for alignment, so that the alignment accuracy of the laminated body MCS with respect to the logic chip LC does not need to take into consideration the misalignment of the logic chip LC. Thus, the use of the same detection device and mounting device as those in the above example can achieve the alignment accuracy within a tolerance of about ±5 to 10 μm. The alignment method shown in FIG. 11 can prevent the decrease in alignment accuracy even when the number of stacked semiconductor chips 3 is increased.

That is, the alignment accuracy of the upper semiconductor chip 3 with respect to the lower semiconductor chip 3 is not affected by the number of stacked semiconductor chips 3. Even when the pitch between the electrodes is very small, the adequate alignment accuracy can be ensured according to the capability of a detector or mounting device, which can suppress the reduction in reliability of electrical characteristics between the semiconductor chips 3.

FIG. 3 and FIGS. 7 to 10 show an example of the layout of alignment marks 50 included in the semiconductor device 1 of the first embodiment. The detailed structure of the alignment mark and preferred embodiments will be described in more detail in describing the manufacturing method of the semiconductor device 1.

<Method of Manufacturing Semiconductor Device>

Figure 13:
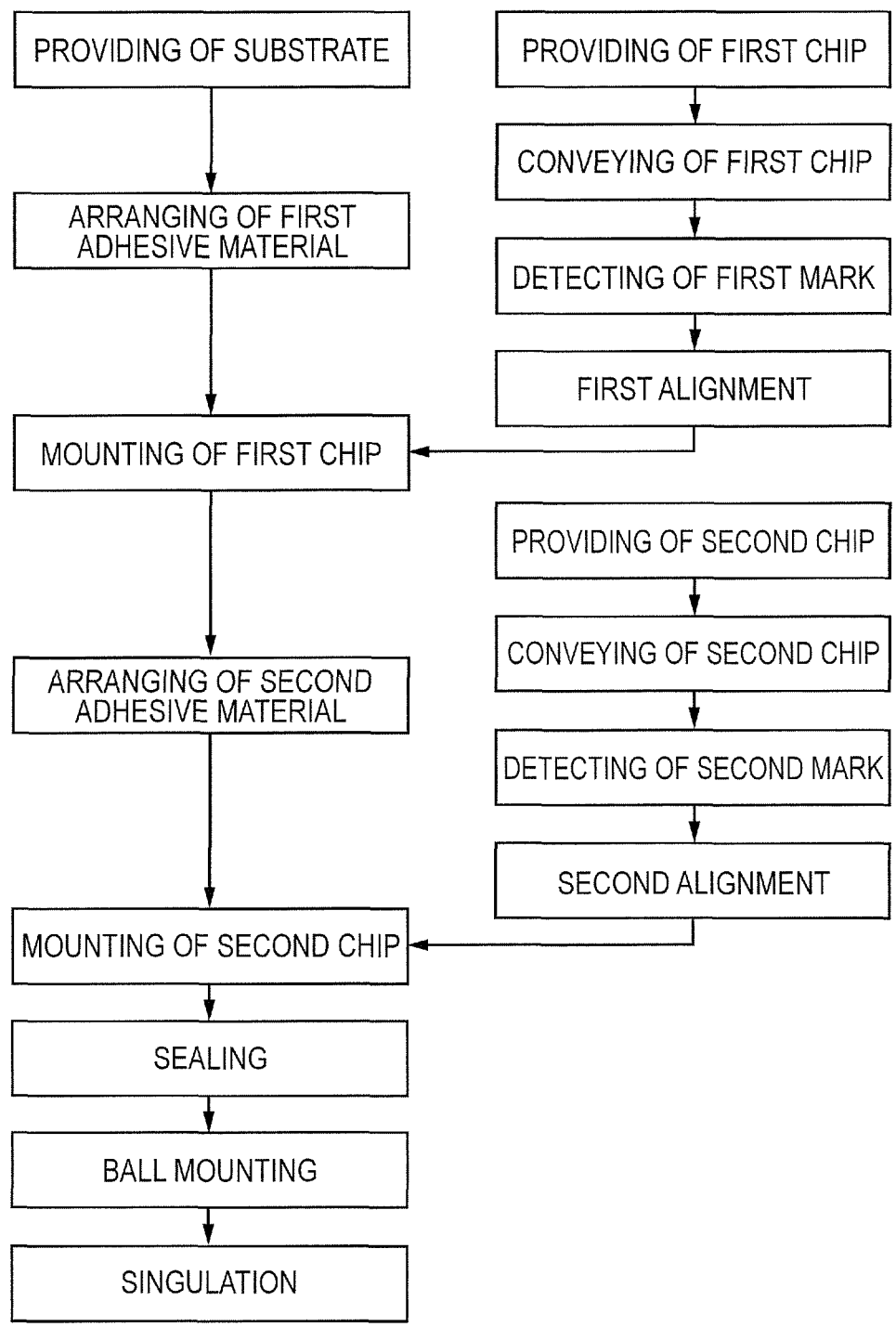
FIG. 13 is an explanatory diagram showing the outline of a manufacturing process of the semiconductor device explained with reference to FIGS. 1 to 11.

Next, a manufacturing process of the semiconductor device 1 described with reference to FIGS. 1 to 11 will be described below. The semiconductor device 1 is manufactured along a flowchart of FIG. 13. FIG. 13 shows an exemplary explanatory diagram of the outline of the manufacturing process of the semiconductor device described with reference to FIGS. 1 to 11. The details of the respective steps will be described below with reference to FIGS. 14 to 45.

<Substrate Provision Step>

Figure 14:
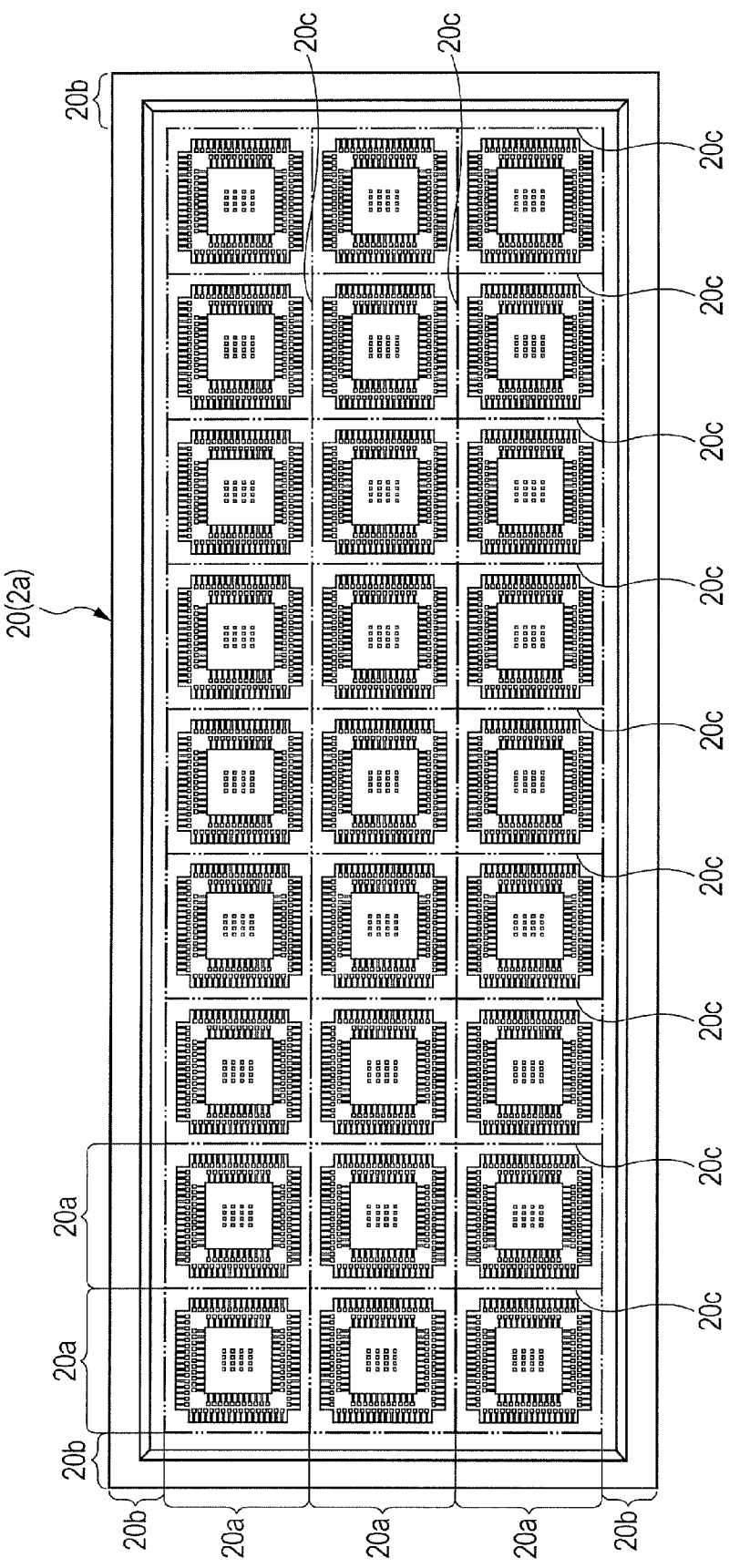
FIG. 14 is a plan view showing the entire structure of a wiring substrate provided in a substrate provision step shown in FIG. 13.
Figure 15:
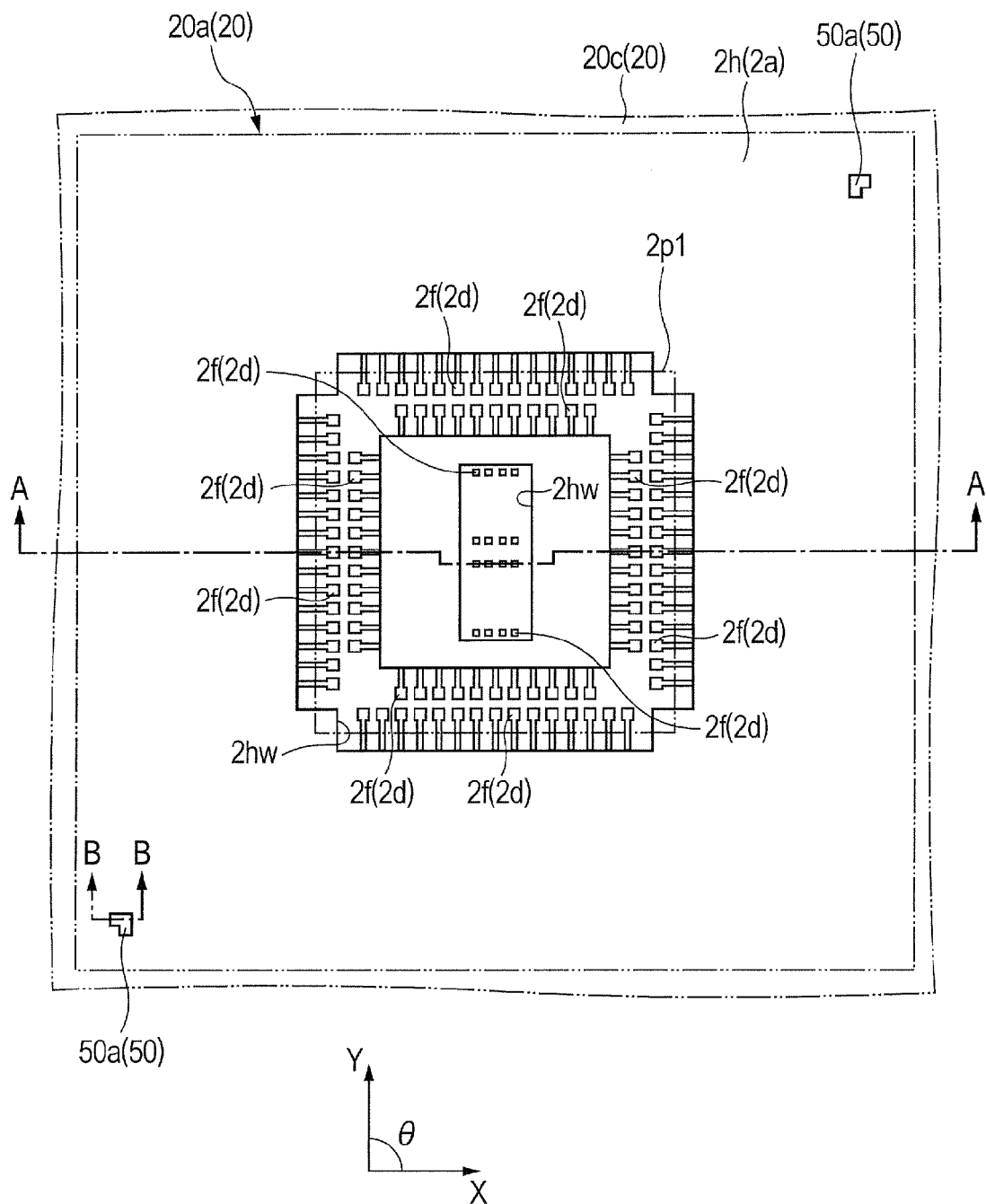
FIG. 15 is an enlarged plan view of one device region shown in FIG. 14.
Figure 16:
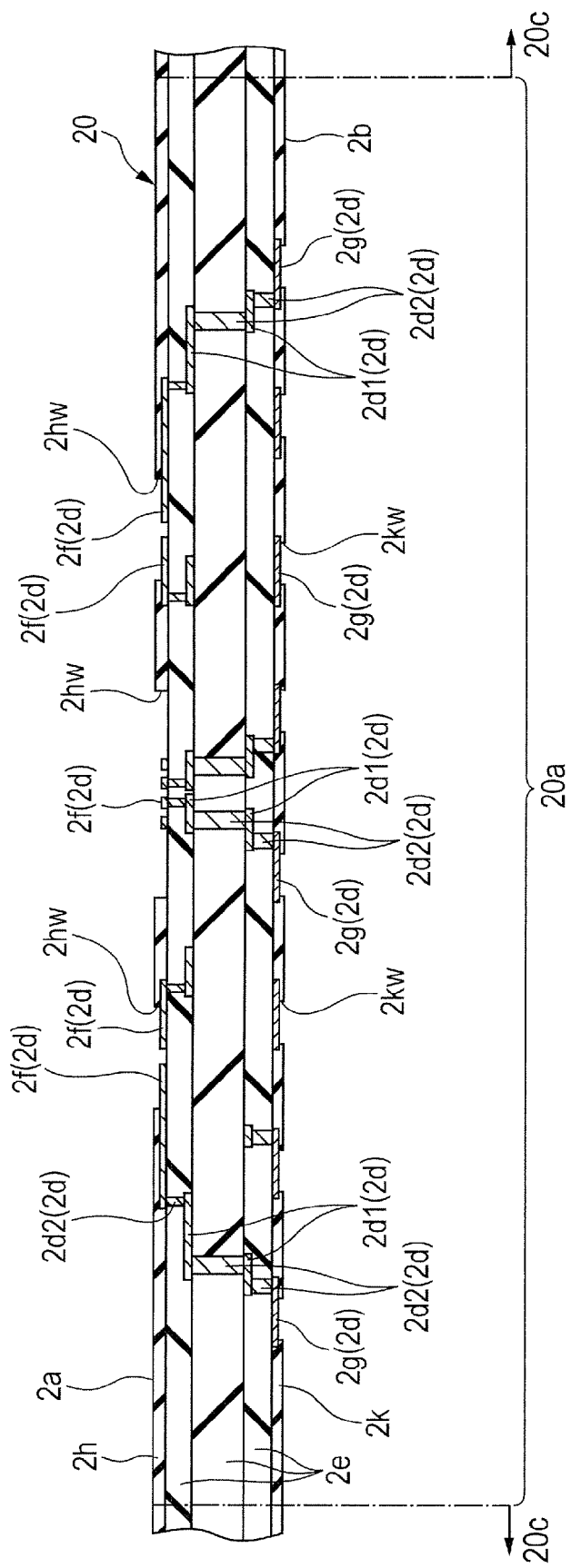
FIG. 16 is an enlarged cross-sectional view taken along the line A-A of FIG. 15.
Figure 17:
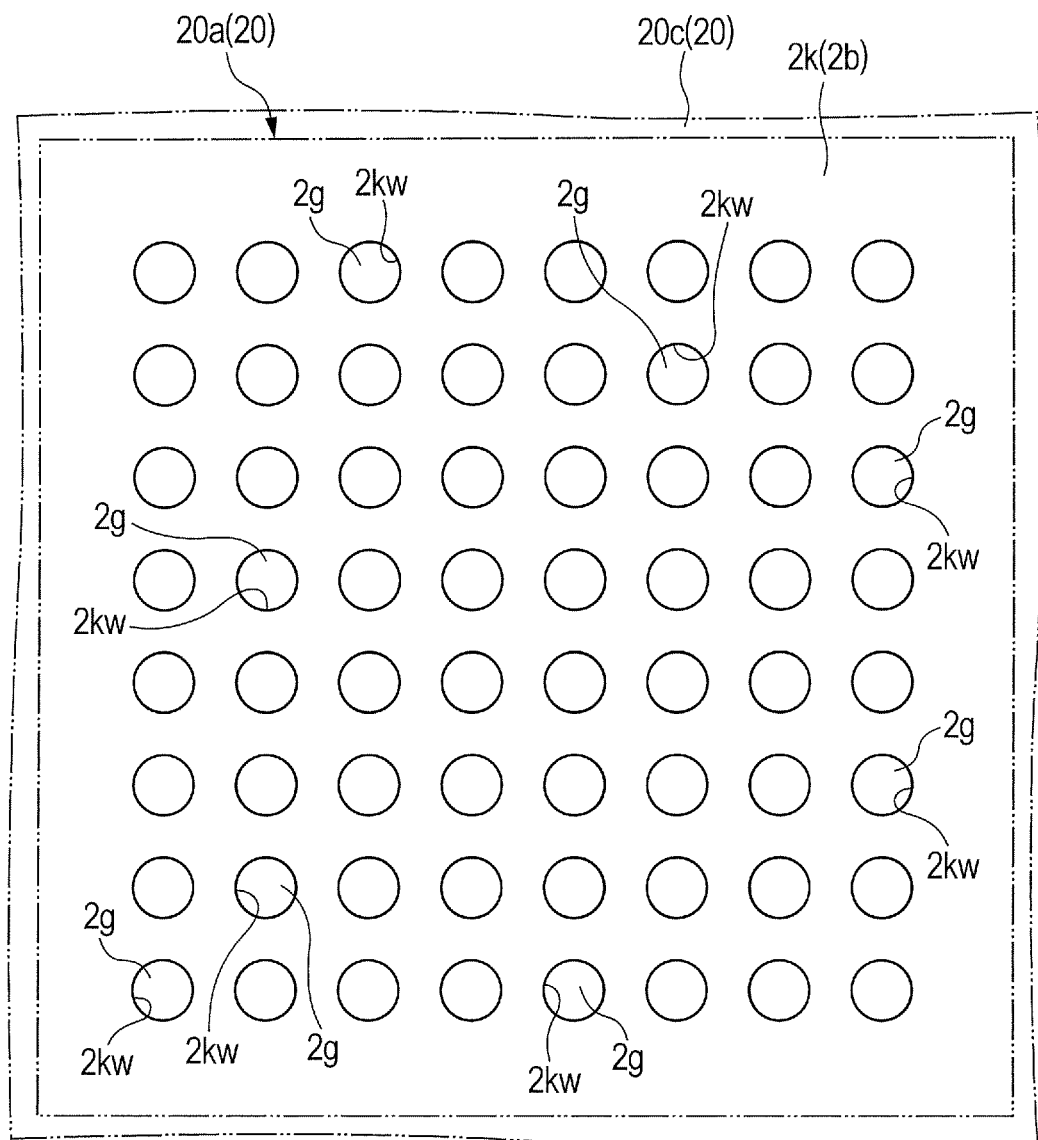
FIG. 17 is an enlarged plan view showing the surface opposite to that shown in FIG. 15.
Figure 18:
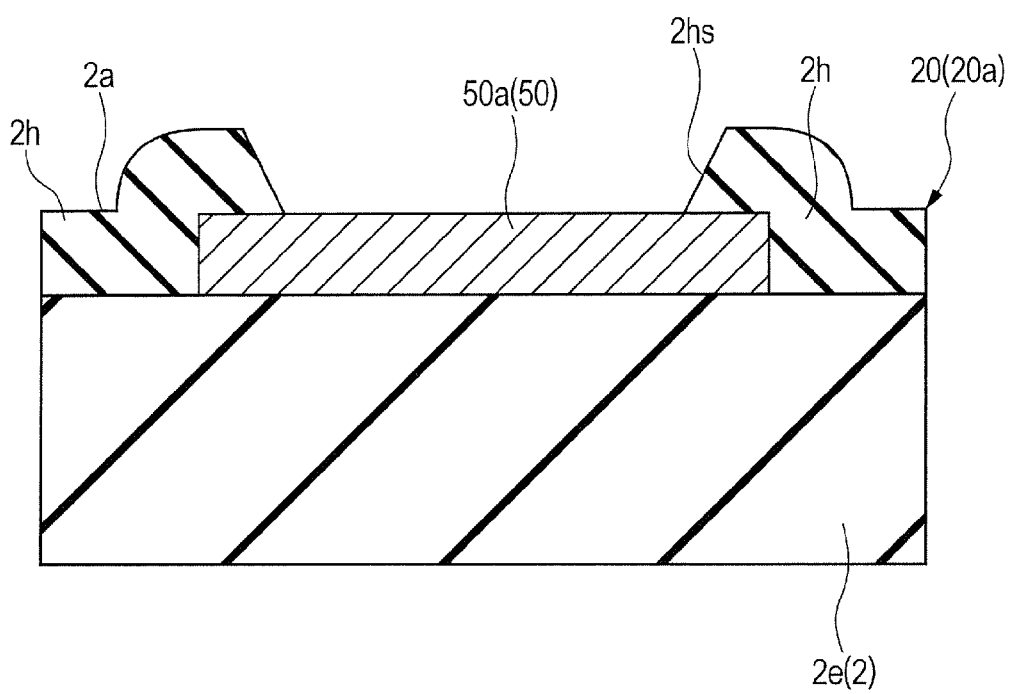
FIG. 18 is an enlarged cross-sectional view taken along the line B-B of FIG. 15.

First, in a substrate provision step shown in FIG. 13, a wiring substrate 20 is provided as shown in FIGS. 14 to 18. FIG. 14 shows a plan view of the entire structure of a wiring substrate provided in the substrate provision step shown in FIG. 13. FIG. 15 shows an enlarged plan view of one device region shown in FIG. 14. FIG. 16 shows an enlarged cross-sectional view taken along the line A-A of FIG. 15. FIG. 17 shows an enlarged plan view of the surface opposite to that shown in FIG. 15. FIG. 18 shows an enlarged cross-sectional view taken along the line B-B of FIG. 15. For easy understanding, although the number of terminals is shown to be small in FIGS. 14 to 17, the number of terminals (bonding lands 2f and lands 2g) is not limited to those shown in FIGS. 14 to 17.

As shown in FIG. 14, the wiring substrate 20 provided in this step includes device regions 20a inside a frame (outer frame) 20b. Specifically, a plurality of device regions 20a (27 regions in FIG. 14) are arranged in columns and rows. Each of the device regions 20a corresponds to the wiring substrate 2 shown in FIGS. 1 to 4. The wiring substrate 20 is the so-called multi-piece substrate including a plurality of device regions 20a, and dicing lines (dicing regions) 20c positioned between the device regions 20a. In this way, the use of the multi-piece substrate including the device regions 20a can improve the manufacturing efficiency.

As shown in FIGS. 15 and 16, each device region 20a is provided with the components of the wiring substrate 2 described with reference to FIG. 4. The wiring substrate 20 has an upper surface 2a, a lower surface 2b opposite to the upper surface 2a, and a plurality of wiring layers (four layers in the example shown in FIG. 4) electrically connecting the upper surface 2a with the lower surface 2b. The respective wiring layers have insulating layers (core layers) 2e for insulating the adjacent wirings 2d as well as the adjacent wiring layers from each other. The wirings 2d include wirings 2d1 formed on the upper or lower surface of the insulating layer 2e, and via wirings 2d2 serving as an interlayer conductive path penetrating the insulating layer 2e in the thickness direction.

As shown in FIG. 15, the upper surface 2a of the wiring substrate 20 includes a chip mounting region (chip mounting portion) 2p1 where the logic chip LC shown in FIG. 9 is to be mounted in a first chip mounting step shown in FIG. 13. The chip mounting region 2p1 exists in the center of the device region 20a at the upper surface 2a. In order to indicate the positions of the chip mounting region 2p1, the device region 20a, and the dicing lines 20c in FIG. 15, the contours of the chip mounting region 2p1, the device region 20a, and the dicing lines 20c are represented by respective two-dot chain lines. The chip mounting region 2p1 is a region where the logic chip LC is to be mounted as mentioned above, and thus does not necessarily include any boundary line actually viewable. Also, the device region 20a and the dicing lines 20c do not necessarily include any boundary lines actually viewable.

The upper surface 2a of the wiring substrate 20 is provided with a plurality of bonding leads (terminals, chip mounting surface side terminals, electrodes) 2f. The bonding lead 2f is a terminal electrically connected with the front surface electrodes 3ap formed on the front surface 3a of the logic chip LC shown in FIG. 9 in the first chip mounting step as shown in FIG. 13. In this embodiment, the logic chip LC is mounted with the front surface 3a side of the chip LC opposite to the upper surface 2a of the wiring substrate 20 by the so-called face down mounting method, whereby the bonding portions of the bonding leads 2f are formed within the chip mounting region 2p1.

The upper surface 2a of the wiring substrate 20 is covered with the insulating film (solder resist films) 2h. The insulating film 2h is provided with openings 2hw, and in the openings 2hw, at least parts (bonding portions or bonding regions with the semiconductor chip) of the bonding leads 2f are exposed from the insulating film 2h. Although not shown, in this embodiment, an upper surface of the dicing line (dicing region) 20c is also exposed from the insulting film 2h. With this arrangement, in use of a dicing blade (rotary blade) in the following singulating step (see FIG. 13), the insulating film 2h can be prevented from being stuck in the dicing blade. That is, the cutting performance can be prevented from being reduced. If the cutting performance is not taken into consideration, the upper surface of the dicing line 20c may be covered with the insulating film 2h.

As shown in FIG. 17, a plurality of lands 2g are formed on the lower surface 2b of the wiring substrate 20. The lower surface 2b of the wiring substrate 20 is covered with the insulating film (solder resist film) 2k. The insulating film 2k is provided with openings 2kw, and at the openings 2kw, at least parts (bonding portions with the solder balls 5) of the lands 2g are exposed from the insulating film 2k. Although not shown, in this embodiment, a lower surface of the dicing line (dicing region) 20c is also exposed from the insulting film 2k. With this arrangement, in use of the dicing blade (rotary blade) in the following singulating step (see FIG. 13), the insulating film 2h can be prevented from being stuck in the dicing blade. That is, the cutting performance can be prevented from being reduced. If the cutting performance is not taken into consideration, the upper surface of the dicing line 20c may be covered with the insulating film 2k.

As shown in FIG. 16, the bonding leads 2f are electrically connected with the lands 2g via the wirings 2d. These conductive patterns, including the wirings 2d, the bonding leads 2f, and the lands 2g, are formed of metal, for example, mainly containing copper (Cu). The wirings 2d, the bonding leads 2f, and the lands 2g can be formed by the electrolytic plating. As shown in FIG. 16, the wiring substrate 20 including four or more wiring layers (four layers in the example shown in FIG. 16) can be formed, for example, by the buildup technique.

As shown in FIGS. 15 and 18, alignment marks 50a are formed on the upper surface 2a of the wiring substrate 20. The alignment mark 50a is made of a pattern of interest to be detected in the first mark detection step shown in FIG. 13. The alignment mark 50a is formed of the same metal as that of the wiring 2d and bonding lead 2f shown in FIG. 16. In the example shown in FIG. 18, an opening 2hs is formed in the insulating film 2h, and the alignment mark 50a is exposed from the insulating film 2h in the opening 2hs.

As will be described later in details, in the first mark detection step shown in FIG. 13, the position of the alignment mark 50a is detected using an image sensor, such as a camera. The metal pattern exposed from the insulating film 2h is used as the alignment mark 50a, thereby improving the light reflection efficiency, which leads to the improvement of the position detection accuracy. The shape of the contour of the alignment mark 50a may be identifiable. When the insulating film 2h is formed of material that can transmit visible light, the alignment mark 50a may be covered with the insulating film 2h.

For example, when forming the bonding leads 2f and the wirings 2d, the alignment mark 50a can be formed at one time with the bonding leads 2f and the wirings 2d.

As shown in FIG. 15, the alignment mark 50a is preferably formed within the device region 20a. In modified examples of the embodiment, the alignment mark 50a can be formed outside, the device region 20a, that is, within the dicing line (dicing region) 20c, or at a frame 20b shown in FIG. 14. As mentioned above, the alignment mark 50a is used for aligning the logic chip LC with the wiring substrate 2 shown in FIG. 11. Thus, the alignment mark 50a is preferably formed in a region near the chip mounting region 2p1 within the device region 20a from the viewpoint of improving the positional accuracy in formation of the alignment mark 50a. In the modified example, when the alignment mark 50a is arranged within the dicing line (dicing region) 20c, the alignment mark 50a can hardly be covered with the adhesive material in the first adhesive material arrangement step to be described later. Thus, in order to surely expose the alignment mark 50a, the alignment mark 50a is preferably arranged within the dicing line 20c.

As shown in FIG. 15, the alignment marks 50a are preferably formed in positions within the device region 20a. Even only one alignment mark 50a can have its X and Y coordinates defined on a coordinate plane along the upper surface 2a. However, the formation of at least two or more alignment marks 50a can specify the position of the device region 20a in the direction having an angle θ, thereby improving the position detection accuracy.

In order to improve the accuracy for specifying the position in the direction θ, the distance between two alignment marks 50a is preferably increased. Thus, more preferably, as shown in FIG. 15, one alignment mark 50a is arranged at one corner of the device region 20a, while the other alignment mark 50a is arranged at the other corner of the device region 20a facing the above corner. In other words, two alignment marks 50a are preferably arranged on a diagonal line of the device region 20a.

<First Adhesive Material Arrangement Step>

Figure 19:
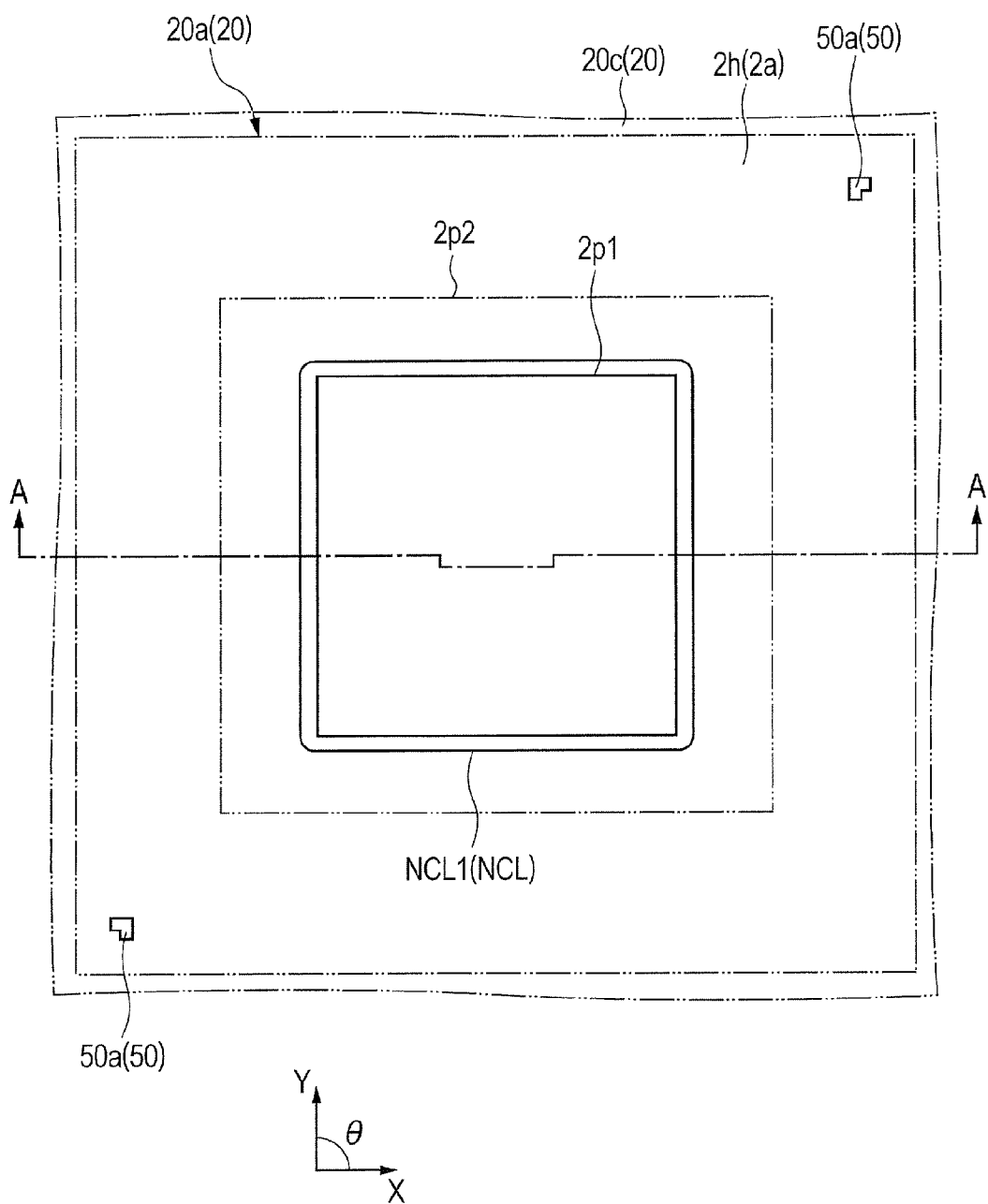
FIG. 19 is an enlarged plan view showing the state of an adhesive material arranged in a chip mounting region shown in FIG. 15.
Figure 20:
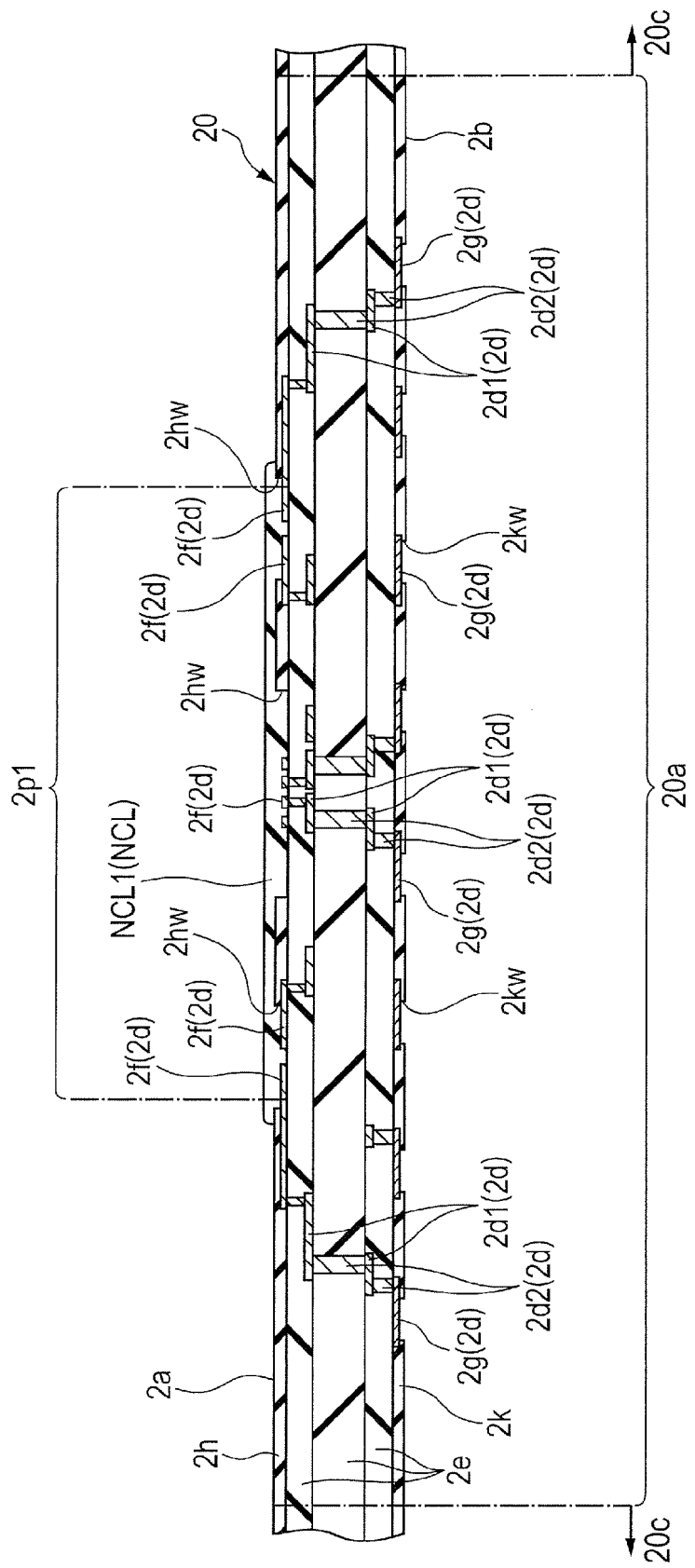
FIG. 20 is an enlarged cross-sectional view taken along the line A-A of FIG. 19.

Then, in the first adhesive material arrangement step shown in FIG. 13, as shown in FIGS. 19 and 20, an adhesive material NCL1 is arranged over the chip mounting region 2p1 at the upper surface 2a of the wiring substrate 20. FIG. 19 shows an enlarged plan view of the state of an adhesive material arranged in the chip mounting region shown in FIG. 15. FIG. 20 is an enlarged cross-sectional view taken along the line A-A of FIG. 19. In order to indicate the positions of the chip mounting regions 2p1 and 2p2, the device region 20a, and the dicing lines 20c, the contours of the chip mounting regions 2p1 and 2p2, the device region 20a, and the dicing lines 20c are represented by respective two-dot chain lines. Each of the chip mounting regions 2p1 and 2p2 is a region where the logic chip LC and the laminated body MCS are to be mounted as mentioned above, and thus does not necessarily include any boundary line actually viewable. Also, the device region 20a and the dicing lines 20c do not necessarily include any boundary lines actually viewable. When illustrating the chip mounting regions 2p1 and 2p2, the device region 20a, and the dicing lines 20c in the plane view, these regions and lines do not necessarily include any boundary line actually viewable.

In general, when mounting the semiconductor chip over the wiring substrate by the face down mounting method (flip-chip bonding), the semiconductor chip is electrically connected with the wiring substrate, and then a connection part is sealed with resin (by a post-charging method). In this case, the resin is supplied from a nozzle positioned near a clearance between the semiconductor chip and the wiring substrate, so that the resin fills in the clearance by capillary action.

In the example described in this embodiment, before mounting the logic chip LC (see FIG. 9) over the wiring substrate 20 in the first chip mounting step to be described later, the adhesive material NCL1 is disposed over the chip mounting region 2p1, and the logic chip LC is pressed against and electrically connected with the wiring substrate 20 from above the adhesive material NCL1 (a pre-coating method) to thereby mount the logic chip LC.

In the above post-charging method, the resin is embedded in the clearance by the capillary action, which takes a long processing time (time for charging the resin) to one device region 20a. In contrast, in the above pre-coating method, at the time when the tip of the logic chip LC (solder material 7a formed at the tip of the protruding electrode 7b shown in FIG. 6) comes into contact with the bonding portion of the bonding lead 2f, the adhesive material NCL1 already fills in the clearance between the wiring substrate 20 and the logic chip LC. The pre-coating method is preferable in reducing the processing time for one device region 20a and improving the manufacturing efficiency, as compared to the above post-charging method.

In a modified example of this embodiment, the order of the first chip mounting step and the first adhesive material arrangement step shown in FIG. 13 is reversed, so that the post-charging method can be applied. For example, when there is a small area of product formation regions formed at one time, the use of the post-charging method does not differ so much from the pre-coating method in processing time, and thus can suppress the reduction in manufacturing efficiency.

The adhesive material NCL1 used in the pre-coating method is made of insulating (non-conductive) material (for example, resin) as described above.

The adhesive material NCL1 is made of resin material that is cured (increases its hardness) by being subjected to energy. In this embodiment, the adhesive material NCL1 contains thermosetting resin. The adhesive material NCL1 before being cured is softer than the external terminal 7 shown in FIG. 6, and can be deformed by being pressed by the logic chip LC.

The adhesive materials NCL1 before being cured can be classified into two types based on the difference in handling. One of the adhesive materials is a paste-like resin (insulating paste) called a non-conductive paste (NCP). The resin discharged from the nozzle (not shown) is applied to the chip mounting region 2p1. The other of the adhesive materials is a film-like resin (insulating film) previously molded in the form of film, and which is called a non-conductive film (NCF). The film-like resin is conveyed and bonded to the chip mounting region 2p1 while being in the state of film. The use of the insulating paste (NCP) does not need the step of bonding the insulating film (NCF), and thus can reduce stress on the semiconductor chips or the like as compared to the use of the insulating material film. The use of the insulating film (NCF) has the high shape retaining property as compared to the use of the insulating paste (NCP), which makes it easier to control the range and thickness of the adhesive material NCL1.

In the example shown in FIGS. 19 and 20, the adhesive material NCL1 made of the insulating film (NCF) is arranged at the chip mounting region 2p1, and bonded in intimate contact with the upper surface 2a of the wiring substrate 20. Although not shown, in another modified example, the insulating paste (NCP) can also be used.

In this step, as shown in FIG. 19, the adhesive material NCL1 is preferably arranged not to cover the alignment marks 50a from the viewpoint of improving the light reflection efficiency of the alignment mark 50a. When the adhesive material NCL1 is made of the material that transmits visible light, the alignment marks 50a may be covered with the adhesive material NCL1. In this case, the flexibility in selecting the material for the adhesive material NCL1 is reduced. Thus, the alignment marks 50a are preferably exposed from the adhesive material NCL1.

Since the alignment marks 50a are exposed from the adhesive material NCL1, the alignment marks 50a are preferably positioned in the periphery of the device region 20a.

<First Chip Provision Step>

Figure 21:
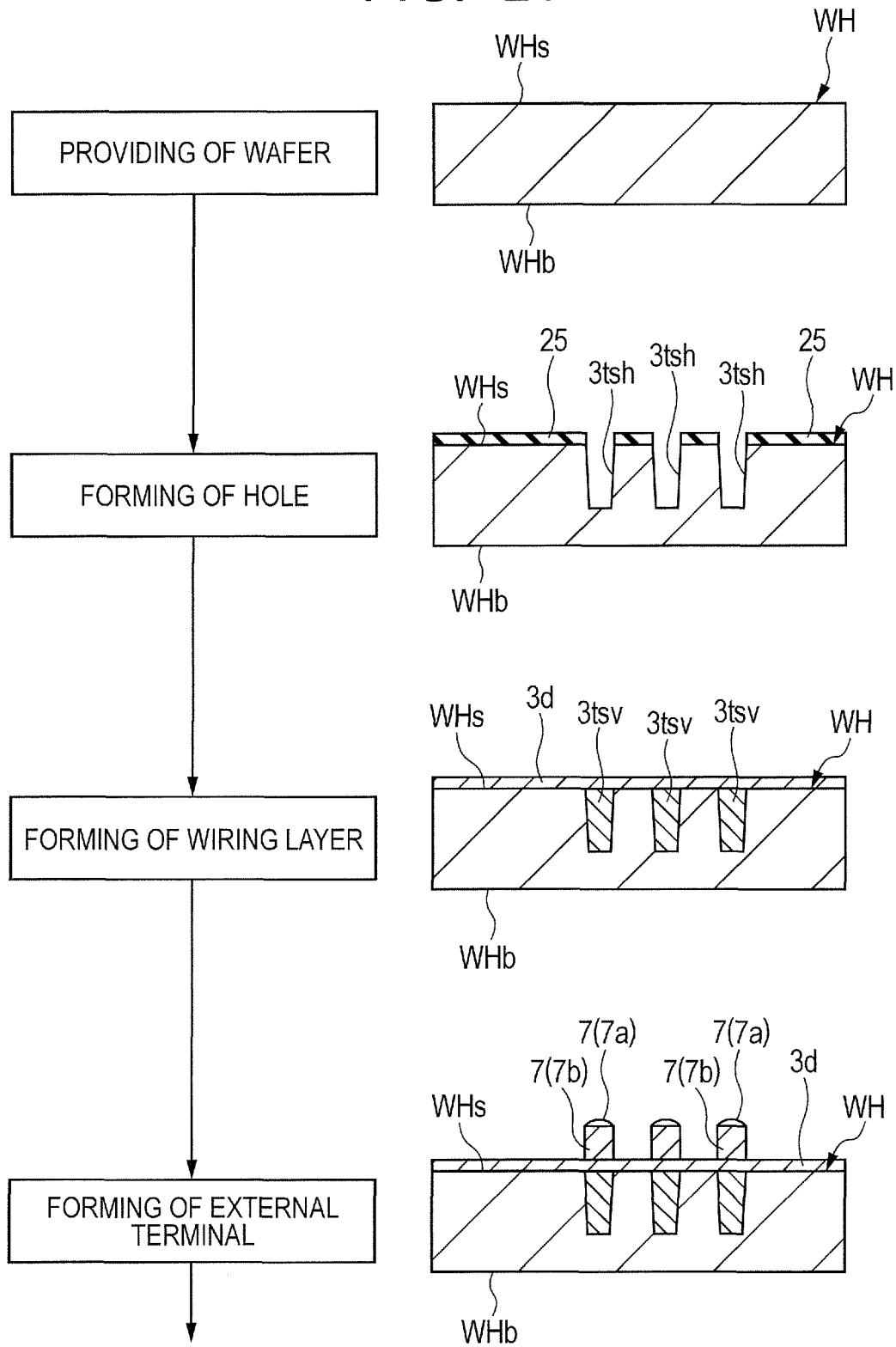
FIG. 21 is an exemplary explanatory diagram showing the outline of a manufacturing process of a semiconductor chip with a penetrating electrode shown in FIG. 6.
Figure 22:
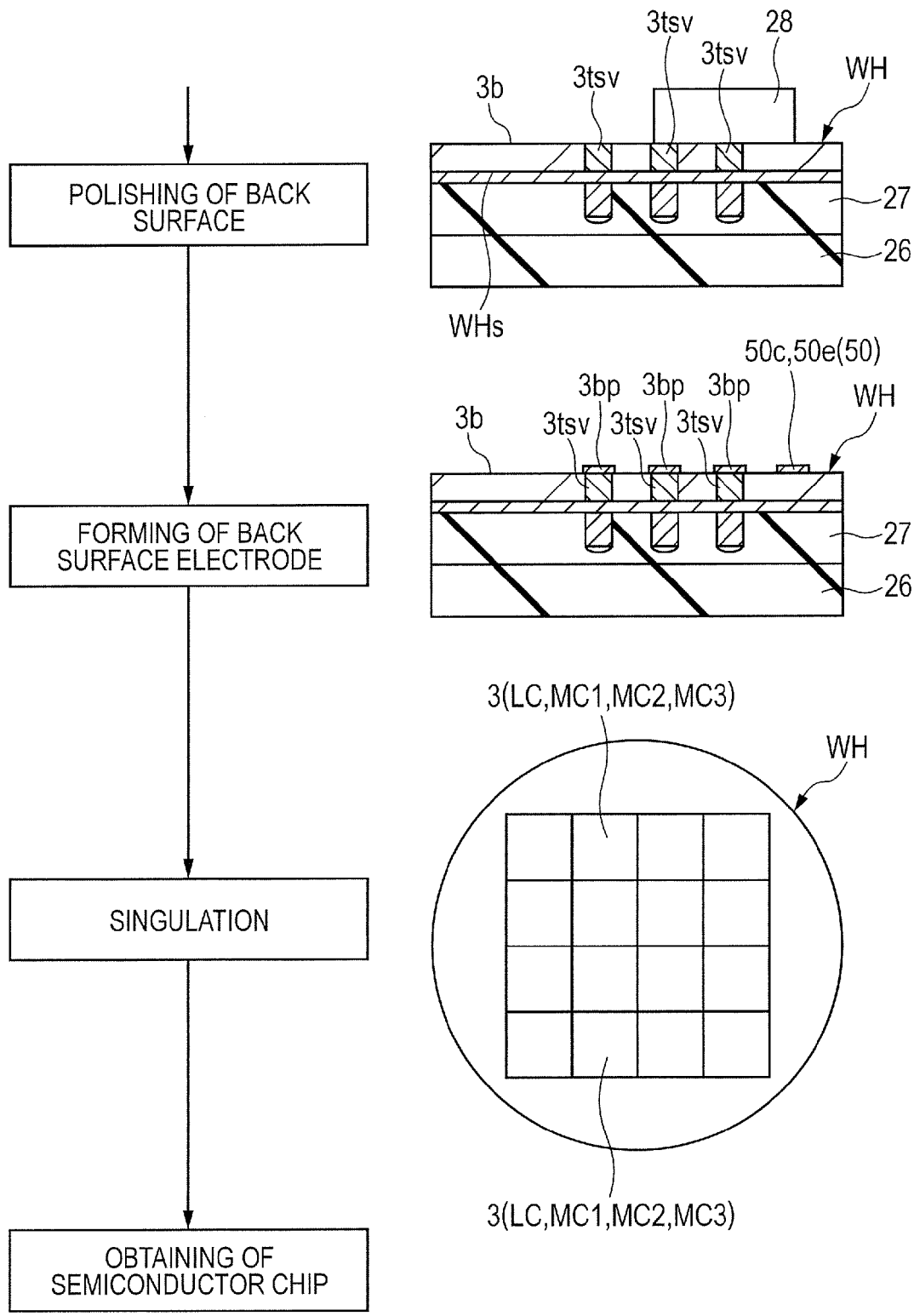
FIG. 22 is an exemplary explanatory diagram showing the outline of another manufacturing process of the semiconductor chip, following the process shown in FIG. 21.

In the first chip provision step shown in FIG. 13, the logic chip LC shown in FIGS. 9 and 10 is provided. FIG. 21 shows an exemplary explanatory diagram of the outline of a manufacturing process of the semiconductor chip with the penetrating electrode shown in FIG. 6. FIG. 22 shows an exemplary explanatory diagram of the outline of another manufacturing process of the semiconductor chip, following the process shown in FIG. 21. Referring to FIGS. 21 and 22, a method for manufacturing the penetrating electrode 3*tsv* and the back surface electrode 3*bp* electrically connected with the penetrating electrode 3*tsv* will be mainly described below. Illustration and description of formation steps of various circuits other than the penetrating electrode 3*tsv* will be omitted. The manufacturing method of the semiconductor chip shown in FIGS. 21 and 22 can also be applied to the manufacturing method of the memory chips MC1, MC2, and MC3 in addition to the logic chip LC shown in FIG. 4.

First, in a wafer provision step, a wafer (semiconductor substrate) WH shown in FIG. 21 is provided. The wafer WH is a semiconductor substrate made of, for example, silicon (Si), and has a circular shape in plan view. The wafer WH has a front surface (main surface, upper surface) WHs as a semiconductor element formation surface, and a back surface (main surface, lower surface) WHb opposite to the front surface WHs. The thickness of the wafer WH is larger than that of each of the logic chip LC and the memory chips MC1, MC2, and MC3 shown in FIG. 4, and is, for example, about several hundreds of μm.

Then, in a hole formation step, holes (bores, openings) 3*tsh* for forming the penetrating electrodes 3*tsv* shown in FIG. 6 are formed. In the example shown in FIG. 21, a mask 25 is arranged over the front surface WHs of the wafer WH, and subjected to etching to thereby form the holes 3*tsh*. The semiconductor elements, including the logic chip LC, and the memory chips MC1, MC2, and MC3 shown in FIG. 4 can be formed, for example, after the present step and before a wiring layer formation step.

Then, metal material, such as copper (Cu), is embedded in the holes 3*tsh* to form the penetrating electrodes 3*tsv*. Next, in the wiring layer formation step, a wiring layer (chip wiring layer) 3*d* is formed over the front surface WHs of the wafer WH. In this step, a plurality of front surface electrodes 3*ap* shown in FIGS. 7 and 9 are formed, whereby the penetrating electrodes 3*tsv* are respectively electrically connected with the front surface electrodes 3*ap*. The front surface electrodes 3*ap* and the uppermost wiring layer 3*d* integrally formed with the front surface electrode 3*ap* are formed of a metal film of, for example, aluminum (Al).

In this step, the semiconductor elements, including the logic chip LC and the memory chips MC1, MC2, and MC3 shown in FIG. 4, are electrically connected with the front surface electrodes 3*ap* shown in FIGS. 7 and 9 via the wiring layer 3*d*. In this way, the electric connection of the semiconductor elements, including the logic chip LC and the memory chips MC1, MC2, and MC3, is established via the wiring layer 3*d*.

In this step, the alignment mark 50*b* shown in FIG. 9 or the alignment mark 50*d* shown in FIG. 7 is formed. The alignment marks 50*b* and 50*d* can be formed of the same material (for example, aluminum) as that of the front surface electrode 3*ap* and the uppermost wiring layer 3*d*. Thus, in forming the front surface electrodes 3*ap*, the marks, front surface electrodes, and uppermost wiring layer can be formed at one time. The details of the alignment mark 50*b* shown in FIG. 9 and the alignment mark 50*d* shown in FIG. 7 will be described later.

Then, in an external terminal formation step, external terminals 7 are formed over the front surface electrodes 3*ap* (see FIGS. 7 and 9). In this step, as shown in FIG. 6, the protruding electrodes 7*b* are formed over the front surface electrodes 3*ap* of the logic chip LC. The solder material 7*a* is formed at the tip of each protruding electrode 7*b*. Alternatively, the solder material 7*a* is formed over each front surface electrode 3*ap* of the memory chip MC1. The solder material 7*a* serves as a bonding material in mounting the semiconductor chip 3 shown in FIG. 6 over the wiring substrate 2 or another lower semiconductor chip 3.

Then, in a back surface polishing step shown in FIG. 22, the back surface WHb (see FIG. 21) of the wafer WH is polished to decrease the thickness of the wafer WH. Thus, the back surface 3*b* of the semiconductor chip 3 shown in FIG. 5 is exposed. In other words, the penetrating electrode 3*tsv* penetrates the wafer WH in the thickness direction. The penetrating electrodes 3*tsv* are exposed from the wafer WH at the back surface 3*b* of the wafer WH. In the example shown in FIG. 22, in the back polishing step, the back surface of the wafer WH is polished by a polishing jig 28 while the wafer WH is being supported by a support base 26, such as a glass plate, and a protective layer 27 for protecting the external terminal 7 protecting the front surface WHs side.

Then, in a back surface electrode formation step, a plurality of back surface electrodes 3*bp* are formed on the back surface 3*b* to be electrically connected with the penetrating electrodes 3*tsv*.

In this step, the alignment marks 50*c* shown in FIG. 10 are formed. Thus, the alignment marks 50*c* can be formed of the same material (for example, copper) as that of the back surface electrode 3*bp*. The alignment marks 50*c* can be formed at one time in forming the back surface electrodes 3*bp*. The details of the alignment mark 50*c* shown in FIG. 10 will be described later.

Then, in a singulating step, the wafer WH is divided along the dicing lines to produce a plurality of semiconductor chips 3. Thereafter, each semiconductor chip is checked if necessary, whereby the semiconductor chips 3 (logic chip LC, and memory chips MC1, MC2, and MC3) shown in FIG. 4 are obtained.

<First Chip Mounting Step>

Figure 23:
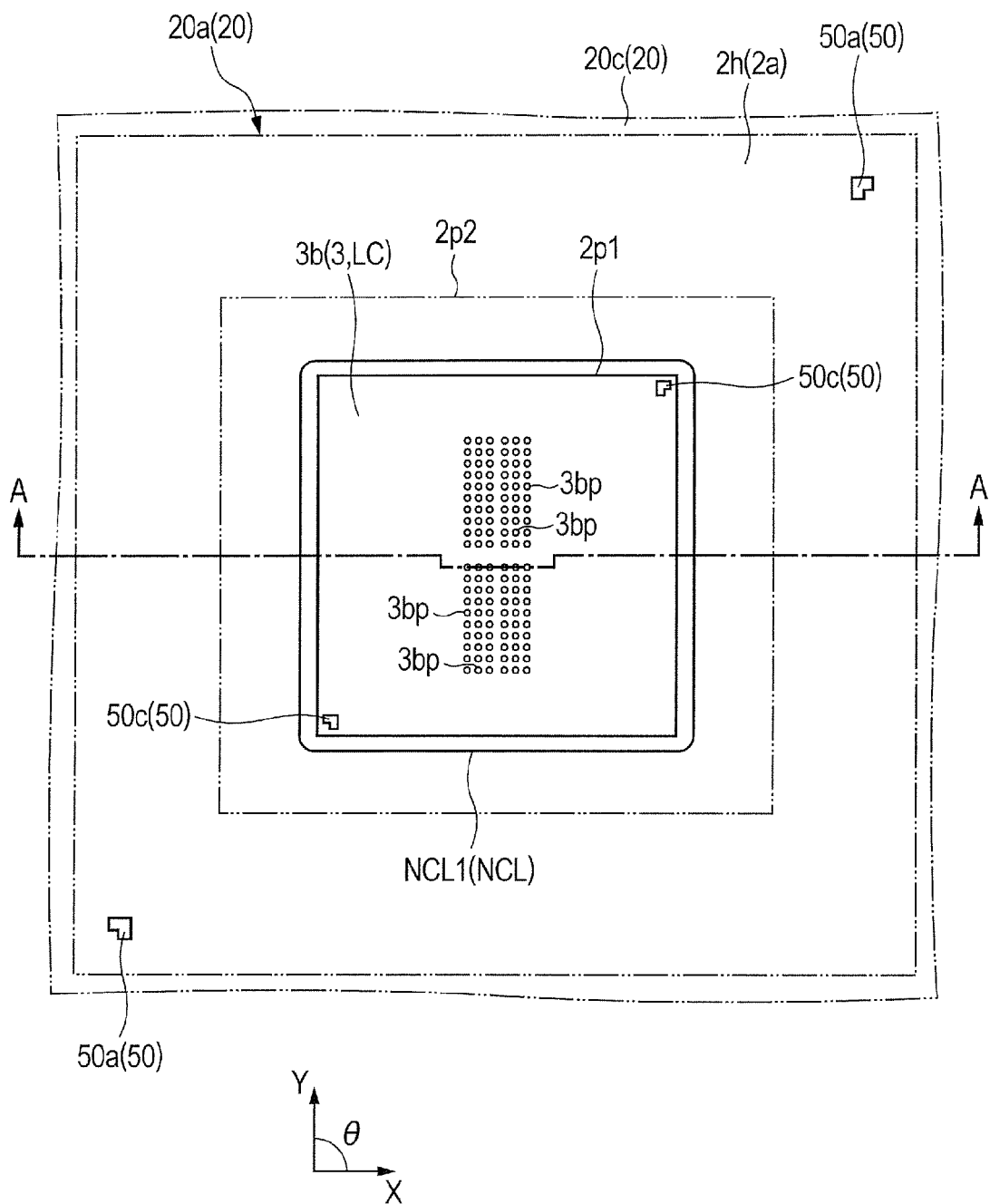
FIG. 23 is an enlarged plan view showing the state of a logic chip LC mounted over the chip mounting region of the wiring substrate shown in FIG. 19.
Figure 24:
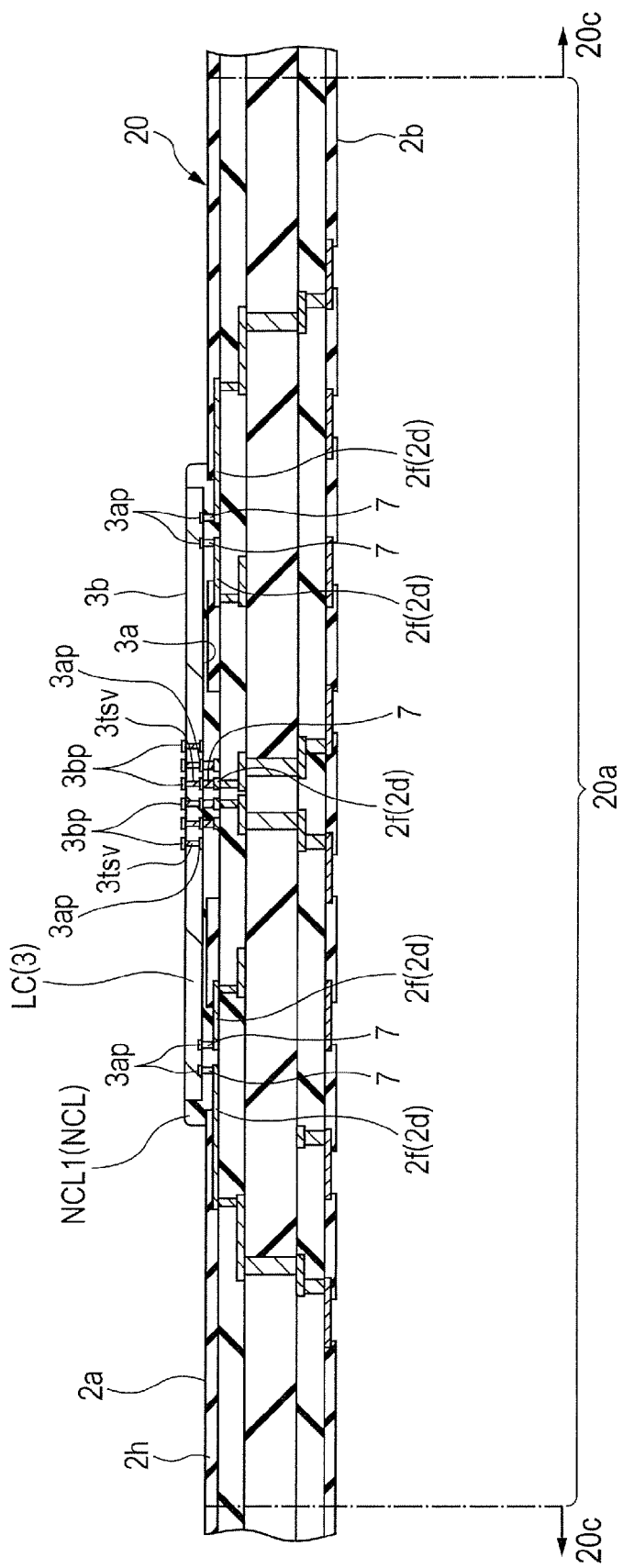
FIG. 24 is an enlarged cross-sectional view taken along the line A-A of FIG. 23.

Next, in a first chip mounting step shown in FIG. 13, as shown in FIGS. 23 and 24, the logic chip LC is mounted over the wiring substrate 20. The first chip conveying step, the first mark detection step, and the first alignment step shown in FIG. 13 can be regarded as sub-steps included in the step of mounting the logic chip LC over the wiring substrate 20. Thus, in this embodiment, the first chip conveying step, the first mark detection step, and the first alignment step are described below as the sub-steps included in the first chip mounting step.

Figure 25:
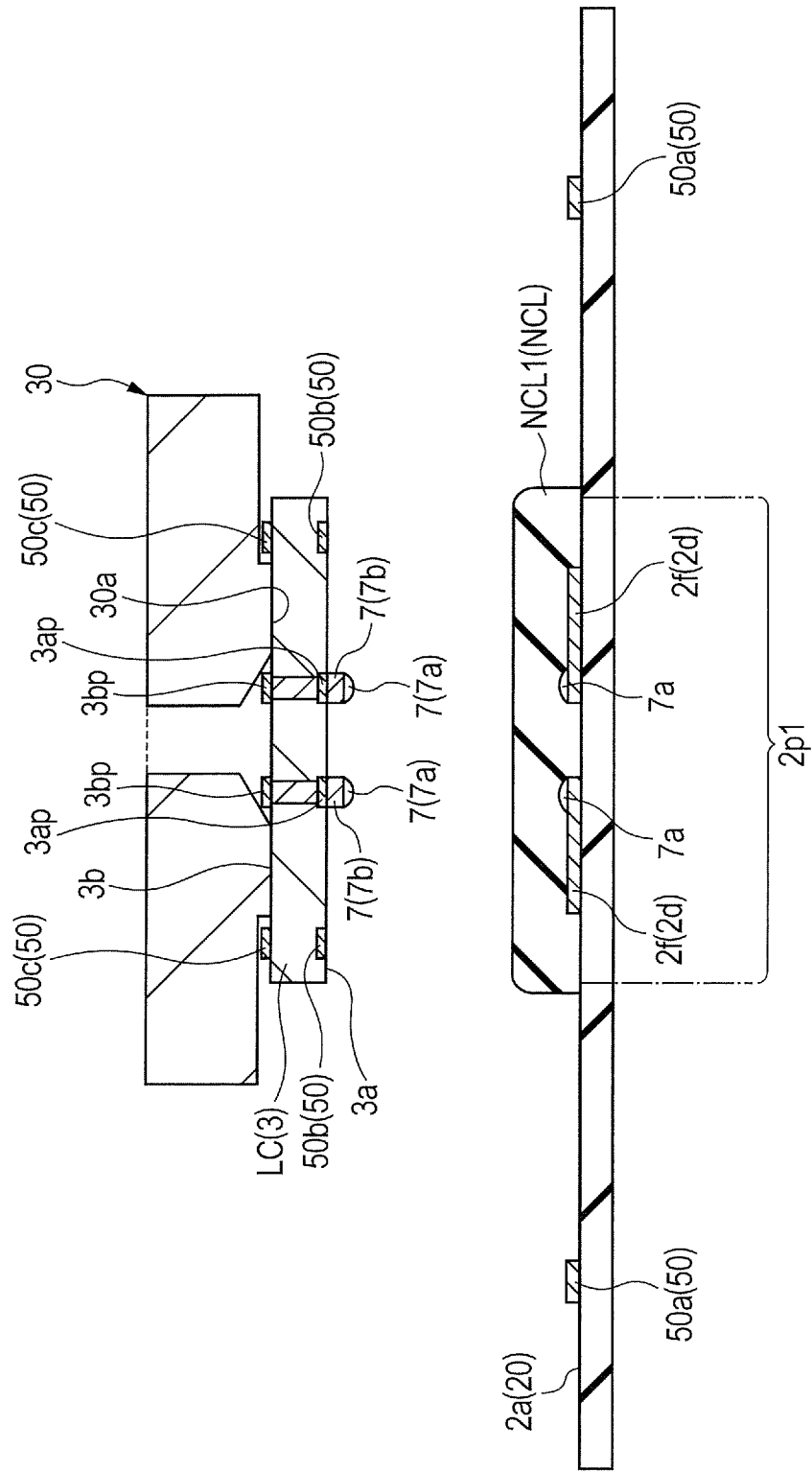
FIG. 25 is an exemplary explanatory diagram showing a main part of a first chip conveying step shown in FIG. 13.
Figure 26:
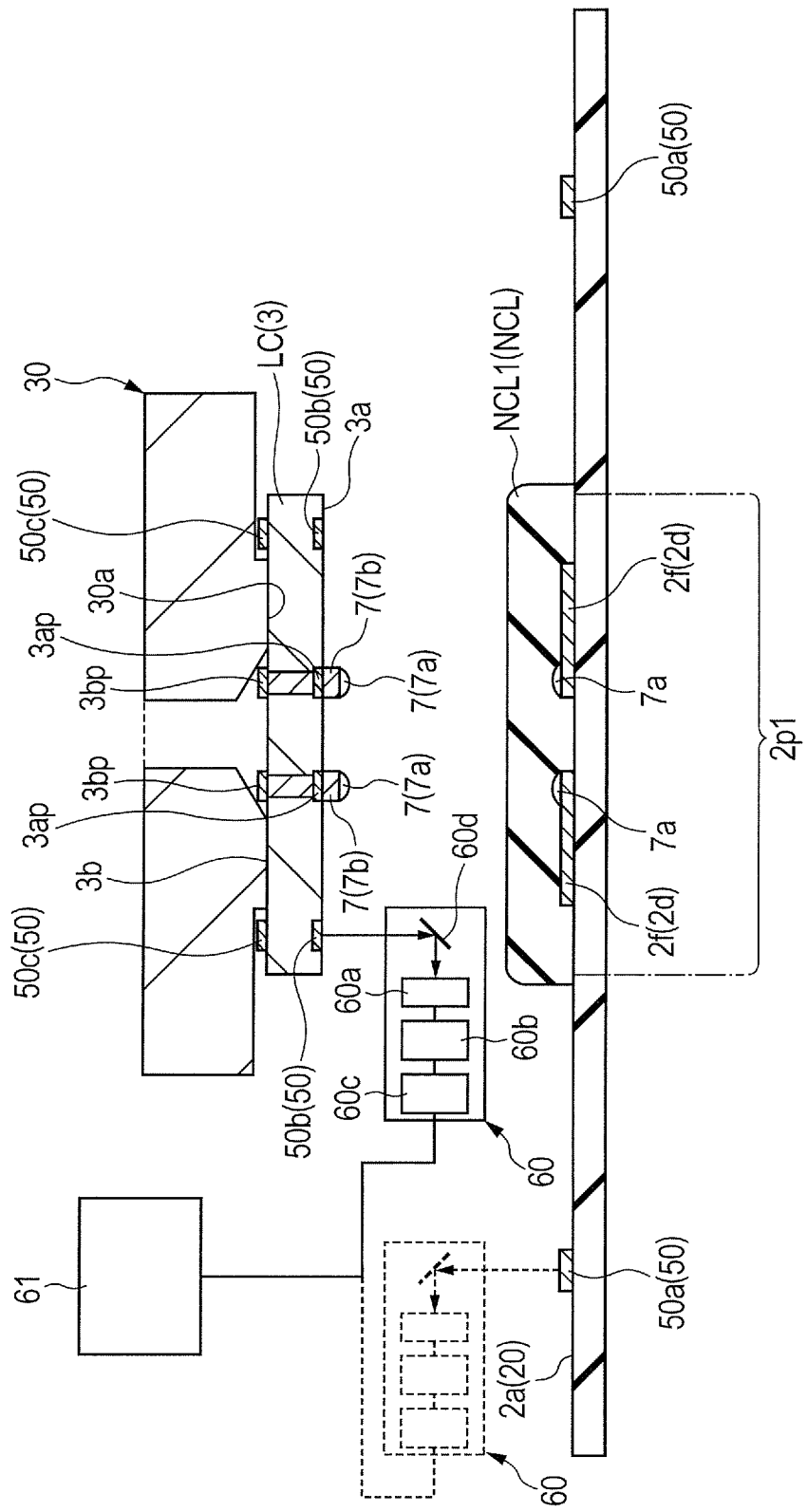
FIG. 26 is an exemplary explanatory diagram showing a main part of a first mark detection step shown in FIG. 13.
Figure 27:
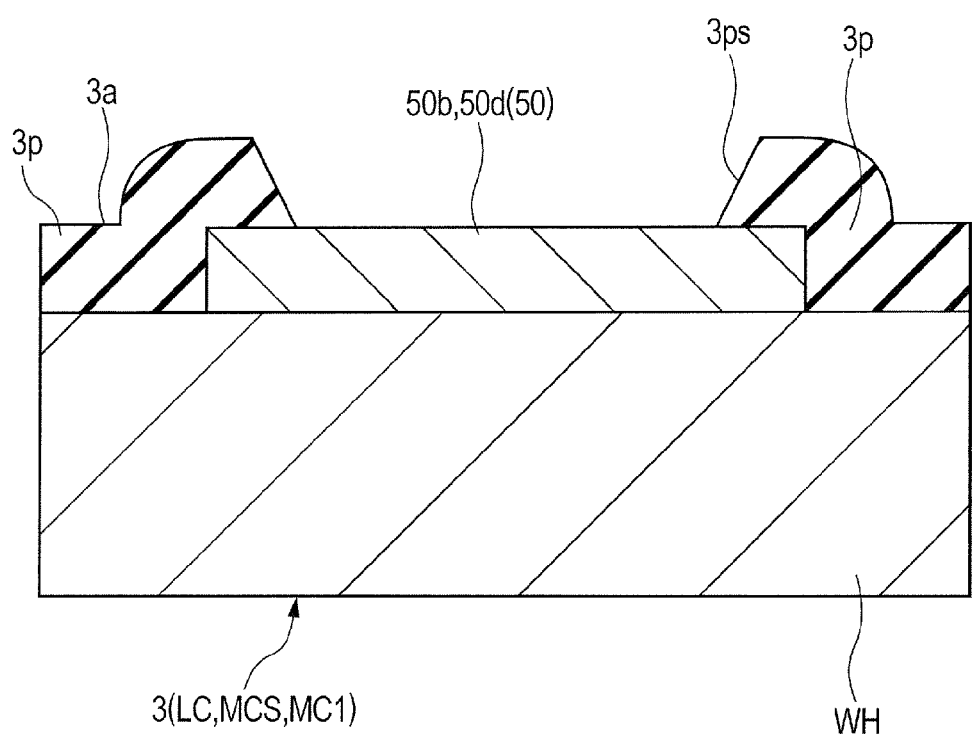
FIG. 27 is an enlarged cross-sectional view showing a main part of a cross-sectional structure of an alignment mark of the logic chip shown in FIG. 26.
Figure 28:
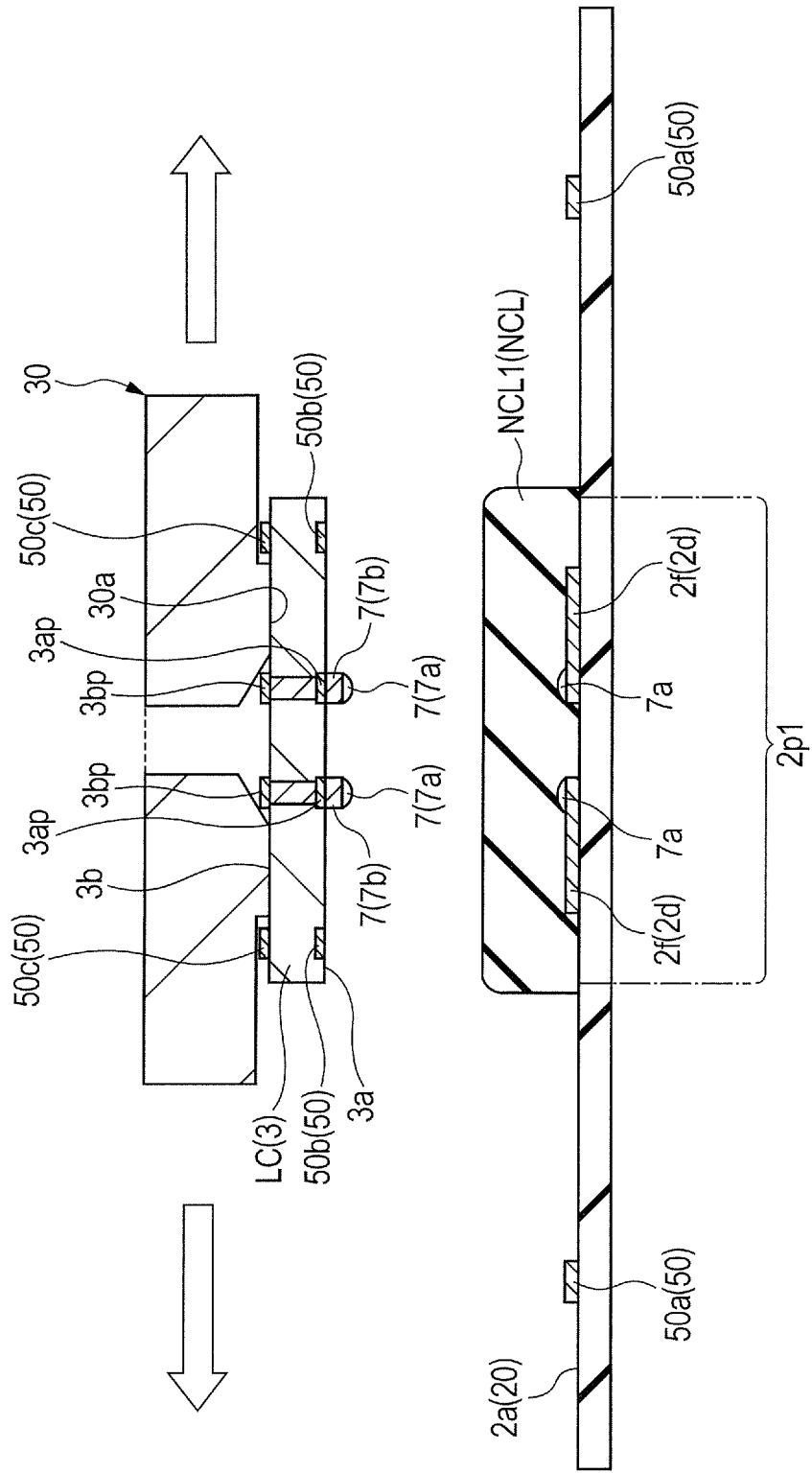
FIG. 28 is an exemplary explanatory diagram showing a main part of a first alignment step shown in FIG. 13.
Figure 29:
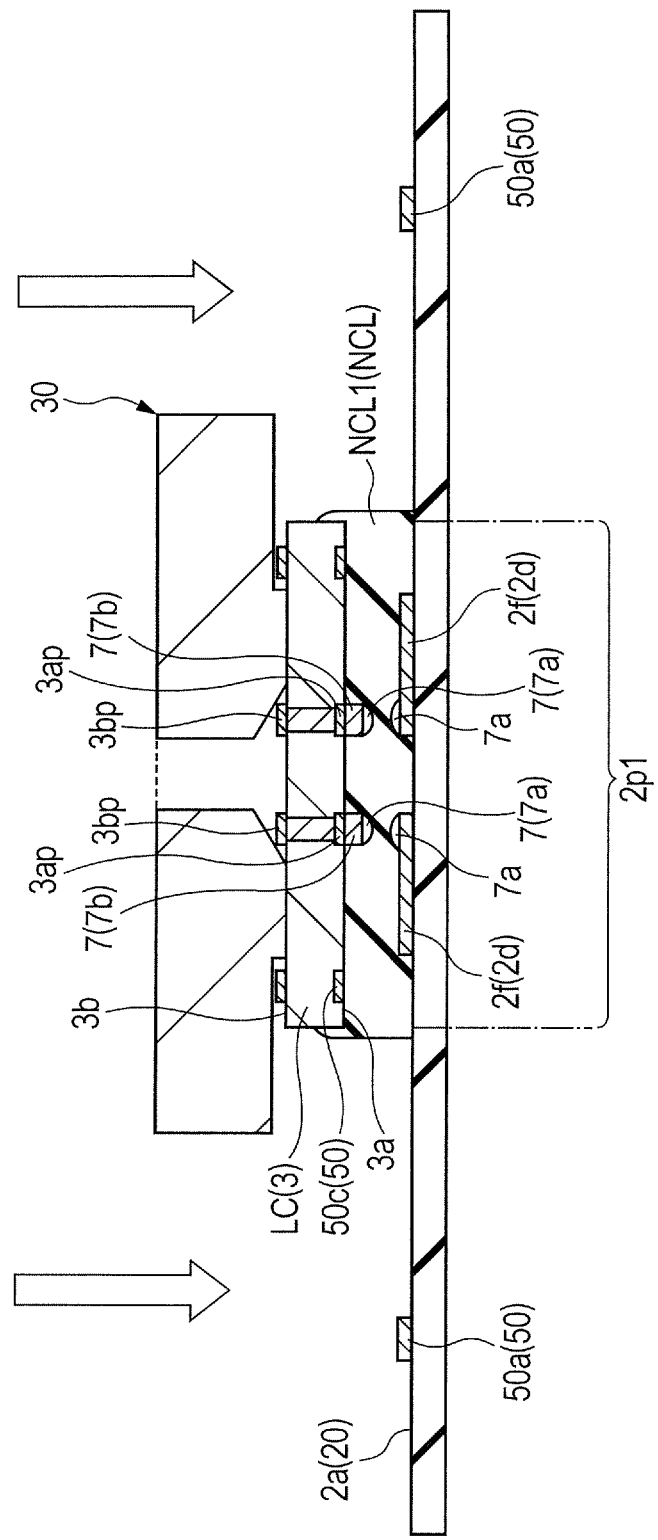
FIG. 29 is an exemplary explanatory diagram showing the state of the logic chip moved to the wiring substrate after the first alignment step shown in FIG. 28.
Figure 30:
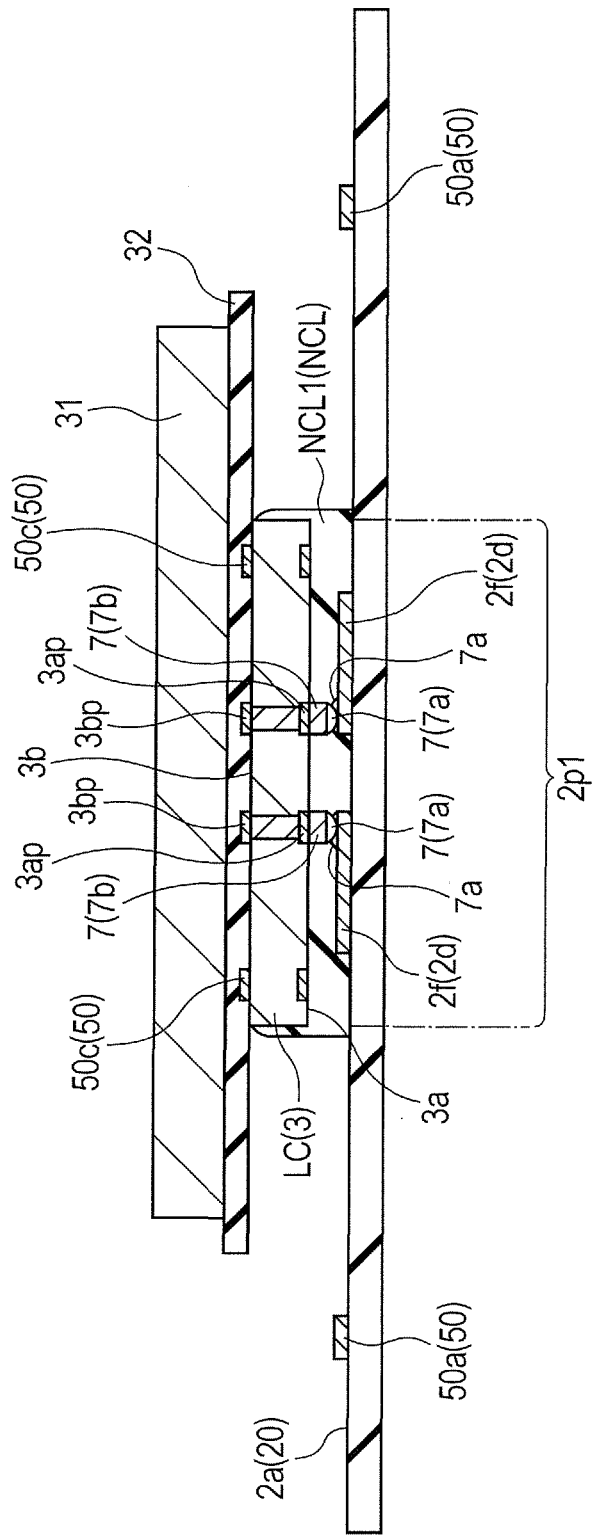
FIG. 30 is an explanatory diagram showing the state of a heating jig pressed against the back surface of the semiconductor chip after removal of a holding jig shown in FIG. 29.

FIG. 23 shows an enlarged plan view of the state of a logic chip LC mounted over the chip mounting region of the wiring substrate shown in FIG. 19. FIG. 24 shows an enlarged cross-sectional view taken along the line A-A of FIG. 23. FIG. 25 shows an exemplary explanatory diagram of a main part of a first chip conveying step shown in FIG. 13. FIG. 26 shows an exemplary explanatory diagram of a main part of a first mark detection step shown in FIG. 13. FIG. 27 shows an enlarged cross-sectional view of a main part of a cross-sectional structure of alignment marks of the logic chip shown in FIG. 26. FIG. 28 shows an exemplary explanatory diagram of a main part of a first alignment step shown in FIG. 13. FIG. 29 shows an exemplary explanatory diagram of the state of the logic chip moved to the wiring substrate after the first alignment step shown in FIG. 28. FIG. 30 shows an explanatory diagram of the state of a heating jig pressed against the back surface of the semiconductor chip after removal of a holding jig shown in FIG. 29.

In this step, as shown in FIG. 24, the logic chip LC is mounted by the so-called face down mounting method (flip-chip bonding method) such that the front surface 3a of the logic chip LC faces the upper surface 2a of the wiring substrate 20. In this step, the logic chip LC is electrically connected with the wiring substrate 20. Specifically, the front surface electrodes 3ap formed on the front surface 3a of the logic chip LC are electrically connected with the bonding leads 2f formed on the upper surface 2a of the wiring substrate 20 via the external terminals 7 (protruding electrode 7b and solder material 7a shown in FIG. 6). The detailed flow of the respective steps will be described below with reference to FIGS. 25 to 30.

As shown in FIG. 25, the first chip mounting step includes a first chip conveying step of arranging the logic chip LC (semiconductor chip 3) over the chip mounting region 2p1 of the wiring substrate 20. The logic chip LC is conveyed to the chip mounting region 2p1 with the back surface 3b being held by a holding jig (collet) 30, and then arranged over the chip mounting region 2p1 (or adhesive material NCL1) such that the front surface 3a positioned on the element formation surface side faces the upper surface 2a of the wiring substrate 20. The holding jig 30 includes a holding surface 30a for sucking and holding the back surface 3b of the logic chip LC. The holding jig 30 conveys the logic chip LC while holding the logic chip LC by the holding surface 30a.

The protruding electrodes 7b are formed on the front surface 3a of the logic chip LC, and the solder material 7a is formed at the tip of each protruding electrode 7b. The solder material 7a serving as a bonding material for electrically connecting with the protruding electrode 7b is previously formed at a bonding portion of the bonding lead 2f formed on the upper surface 2a of the wiring substrate 20.

Since in the first alignment step shown in FIG. 13, the logic chip LC is aligned with the wiring substrate 20 with higher accuracy in this embodiment, the accuracy of the conveying position in the first chip conveying step may be low. In order to improve the positional accuracy in the first alignment step, a movement distance in the first alignment step may be preferably small. For example, in the first chip conveying step, the logic chip LC is preferably arranged over the upper surface 2a of the wiring substrate 20 with the accuracy that causes the logic chip LC to be arranged over the chip mounting region 2p1.

As shown in FIG. 26, the first chip mounting step includes a first mark detection step of detecting (identifying) an alignment mark 50a of the wiring substrate 20 and an alignment mark 50b of the logic chip LC. As shown in FIG. 26, in the first mark detection step, while the logic chip LC being arranged over the wiring substrate 20, a camera (mark position detector, image sensor, imaging device) 60 is arranged between the wiring substrate 20 and the logic chip LC, and then the alignment mark 50a of the wiring substrate 20 and the alignment mark 50b of the logic chip LC are detected (identified).

The camera 60 includes a light receiver 60a for receiving visible light, a photoelectric conversion circuit 60b for converting the light received by the light receiver 60a into an electric signal, and an output circuit 60c for outputting the electric signal converted by the photoelectric conversion circuit to the outside. The camera 60 is electrically connected with a controller 61. An electric signal output from the output circuit 60c is transmitted to an image processing circuit (not shown) included in the controller 61. After image processing is performed, positional data (coordinate data) of the alignment mark (alignment marks 50a, 50b) are output. Positional data defining the positional relationship between the alignment mark 50a and the bonding portion of the bonding lead 2f, or another positional data defining the positional relationship between the alignment mark 50b and the front surface electrode 3ap are input to the controller 61, which can calculate the position of the bonding portion of the bonding lead 2f or the front surface electrode 3ap by the controller 61.

In the example shown in FIG. 26, a visible light reflector (mirror) 60d is provided to reflect the visible light entering from the outside toward the light receiver 60a. The camera 60 is connected with a driving device (not shown), and movably fixed over the wiring substrate 20. Thus, a reflection angle of the visible light reflector 60d is changed and the position of the camera 60 is moved, so that the positions of the alignment marks 50a and 50b can be detected (identified) by the same camera 60.

In the example shown in FIG. 26, the alignment marks 50a are formed over the wiring substrate 20, and the alignment marks 50b are formed over the front surface 3a side of the logic chip LC. In this way, the alignment marks 50 are respectively formed on the wiring substrate 20 and the front surface 3a of the logic chip LC. The positions of the alignment marks 50 are respectively detected, which can provide coordinate data in the plane XY of FIG. 19, and also data on the direction θ indicative of the angle of inclination between the coordinate axes. The use of the coordinate date of the alignment mark 50 and the data on the direction θ can accurately calculate the position of the bonding leads 2f (see FIG. 15) or the position of the front surface electrodes 3ap (see FIG. 9).

As shown in FIG. 19, the alignment marks 50a are arranged at opposite corners such that the marks are positioned on one diagonal line of the device region 20a forming the quadrilateral shape in plan view. As shown in FIG. 9, the alignment marks 50b are arranged at opposite corners such that the marks are positioned on one diagonal line of the front surface 3a forming the quadrilateral in plan view. The alignment marks 50 are arranged at the opposite corners in this way, which can improve the accuracy of the data in the direction θ. As a result, the accuracy of calculation of the positions of the bonding leads 2f (see FIG. 15), or calculation of the positions of the front surface electrode 3ap (see FIG. 9) can be improved.

As shown in FIG. 27, the alignment mark 50b formed in the front surface 3a of the logic chip LC is preferably exposed from the insulating film (protective film, passivation film) 3p formed on the uppermost surface of the logic chip LC. In the example shown in FIG. 27, openings 3ps are formed in the insulating film (protective film, passivation film) 3p formed on the uppermost surface of the logic chip LC. The alignment marks 50b are exposed from the insulating film 3p at the opening 3ps. Referring to FIG. 27, strictly, under the alignment marks 50b, wiring layers are provided to electrically connect a semiconductor element formation surface (main surface) of the semiconductor substrate with the front surface electrodes 3ap (see FIG. 9). FIG. 27 shows only the wafer WH which is a semiconductor substrate while omitting the illustration of the wiring layer.

Like the alignment mark 50a described with reference to FIG. 18, the metal pattern exposed from the insulating film 3p is used as the alignment mark 50b, thereby improving the light reflection efficiency, which lead to the improvement of the position detection accuracy. The contour shape of the alignment mark 50b has only to be identified. When the insulating film 3p is formed of material that can transmit visible light, the alignment mark 50b may be covered with the insulating film 3p.

The alignment mark 50a has just been described above with reference to FIG. 18, and a redundant description thereof will be omitted.

As shown in FIG. 28, the first chip mounting step includes a first alignment step of aligning the wiring substrate 20 with the logic chip LC. As shown in FIG. 28, in the first alignment step, the logic chip LC is relatively moved with respect to the wiring substrate 20 along the upper surface 2a of the wiring substrate 20, so that the bonding portions of the bonding leads 2f face the external terminals 7 formed on the surface 3a of the logic chip LC.

As mentioned above, this embodiment can calculate the positions of the bonding leads 2f and the positions of the front surface electrodes 3ap with high accuracy. Thus, based on the calculated data, the logic chip LC is relatively moved to the wiring substrate 20, which can perform the alignment with high accuracy.

In the example shown in FIG. 28, a method for moving the relative position of the logic chip LC and the wiring substrate 20 involves moving the holding jig 30 holding the logic chip LC along the upper surface 2a of the wiring substrate 20 as indicated by the arrow of FIG. 28. The relative positional relationship between the logic chip LC and the wiring substrate 20 has only to be changed. Thus, one or both of the logic chip LC and the wiring substrate 20 can be moved.

Then, as shown in FIG. 29, the logic chip LC is moved toward the wiring substrate 20. At this time, the adhesive material NCL1 is arranged over the wiring substrate 20 in its soft state before heating to cure. Thus, the front surface 3a side of the logic chip LC is filled with the adhesive material NCL1. In the example shown in FIG. 29, the alignment mark 50b formed on the front surface 3a side of the logic chip LC is covered with the adhesive material NCL1. The step of detecting the alignment mark 50b (first mark detection step) is already completed, which does not cause any problem.

In the above first alignment step, the relative position of the logic chip LC and the wiring substrate 20 is aligned with each other with high accuracy. When the logic chip LC is linearly moved along the wiring substrate 20, the bonding portions of the bonding leads 2f can be kept opposite to the external terminals 7 formed on the surface 3a of the logic chip LC.

Then, as shown in FIG. 30, the logic chip LC is pressed against the wiring substrate 20 by pushing the heating jig 31 to the back surface 3b of the logic chip LC. As mentioned above, since the adhesive material NCL1 is in its soft state before curing, the logic chip LC is pushed into by the heating jig 31, so that the logic chip LC approaches the wiring substrate 20. When the logic chip LC approaches the wiring substrate 20, the tip (specifically, solder material 7a) of each external terminal 7 formed on the front surface 3a of the logic chip LC comes into contact with the corresponding bonding region of the bonding lead 2f (specifically, solder material 7a).

The thickness of the adhesive material NCL1 is larger than at least the total of the height (height of a protruding part) of the external terminal 7 and the thickness of the bonding lead 2f. When pushed by the heating jig 31, the part of the front surface 3a side of the logic chip LC is embedded in the adhesive material NCL1. In other words, at least a part of the front surface 3a of the side surface of the logic chip LC is embedded in the adhesive material NCL1.

The alignment marks 50c and the back surface electrodes 3bp are formed at the logic chip LC. It is necessary to prevent the alignment marks 50c and back surface electrode 3bp from being covered by the adhesive material NCL1 coming around to the back surface 3b side. As shown in FIG. 30, a member (low elastic member), for example, a resin film (film) 32, which is softer than the heating jig 31 and the logic chip LC, preferably intervenes in between the heating jig 31 and the logic chip LC to cover the back surface 3b of the logic chip LC with the resin film 32. By pressing the logic chip LC via the resin film 32, the resin film 32 comes into intimate contact with the back surface 3b of the logic chip LC. Even though the adhesive material NCL1 is thick, the NCL1 can be prevented from coming around to the back surface 3b of the logic chip LC. The resin film 32 of this embodiment is made of, for example, fluorine resin.

Then, as shown in FIG. 30, the logic chip LC and the adhesive material NCL1 are heated by the heating jig (heat source) 31 while pushing the heating jig 31 to the logic chip LC. In the bonding portion between the logic chip LC and the wiring substrate 20, the solder material 7a on the bonding lead 2f side and the solder material 7a on the external terminal side are respectively melted and integral with each other into a bonding material electrically connecting the external terminal 7 with the bonding lead 2f. That is, the logic chip LC is heated by the heating jig (heat source) 31, so that the protruding electrodes 7b are electrically connected with the bonding leads 2f via the solder material 7a.

The adhesive material NCL1 is heated to be cured. As a result, the cured adhesive material NCL1 is obtained with a part of the logic chip LC embedded in the adhesive material. The alignment marks 50c and the back surface electrodes 3bp of the logic chip LC are covered by the resin film 32, and exposed from the cured adhesive material NCL1. The adhesive material NCL1 is not necessarily cured completely by the heat from the heating jig (heat source) 31. In another embodiment, after curing (temporarily curing) a part of the thermosetting resin contained in the adhesive material NCL1 to such an extent that can fix the logic chip LC, the wiring substrate 20 is transferred to a heating furnace (not shown), and then the remainder of the thermosetting resin can be cured (fully cured). It takes some time to complete the full curing process for fully curing the entire thermosetting resin contained in the adhesive material NCL1. However, the full curing process can be performed in the heating furnace to improve the manufacturing efficiency.

<Second Adhesive Material Arrangement Step>

Figure 31:
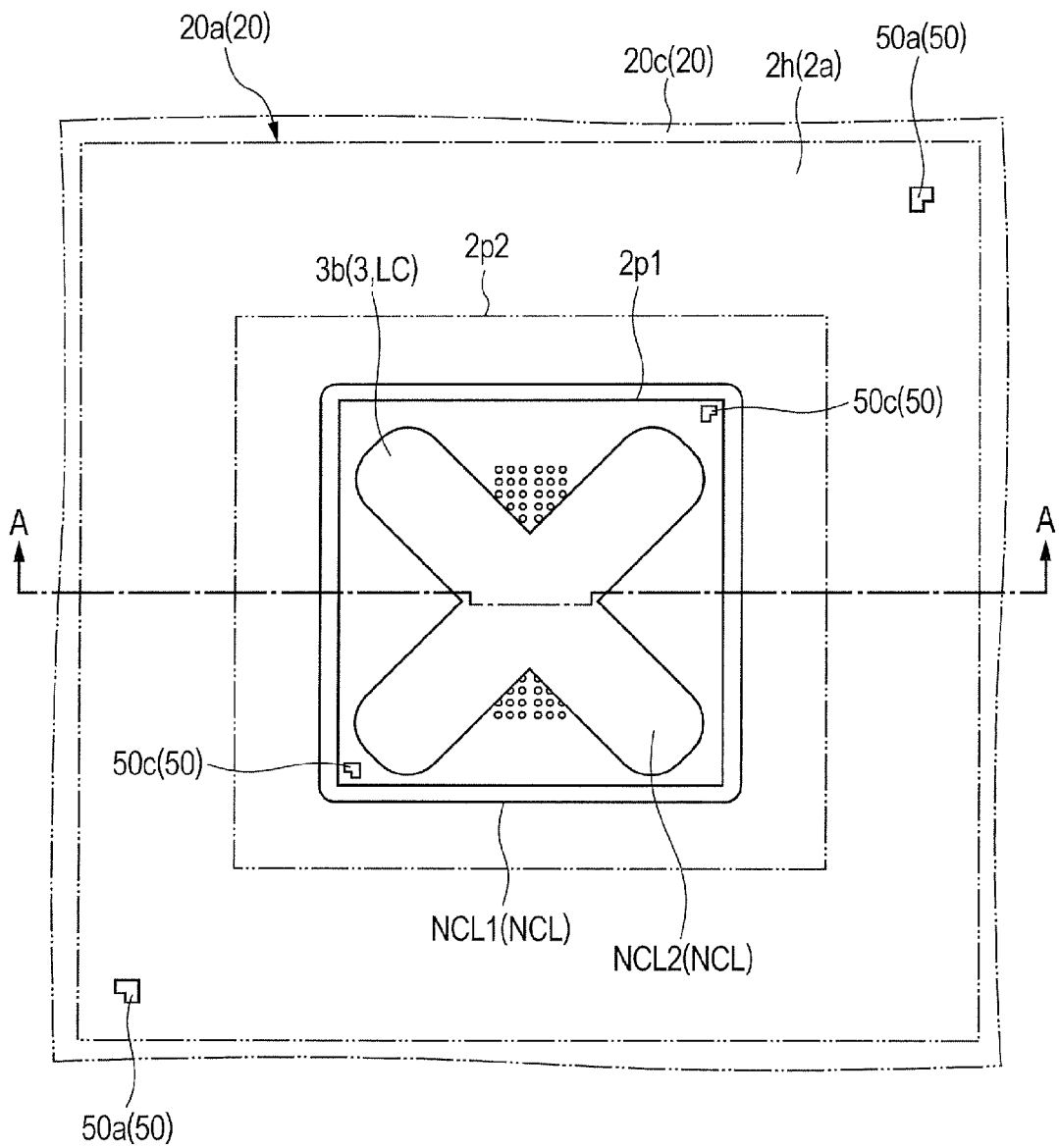
FIG. 31 is an enlarged plan view showing the state of the adhesive material arranged at the back surface of the semiconductor chip and its surroundings shown in FIG. 20.
Figure 32:
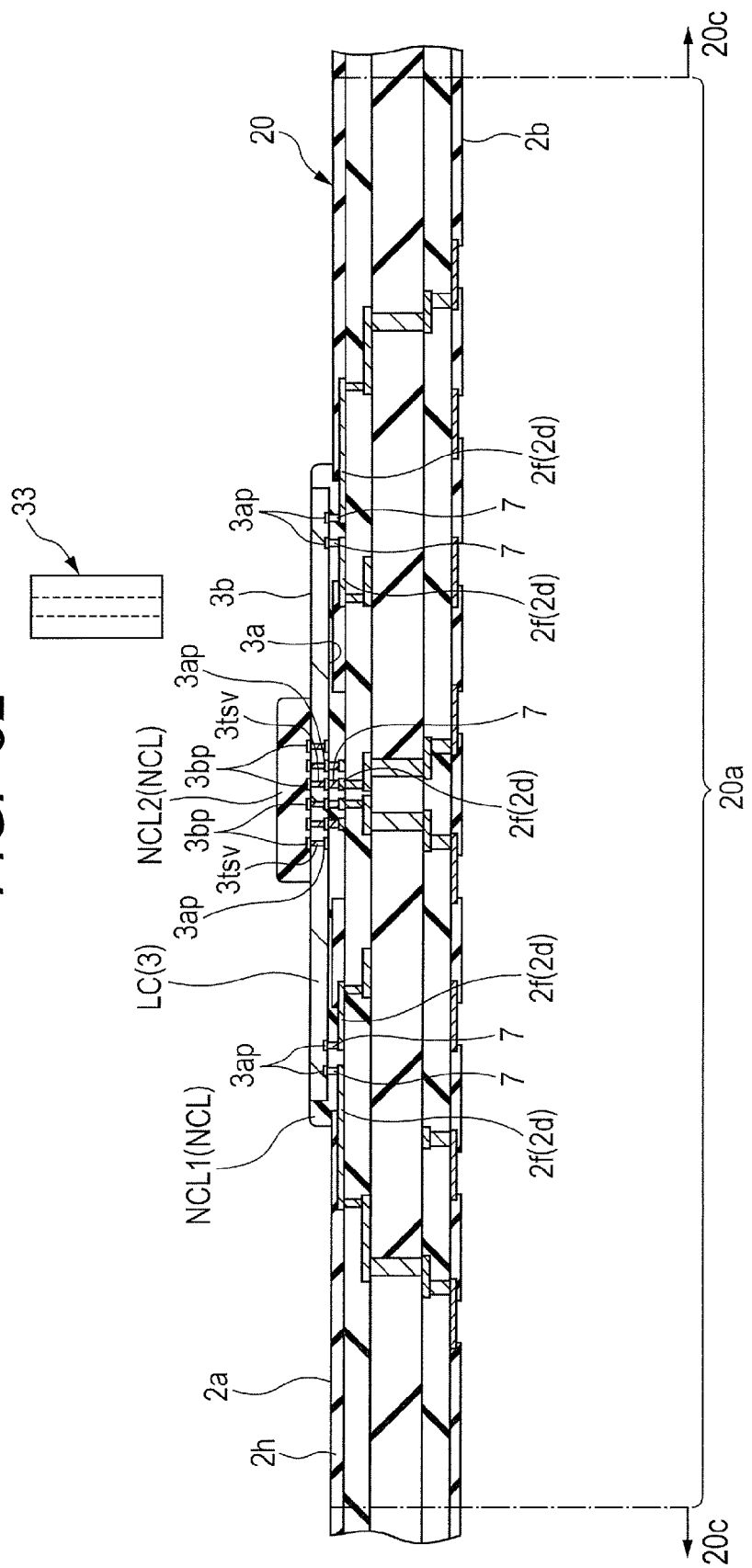
FIG. 32 is an enlarged cross-sectional view taken along the line A-A of FIG. 31.

Next, in a second adhesive material arrangement step shown in FIG. 13, as shown in FIG. 31, the adhesive material NCL2 is arranged at the back surface 3b of the logic chip LC (semiconductor chip 3). FIG. 31 shows an enlarged plan view of the state of the adhesive material arranged at the back surface of the semiconductor chip shown in FIG. 20 and its surroundings. FIG. 32 shows an enlarged cross-sectional view taken along the line A-A of FIG. 31.

As shown in FIG. 6, in the semiconductor device 1 of this embodiment, the logic chip LC mounted at the lowermost level (for example, at the first level) and the memory chip MC1 mounted at the second level from the bottom among the stacked semiconductor chips 3 are mounted by the face down mounting method (flip-chip bonding). Thus, as described in the above first adhesive material arrangement step, the use of the above-mentioned pre-coating method is preferable in that the processing time for one device region 20a (see FIGS. 31 and 32) can reduced to improve the manufacturing efficiency.

The adhesive material NCL2 to be used in the pre-coating method is made of insulating (non-conductive) material (for example, resin material) as described above. The adhesive material NCL2 is made of resin that will be cured (increase its hardness) by being supplied with the energy. In this embodiment, the adhesive material NCL2 includes, for example, thermosetting resin. The adhesive material NCL2 before being cured is softer than the protruding electrode 7b shown in FIG. 6, and is deformed by being pressed against the logic chip LC.

The adhesive materials NCL2 before being cured can be classified into two types based on the difference in handling, namely, a paste-like resin (insulating paste) called the NCP, and a film-like resin (insulating film) previously molded in the shape of film and called the NCF. The adhesive material NCL2 used in this step can employ either the NCP or the NCF. In the example shown in FIGS. 31 and 32, the NCP is discharged from a nozzle 33 (see FIG. 32), so that the adhesive material NCL2 is arranged over the back surface 3b of the logic chip LC.

The pre-coating method is common to the post-charging method explained in the description of the first adhesive material arrangement step, in that the paste-like adhesive material NCL2 is discharged from the nozzle 33. In this embodiment, before mounting the memory chip MC1 as shown in FIG. 4, the adhesive material NCL2 is mounted in advance. The coating rate of the adhesive material NCL2 can be greatly increased as compared to the post-charging method of charging the resin using the capillary action.

As shown in FIG. 31, the alignment marks 50c formed on the back surface of the logic chip LC each are an object of interest to be detected in the second mark detection step shown in FIG. 13, and the adhesive material NCL2 is preferably arranged so as to expose the alignment marks 50c. When the adhesive material NCL2 is formed of transparent or semi-transparent material to the visible light, the position of even the alignment mark 50c covered by the adhesive material NCL2 can be detected. From improving the flexibility in selecting material, as shown in FIG. 31, the adhesive material NCL2 is preferably arranged so as to expose the alignment marks 50c. The insulating paste (NCP) can decrease the area of the adhesive material arranged as compared to the insulating film (NCF), thus making it easy to expose the alignment mark 50c.

The adhesive material NCL2 has the function of bonding and fixing the memory chip MC1 (see FIG. 4) to the logic chip LC (see FIG. 4) in the second chip mounting step shown in FIG. 13. The adhesive material NCL2 also has the function of sealing the bonding portion between the memory chip MC1 and the logic chip LC. The sealing function includes a stress release function of diffusing and releasing the stress transferred to the bonding portion between the memory chip MC1 and the logic chip LC to protect the bonding portion.

In order to satisfy the above sealing function, the adhesive material NCL2 is preferably arranged to surround the bonding portion between the memory chip MC1 and the logic chip LC. For this reason, upon mounting at least the memory chip MC1, the external terminals 7 shown in FIG. 6 are preferably sealed with the adhesive material NCL2.

<Second Chip Provision Step>

In the second chip provision step shown in FIG. 13, the laminated body MCS with the memory chips MC1, MC2, MC3, and MC4 shown in FIG. 4 is provided. In a modified example of this embodiment, the memory chips MC1, MC2, MC3, and MC4 are stacked in turn over the logic chip LC. In this embodiment to be describe later, the memory chips MC1, MC2, MC3, and MC4 are previously stacked to form the laminated body (memory chip laminated body, semiconductor chip laminated body) MCS shown in FIG. 34. As will be described later, the formation of the laminated body MCS with the memory chips MC1, MC2, MC3, and MC4 can be independently performed from the other steps in a place different from those for steps other than the second chip provision step shown in FIG. 13. For example, the laminated body MCS can be provided as a purchased part. This way can advantageously simplify the assembly process shown in FIG. 13 to improve the manufacturing efficiency as a whole.

Figure 33:
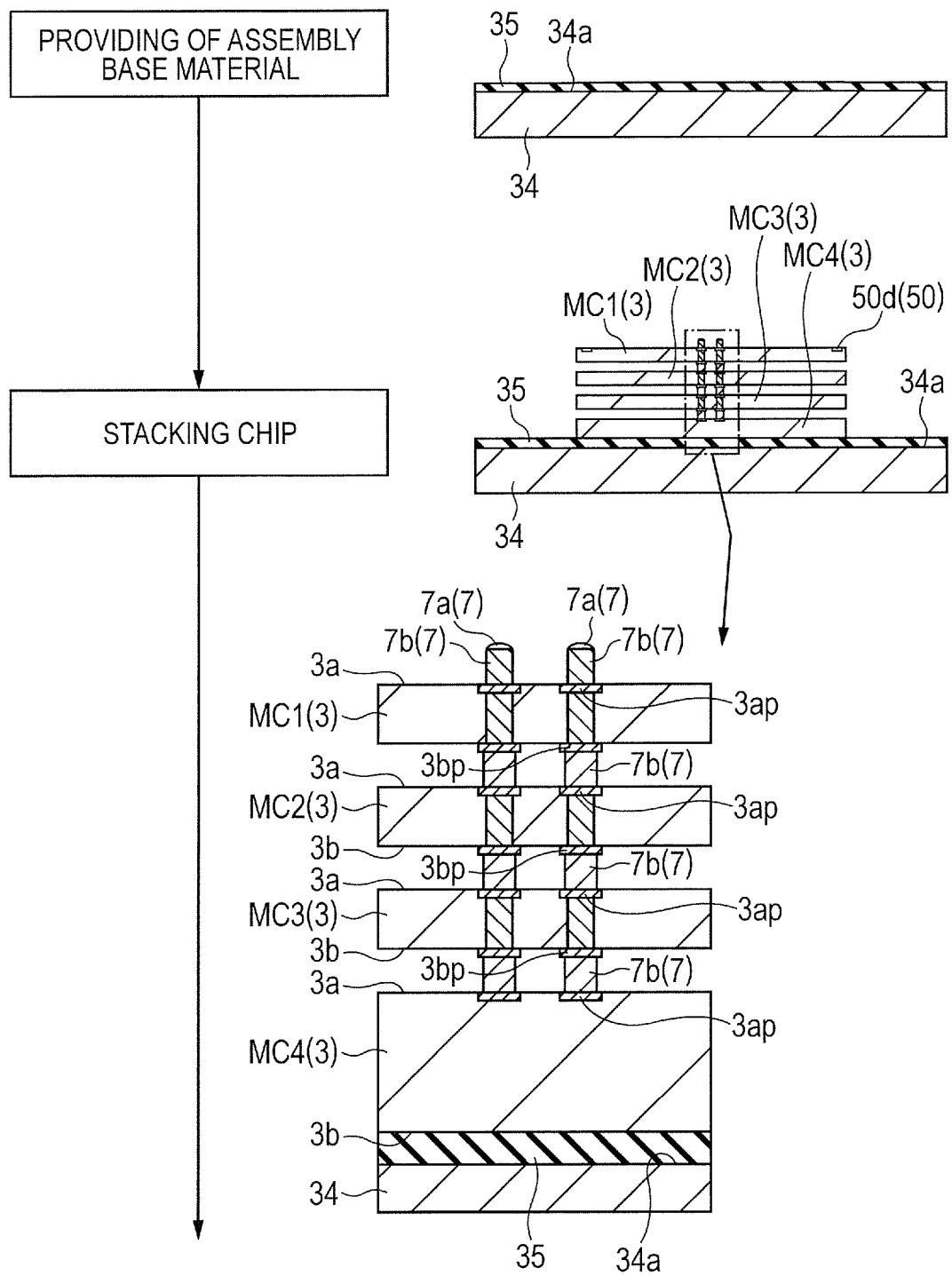
FIG. 33 is an exemplary explanatory diagram showing the outline of an assembly process of a laminated body of the memory chips shown in FIG. 4.
Figure 34:
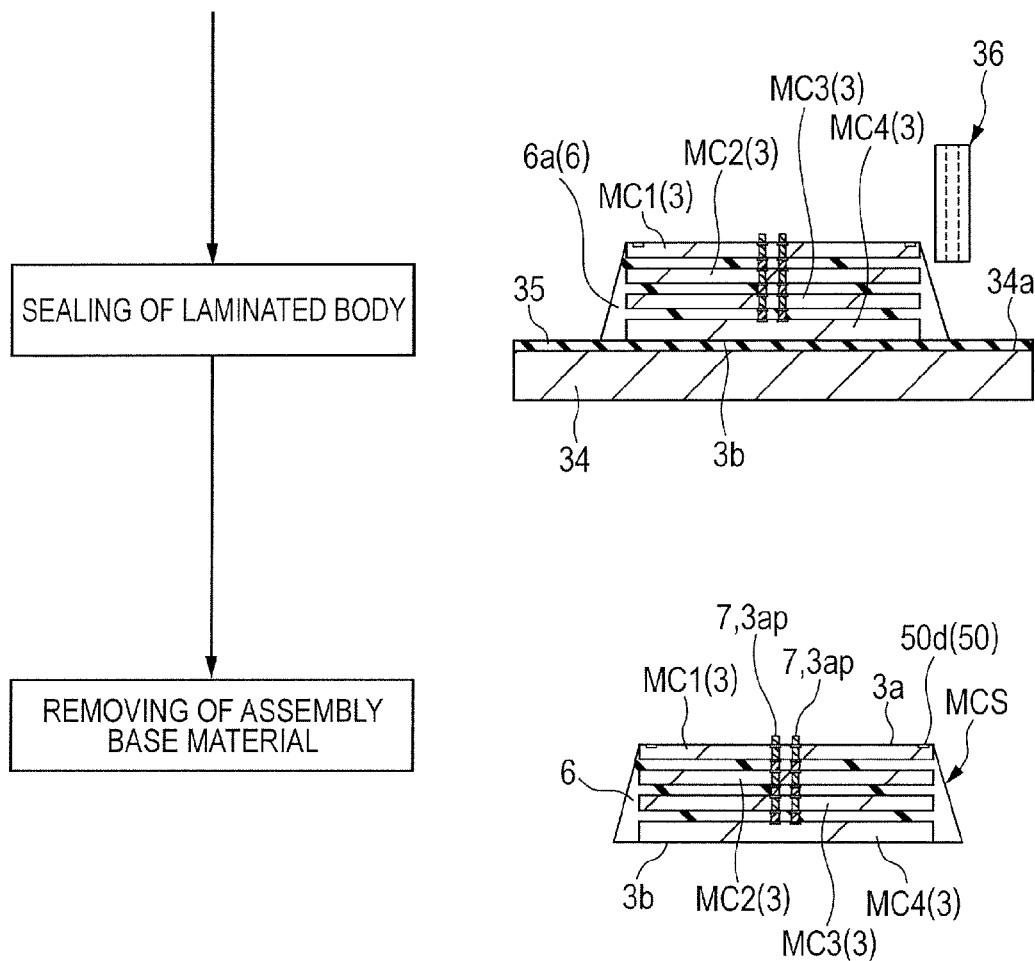
FIG. 34 is an exemplary explanatory diagram showing the outline of another assembly process of the laminated body of the memory chips, following the process shown in FIG. 33.

FIG. 33 shows an exemplary explanatory diagram of the outline of an assembly process of a laminated body of the memory chips shown in FIG. 4. FIG. 34 shows an exemplary explanatory diagram of the outline of another assembly process of the laminated body of the memory chips, following the process shown in FIG. 33. The manufacturing method of each of the memory chips MC1, MC2, MC3, and MC4 shown in FIGS. 33 and 34 can be performed by employing the manufacturing method of the semiconductor chip described with reference to FIGS. 21 and 22, and thus a description thereof will be omitted below.

In an assembly base provision step, a base (assembly base) 34 for assembling the laminated body MCS shown in FIG. 34 is prepared. The base 34 has an assembly surface 34a over which the memory chips MC1, MC2, MC3, and MC4 are stacked. The assembly surface 34a is provided with an adhesive material layer 35.

Then, in the chip stacking step, the memory chips MC1, MC2, MC3, and MC4 are stacked over the assembly surface 34a of the base 34. In the example shown in FIG. 33, the memory chips MC4, MC3, MC2, and MC1 are stacked in that order over the assembly surface 34a of the base 34 such that the back surface 3b of each semiconductor chip to be stacked faces the assembly surface 34a of the base 34. The back surface electrode 3bp of the upper semiconductor chip 3 is connected with the front surface electrode 3ap of the lower semiconductor chip 3, for example, via the external terminals 7 (solder material 7a). The front surface electrodes 3ap of the memory chip MC1 disposed at the uppermost level are provided with the alignment marks 50d as shown in FIG. 7.

Then, in a laminated body sealing step shown in FIG. 34, resin (underfill resin) is supplied to between the stacked semiconductor chips 3 to thereby form a seal member (seal member for a laminated body of chips, or resin for a laminated body of chips) 6. The seal member 6 is formed by the post-charging method, which has been explained above in the description of the first adhesive material arrangement step. Specifically, after previously stacking the semiconductor chips 3, an underfill resin 6a is supplied from the nozzle 36, and fills in between the stacked semiconductor chips 3. The underfill resin 6a has a lower viscosity than that of resin for sealing used in the sealing step shown in FIG. 13. The underfill resin 6a can fill in between the semiconductor chips 3 by the capillary action. Thereafter, the underfill resin 6a embedded in between the semiconductor chips 3 are cured to thereby obtain the seal member 6.

The method for forming the seal member 6 by the post-charging method is excellent in filling in a clearance as compared to the so-called transfer mold method, and can be effectively applied to the case where a clearance between the stacked semiconductor chips 3 is narrow. As shown in FIG. 34, when the clearances to be filled with the underfill resin 6a are stacked in layers, the underfill resin 6a can collectively fill in all the clearances at one time. This can reduce the whole processing time.

Then, in an assembly base removal step, the base 34 and the adhesive material layer 35 are peeled off and removed from the back surface 3b of the memory chip MC4. The method for removing the base 34 and the adhesive material layer 35 can be performed, for example, by using a method which involves curing a resin component (for example, ultraviolet curing resin) contained in the adhesive material layer 35. Through the above steps, the memory chips MC1, MC2, MC3, and MC4 are stacked with the connection portions between the memory chips MC1, MC2, MC3, and MC4 sealed with the seal member 6, which produces the laminated body MCS. The laminated body MCS can be regarded as one memory chip having one front surface 3a (corresponding to the front surface 3a of the memory chip MC1) with the front surface electrodes 3ap formed thereat, and the other back surface 3b (corresponding to the back surface 3b of the memory chip MC4) opposite to the front surface 3a.

<Second Chip Mounting Step>

Figure 35:
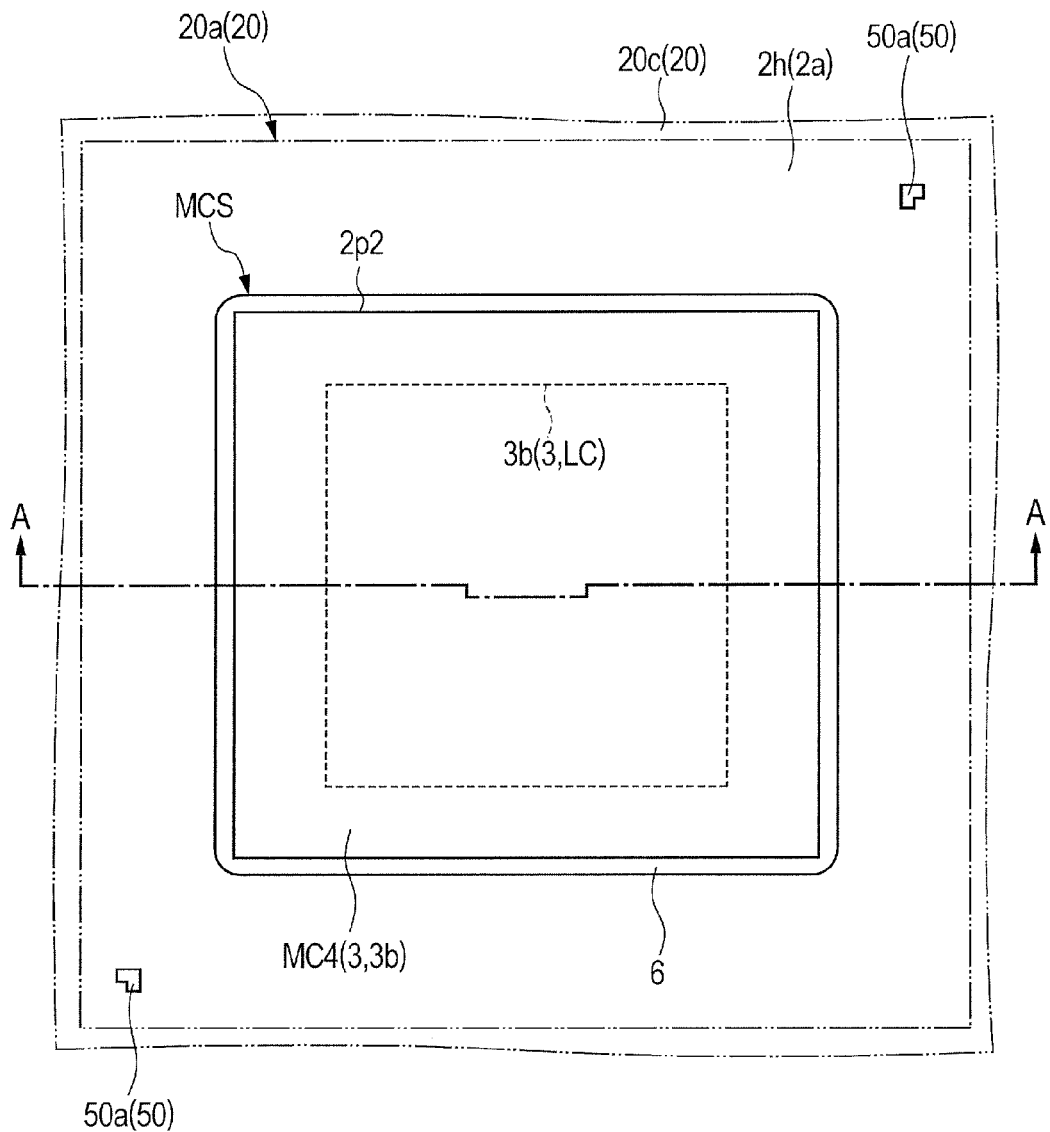
FIG. 35 is an enlarged plan view showing the state of the laminated body mounted over the back surface of the logic chip shown in FIG. 31.
Figure 36:
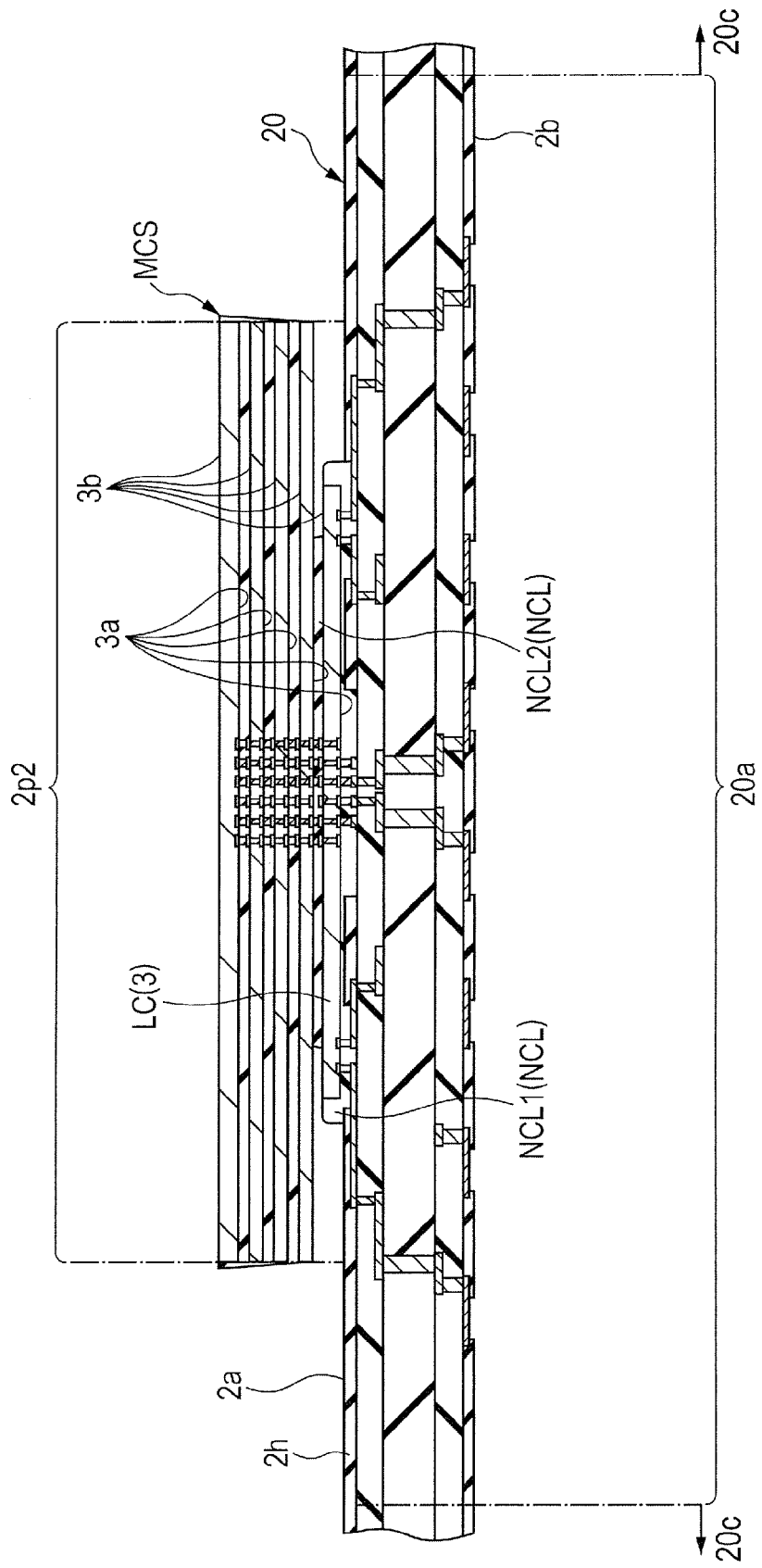
FIG. 36 is an enlarged cross-sectional view taken along the line A-A of FIG. 35.

Next, in a second chip mounting step shown in FIG. 13, as shown in FIGS. 35 and 36, the laminated body MCS is mounted over the back surface 3b of the logic chip LC. The second chip conveying step, the second mark detection step, and the second alignment step shown in FIG. 13 can be regarded as the sub-steps included in the step of mounting the laminated body MCS over the logic chip LC. In this embodiment, the second chip conveying step, the second mark detection step, and the second alignment step are described below as the sub-steps included in the second chip mounting step.

Figure 37:
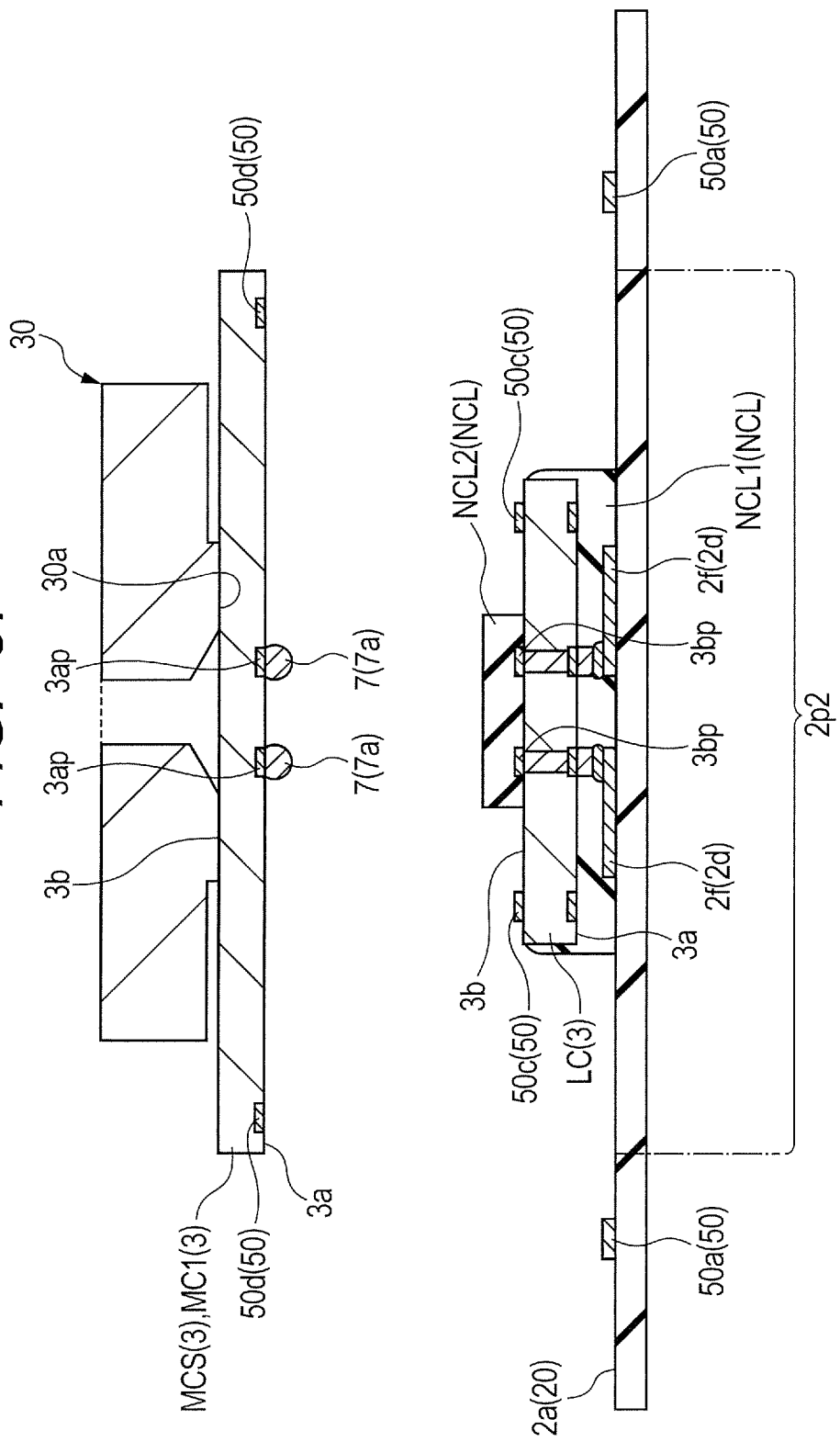
FIG. 37 is an exemplary explanatory diagram showing a main part of a second chip conveying step shown in FIG. 13.
Figure 38:
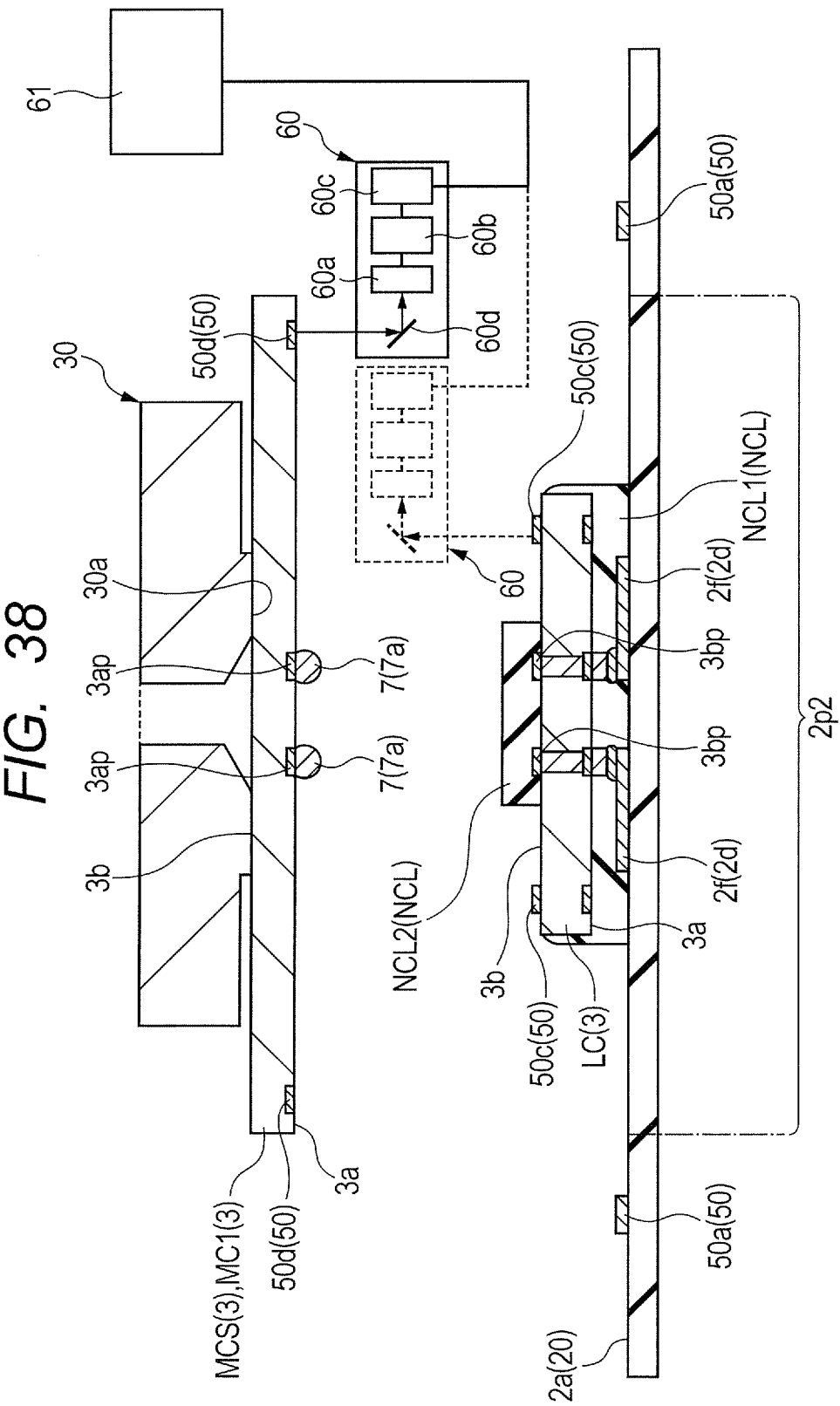
FIG. 38 is an exemplary explanatory diagram showing a main part of a second mark detection step shown in FIG. 13.
Figure 39:
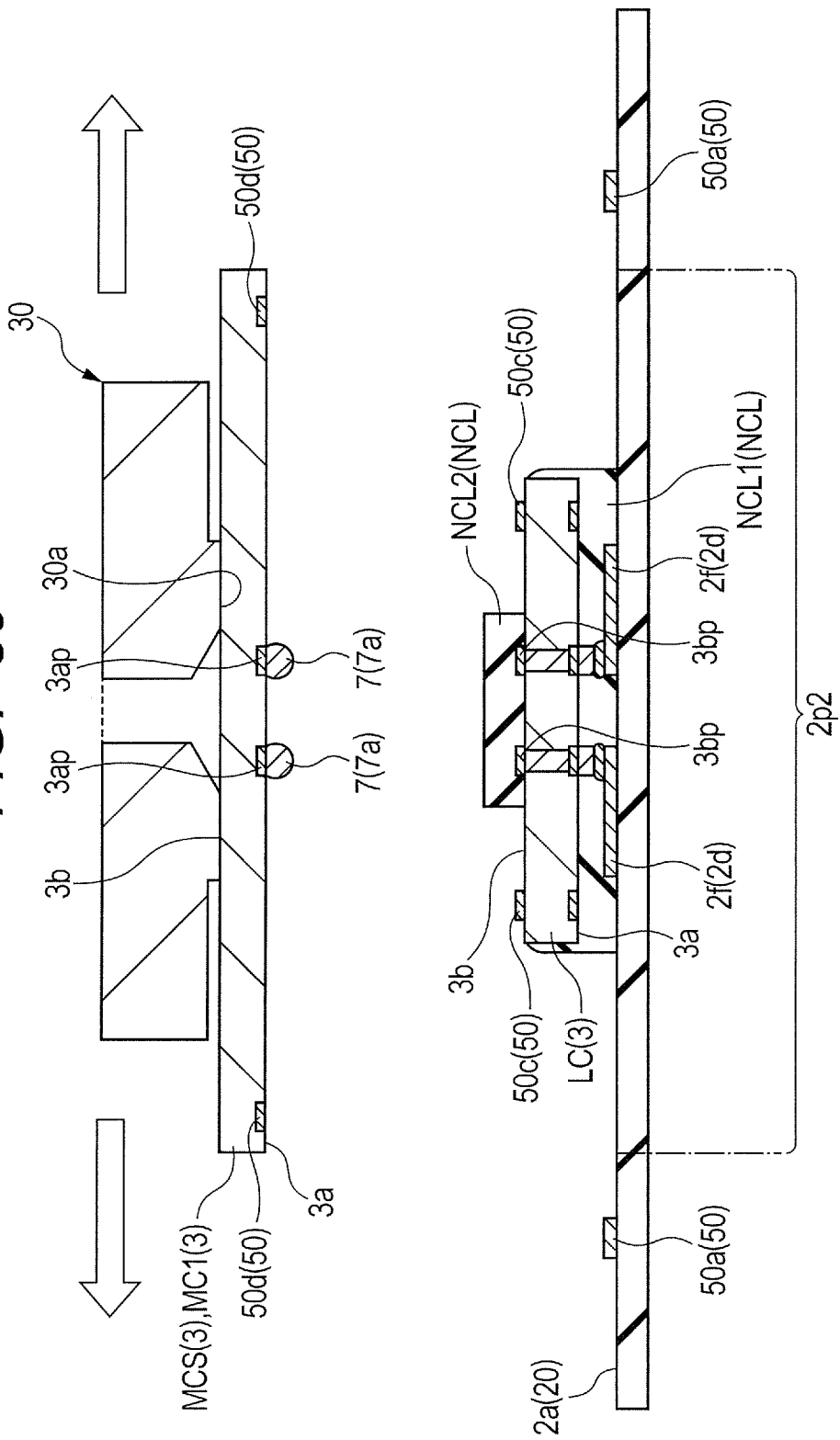
FIG. 39 is an exemplary explanatory diagram showing a main part of a second alignment step shown in FIG. 13.
Figure 40:
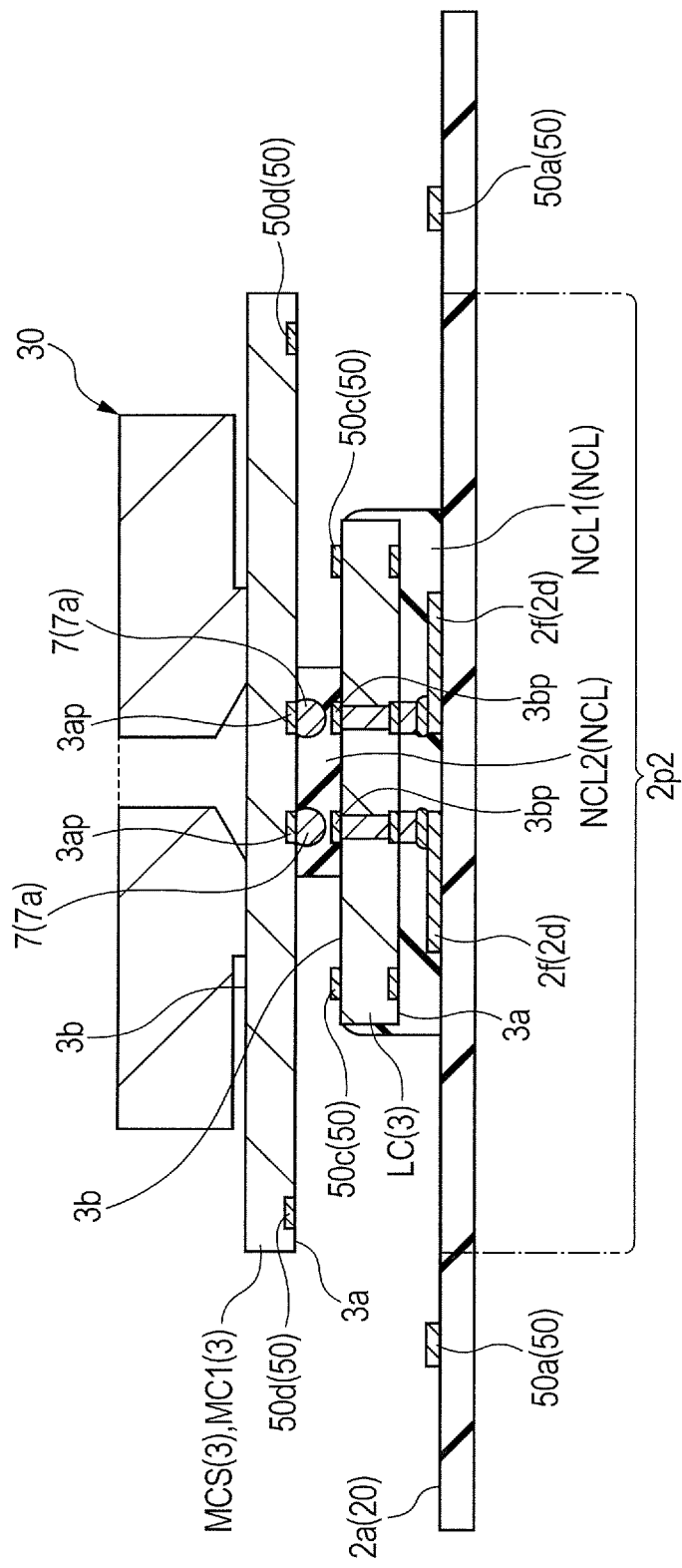
FIG. 40 is an exemplary explanatory diagram showing the state of the logic chip moved to the wiring substrate after the second alignment step shown in FIG. 39.
Figure 41:
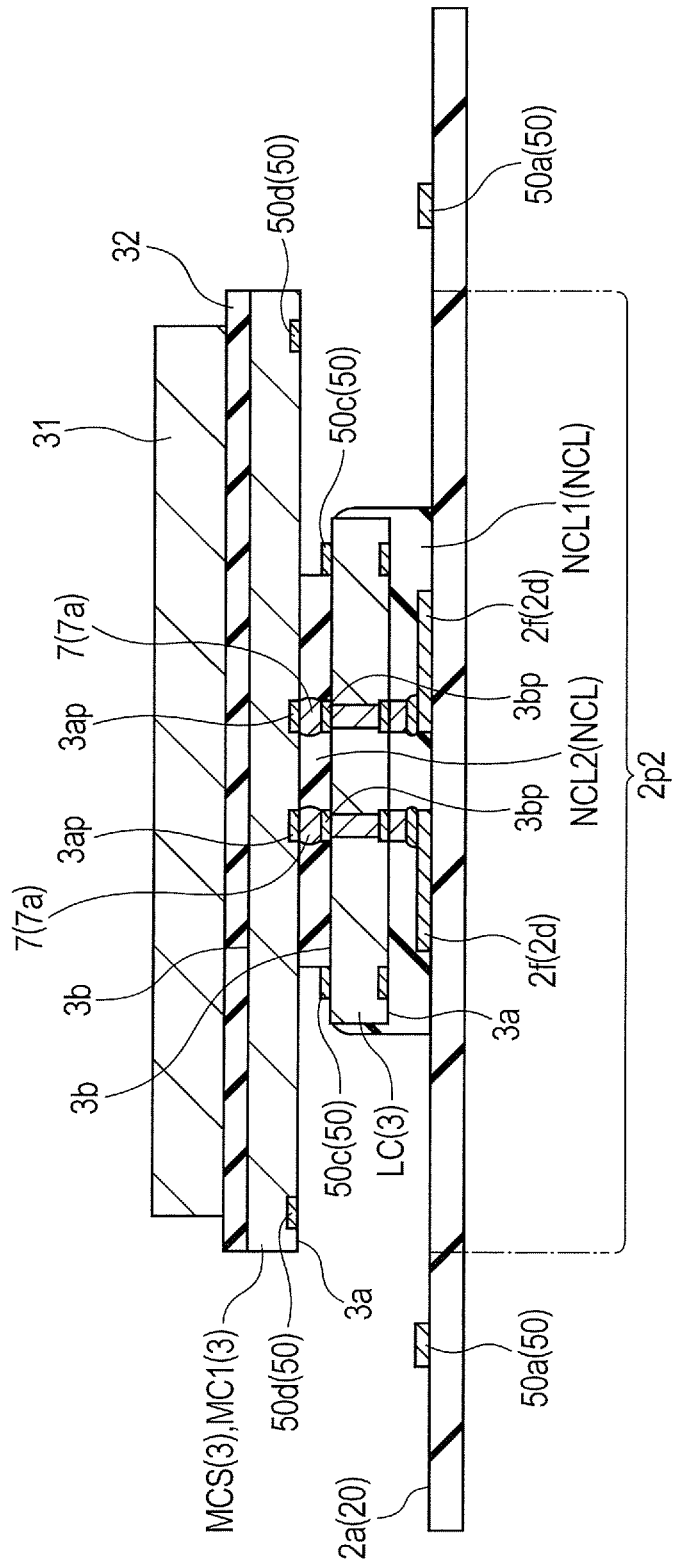
FIG. 41 is an explanatory diagram showing the state of a heating jig pressed against the back surface of the semiconductor chip after removal of a holding jig shown in FIG. 40.

FIG. 35 shows an enlarged plan view of the state of the laminated body mounted over the back surface of the logic chip shown in FIG. 31. FIG. 36 shows an enlarged cross-sectional view taken along the line A-A of FIG. 35. FIG. 37 shows an exemplary explanatory diagram of a main part of a second chip conveying step shown in FIG. 13. FIG. 38 shows an exemplary explanatory diagram of a main part of a second mark detection step shown in FIG. 13. FIG. 39 shows an exemplary explanatory diagram of a main part of a second alignment step shown in FIG. 13. FIG. 40 shows an exemplary explanatory diagram of the state of the logic chip moved to the wiring substrate after the second alignment step shown in FIG. 39. FIG. 41 shows an explanatory diagram of the state of a heating jig pressed against the back surface of the semiconductor chip after removal of a holding jig shown in FIG. 40.

In this step, as shown in FIG. 36, the laminated body MCS is mounted by the so-called face down mounting method (flip-chip bonding) such that the front surface 3a of the laminated body MCS (front surface 3a of the memory chip MC1) faces the back surface 3b of the logic chip LC. In this step, the memory chips MC1, MC2, MC3, and MC4 are electrically connected with the logic chip LC. Specifically, as shown in FIG. 6, the front surface electrodes 3ap formed on the front surface 3a of the laminated body MCS (memory chip MC1) are electrically connected with the back surface electrodes 3bp formed on the back surface 3b of the logic chip LC via the external terminals 7 (solder material 7a shown in FIG. 6). The detailed flow of this step will be described below with reference to FIGS. 37 to 41.

As shown in FIG. 37, the second chip mounting step includes a second chip conveying step of arranging the laminated body MCS (semiconductor chips 3) over the chip mounting region 2p2 of the wiring substrate 20. The laminated body MCS is delivered to over the chip mounting region 2p2 while the back surface 3b side is being held by a holding jig (collet) 30, and arranged over the chip mounting region 2p2 (or adhesive material NCL2) such that the front surface 3a positioned on the element formation surface side faces the upper surface 2a of the wiring substrate 20. The holding jig 30 has a holding surface 30a for sucking and holding the back surface 3b of the laminated body MCS. The laminated body MCS is conveyed while being held by the holding surface 30a. The chip mounting region 2p2 is a region where the laminated body MCS is to be mounted in this step, and does not necessarily includes the boundary line actually visible, like the chip mounting region 2P1 in the first chip mounting step described above.

Each external terminal 7 is formed on the front surface 3a side of the laminated body MCS. In an example shown in FIG. 37, the solder material 7a bonded to the front surface serves as the external terminal 7. Like the logic chip LC shown in FIG. 25, this embodiment can be applied to a modified example in which the protruding electrodes 7b are formed to have its tip provided with the solder material 7a.

In the example shown in FIG. 37, no bonding material, such as solder material, is formed over the upper surface of the back surface electrode 3bp formed over the back surface 3b of the logic chip LC. In a modified example of the embodiment corresponding to FIG. 37, a solder material (not shown) can be formed over the back surface electrode 3bp. When the solder material covering the back surface electrode 3bp is formed before the above first chip mounting step, the solder is melted by heating with the heating jig 31 shown in FIG. 30, and at that time, the melted solder might be attached to the resin film 32. When the solder material is formed on the back surface electrodes 3bp of the logic chip LC, a solder material is preferably applied after the first chip mounting step and before the first adhesive material arrangement step.

Since in the second alignment step shown in FIG. 13, the laminated body MCS is aligned with the wiring substrate 20 with higher accuracy in this embodiment, the accuracy of the conveying position in the second chip conveying step may be low. In order to improve the positional accuracy in the second alignment step, a movement distance in the second alignment step may be preferably small. Thus, for example, in the second chip conveying step, the laminated body MCS is preferably arranged over the upper surface 2a of the wiring substrate 20 with the accuracy that arranges the laminated body MCS over the chip mounting region 2p2.

Then, as shown in FIG. 38, the second chip mounting step includes a second mark detection step that detects (identifies) an alignment mark 50c at the back surface 3b of the logic chip LC, and another alignment mark 50b of the laminated body MCS.

As shown in FIG. 38, in the second mark detection step, while the laminated body MCS being arranged over the wiring substrate 20, the camera 60 is positioned between the wiring substrate 20 and the laminated body MCS, whereby detects (identifies) the alignment mark 50c of the logic chip LC and the alignment mark 50d of the laminated body MCS. The camera 60, a controller 61 connected with the camera 60, and a drive device (not shown) are substantially the same as those in the first mark detection step, and its redundant description will be omitted below. This step detects at least one or more alignment marks 50c, and at least one or more alignment marks 50d by use of the camera 60.

As shown in FIG. 35, the alignment marks 50a are disposed at the periphery of the device region 20a, so that the alignment marks 50a become viewable. The alignment mark 50a of the wiring substrate 20 is used to perform alignment without forming any alignment mark 50c at the back surface 3b of the logic chip LC.

In the first chip mounting step, even when the alignment is performed with high accuracy, the positions (coordinates in the XY plane shown in FIG. 23) or angles (angles in the direction θ shown in FIG. 23) of the back surface electrodes 3bp might become misaligned. For example, after the first alignment step, in a step of moving the logic chip LC toward the wiring substrate 20, or upon switching from the holding jig 30 shown in FIG. 29 to the heating jig 31 shown in FIG. 30, the misalignment might be caused.

Thus, when the alignment marks 50a of the wiring substrate 20 are used to align the laminated body MCS in this step, an amount of misalignment between the external terminal 7 of the laminated body MCS and the back surface electrode 3*bp* of the logic chip LC is the sum of an amount of misalignment between the wiring substrate 20 and the logic chip LC and an amount of misalignment between the wiring substrate 20 and the laminated body MCS. That is, the amount of misalignment between the external terminal 7 of the laminated body MCS and the back surface electrode 3*bp* of the logic chip LC is larger than that between the respective semiconductor chips 3.

In this embodiment, as mentioned above, the alignment marks 50*c* are formed on the back surface 3*b* of the logic chip LC, and then used to align the laminated body MCS and logic chip LC with the substrate. That is, the amount of misalignment between the external terminal 7 of the laminated body MCS and the back surface electrode 3*bp* of the logic LC is within a prescribed range of misalignment between the laminated body MCS and the logic chip LC.

As explained in the description of the above first mark detection process, positional data for defining the positional relationship between the alignment mark 50*c* and the back surface electrode 3*bp* of the logic chip LC, or the positional relationship between the alignment mark 50*d* and the front surface electrode 3*ap* of the laminated body MCS is input to the controller 61. Thus, the controller 61 can calculate the positions of the back surface electrodes 3*bp* of the logic chip LC, and the front surface electrodes 3*ap* of the laminated body MCS.

In the example shown in FIG. 38, the alignment marks 50*c* are formed over the logic chip LC, and the alignment marks 50*d* are formed over the front surface 3*a* side of the laminated body MCS. The alignment marks 50 are formed on the back surface 3*b* of the logic chip LC and at the front surface 3*a* of the laminated body MCS, and then the positions of the alignment marks 50 are respectively detected, whereby data on the direction θ indicative of an inclination of the coordinate axes can be obtained in addition to the coordinate data in the XY plane shown in FIG. 23. The positions of the back surface electrodes 3*bp* (see FIG. 10) of the logic chip LC, or the positions of the front surface electrode 3*ap* (see FIG. 7) of the laminated body MCS can be accurately calculated by using the data on the coordinates and direction θ of the alignment mark 50.

As shown in FIG. 10, the alignment marks 50*c* are arranged at opposite corners such that the marks are positioned on one diagonal line of the back surface 3*b* forming the quadrilateral shape in plan view. As shown in FIG. 7, the alignment marks 50*d* are arranged at opposite corners such that the marks are positioned on one diagonal line of the front surface 3*a* forming the quadrilateral shape in plan view. The alignment marks 50 are arranged at the opposite corners in this way, which can improve the accuracy of the data on the direction θ. This can improve the accuracy of calculation of the positions of the back surface electrodes 3*bp* (see FIG. 10), or the positions of the front surface electrodes 3*ap* (see FIG. 7).

In this embodiment, the front surface electrodes 3*ap* of each of the memory chips MC1, MC2, MC3, and MC4 are collectively arranged in the center of the front surface 3*a* as shown in FIG. 7. From the viewpoint of ensuring the arrangement space for the front surface electrodes 3*ap*, as shown in FIG. 7, the alignment marks 50*d* are preferably arranged outside (at the periphery of) the front surface electrodes 3*ap*.

As shown in FIG. 6, the back surface electrodes 3*bp* of the logic chip LC are arranged to face the front surface electrodes 3*ap* of the memory chip MC1. As shown in FIG. 10, the back surface electrodes 3*bp* of the logic chip LC are collectively arranged in the center of the back surface 3*b* of the logic chip LC. In order to ensure the arrangement space for the back surface electrodes 3*bp* of the logic chip LC, the alignment marks 50*c* are preferably arranged outside (at the periphery of) the back surface electrodes 3*bp*.

As shown in FIG. 7 described above, in each of the memory chips MC1, MC2, MC3, and MC4, the memory regions MR for four channels are arranged to enclose the region (central part) where the group of the front surface electrodes are arranged. This arrangement can equalize the distances from the respective memory regions MR to the front surface electrodes 3*ap*. In this way, from the viewpoint of equalizing the distances from the respective memory regions MR to the front surface electrodes 3*ap*, the alignment marks 50*d* should not be arranged between the memory region MR and each front surface electrode 3*ap*. Thus, as shown in FIG. 7, each of the alignment marks 50*d* is preferably arranged outside (at the periphery of) the memory regions MR at the front surface 3*a* of the memory chip MC1.

The storage capacity of each of the memory chips MC1, MC2, MC3, and MC4 increases in proportion to the area of the memory region MR. As mentioned above, the alignment marks 50*d* are arranged outside (at the periphery of) the memory regions MR, so that each alignment mark 50*d* is arranged at the periphery of the front surface 3*a*. As a result, the distance between the alignment marks 50*d* can be increased to thereby improve the alignment accuracy in the direction θ as mentioned above.

The alignment marks 50*d* are preferably arranged at opposite corners in order to improve the alignment accuracy in the direction θ as described above.

As shown in FIG. 27, the alignment mark 50*d* formed in the front surface 3*a* of the laminated body MCS is preferably exposed from the insulating film (protective film, passivation film) 3*p* formed on the uppermost surface of the laminated body MCS. In the example shown in FIG. 27, the opening 3*ps* is formed in the insulating film (protective film, passivation film) 3*p* formed on the uppermost surface of the laminated body MCS. Each alignment mark 50*d* is exposed from the insulating film 3*p* at the opening 3*ps*.

The alignment marks 50*c* are formed on the back surface 3*b* of the logic chip LC as shown in FIG. 38 without forming the insulating film or protective film covering the back surface 3*b*. Thus, in the second adhesive material arrangement step, the adhesive material NCL2 can be arranged to avoid the alignment marks 50*c* to easily expose the alignment marks 50*c*.

Then, as shown in FIG. 39, the second chip mounting step includes a second alignment step that aligns the logic chip LC with the laminated body MCS. As shown in FIG. 39, in the second alignment step, the relative position between the laminated body MCS and the logic chip LC (in other words, wiring substrate 20) are moved along the upper surface 2*a* of the wiring substrate 20, so that the back surface electrodes 3*b* of the logic chi LC face the external terminals 7 formed on the front surface 3*a* of the laminated body MCS.

As mentioned above, in this embodiment, the positions of the back surface electrodes 3*bp* of the logic chip LC and the positions of the front surface electrodes 3*ap* of the laminated body MCS can be calculated with high accuracy. Based on the calculation data, the relative position between the laminated body MCS and the logic chip LC can be moved to perform alignment with high accuracy.

In the example shown in FIG. 39, a method for moving the relative position between the logic chip LC and the laminated body MCS involves moving the holding jig 30 holding the laminated body MCS along the upper surface 2*a* of the wiring substrate 20 as indicated by the arrow of FIG. 39. The relative relationship between the laminated body MCS and the logic chip LC can be moved by moving one or both of the laminated body MCS and the logic chip LC.

Then, as shown in FIG. 40, the laminated body MCS is moved toward the logic chip LC. In the above second alignment step, the relative position between the laminated body MCS and the logic chip LC is aligned with high accuracy. Thus, the back surface electrodes 3bp of the logic chip LC and the external terminals 7 formed on the front surface 3a of the laminated body MCS can be kept facing and opposite to each other by linearly moving the laminated body MCS toward the logic chip LC.

Then, as shown in FIG. 41, the laminated body MCS is pressed against the logic chip LC by pushing the heating jig 31 to the back surface 3b of the laminated body MCS. At this time, the adhesive material NCL2 is soft before being cured. Upon pushing the laminated body MCS by the heating jig 31, the laminated body MCS approaches the logic chip LC. When the laminated body MCS approaches the logic chip LC, the tip (specifically, solder material 7a) of each of the external terminals 7 formed on the front surface 3a of the laminated body MCS comes into contact with the bonding region (specifically, solder material 7a) of the back surface electrode 3bp.

The adhesive material NCL2 applied between the laminated body MCS and the logic chip LC is spread along the back surface 3b of the logic chip LC. In the example shown in FIG. 41, the periphery of the adhesive material NCL2 does not reach the periphery of the back surface 3b of the logic chip LC. In a modified example, the adhesive material NCL2 may be spread over the periphery of the logic chip LC to cover the side surface of the logic chip LC or the side surface of the adhesive material NCL1. In this case, the alignment marks 50c of the back surface 3b of the logic chip LC are covered with the adhesive material NCL2. The position of the alignment mark 50c, however, is already detected, which does not raise any problem. A contact area between the adhesive material NCL2 and the semiconductor chip 3 can be expanded to improve the strength of bonding between the adhesive material NCL2 and the semiconductor chip 3 (laminated body MCS and logic chip LC).

In this embodiment, the alignment marks 50 and back surface electrodes 3bp are not formed on the back surface 3b of the laminated body MCS. Thus, the resin film 32 shown in FIG. 41 can be omitted. The provision of the resin film 32 can disperse the force received by the laminated body MCS in pressing the film with the heating jig 31. Also, the provision of the resin film 32 can perform a second chip mounting step in the same mechanism as that of the first chi mounting step, which can simplify the manufacturing process. In the second chip mounting step, the resin film 32 preferably intervenes in between the laminated body MCS and the heating jig 31.

Then, as shown in FIG. 41, the laminated body MCS and the adhesive material NSL2 are heated by the heating jig (heat source) 31 while the laminated body MCS being pressed against the heating jig 31. The solder material 7a on the external terminal side is melt at a bonding portion between the laminated body MCS and the logic chip LC to be bonded with the back surface electrode 3bp of the logic chip LC. That is, the laminated body MCS is heated by the heating jig (heat source) 31, so that the front surface electrodes 3ap of the laminated body MCS are electrically connected with the back surface electrodes 3bp of the logic chip LC via the solder materials 7a.

The adhesive material NCL2 is heated to be cured. Like the first chip mounting step described, in another embodiment, the adhesive material NCL1 is not necessarily cured fully by the heat from the heating jig (heat source) 31, and a part of the thermosetting resin contained in the adhesive material NCL1 is cured (semi-cured) to such an extent that can fix the laminated body MCS. Then, the log chip LC is transferred to a heating furnace (not shown), and the remainder of the thermosetting resin is cured (fully cured). It takes time to complete the full curing process of fully curing the thermosetting resin components contained in the adhesive material NCL1, but the full curing process is performed in the heating furnace, which can improve the manufacturing efficiency.

<Sealing Step>

Figure 42:
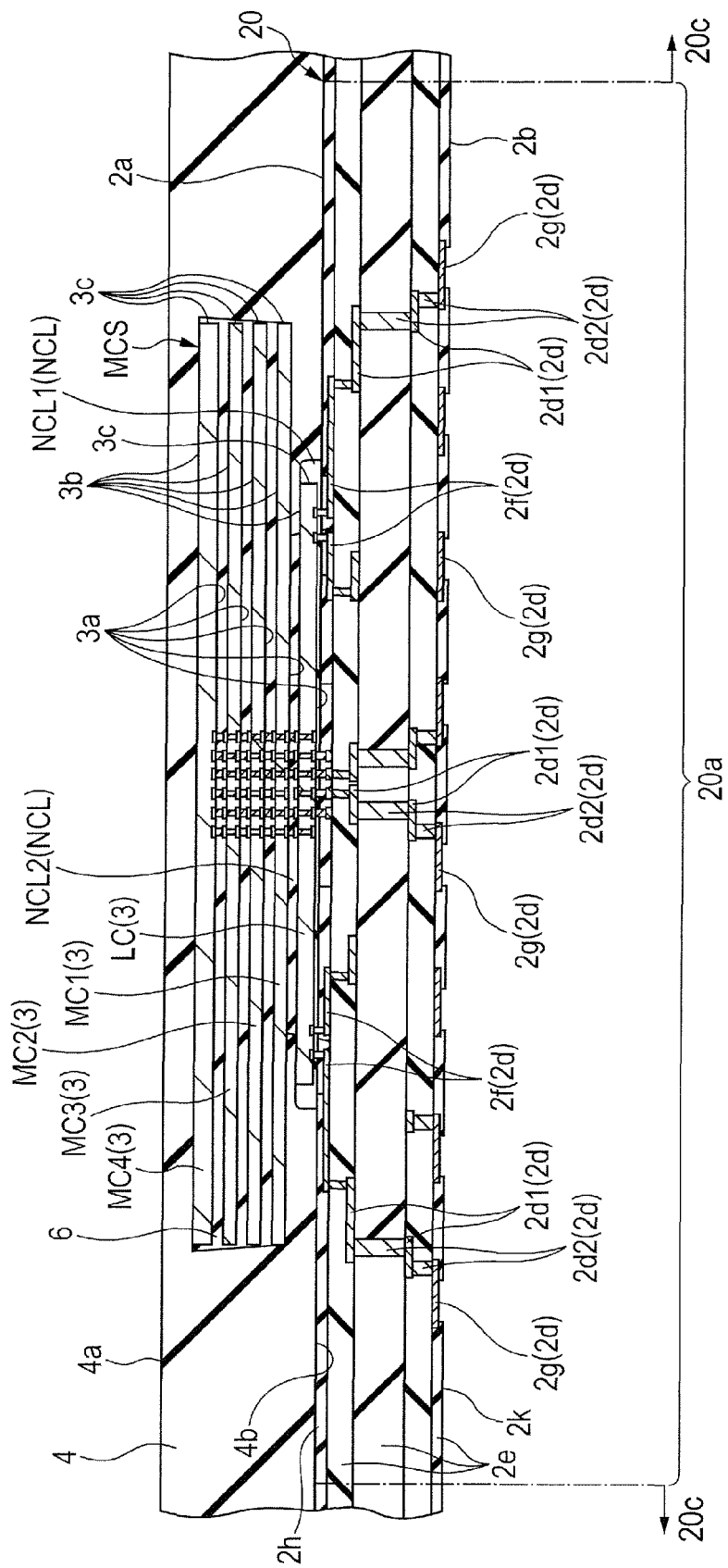
FIG. 42 is an enlarged cross-sectional view showing the state of the stacked semiconductor chips sealed with a seal member formed over the wiring substrate shown in FIG. 36.
Figure 43:
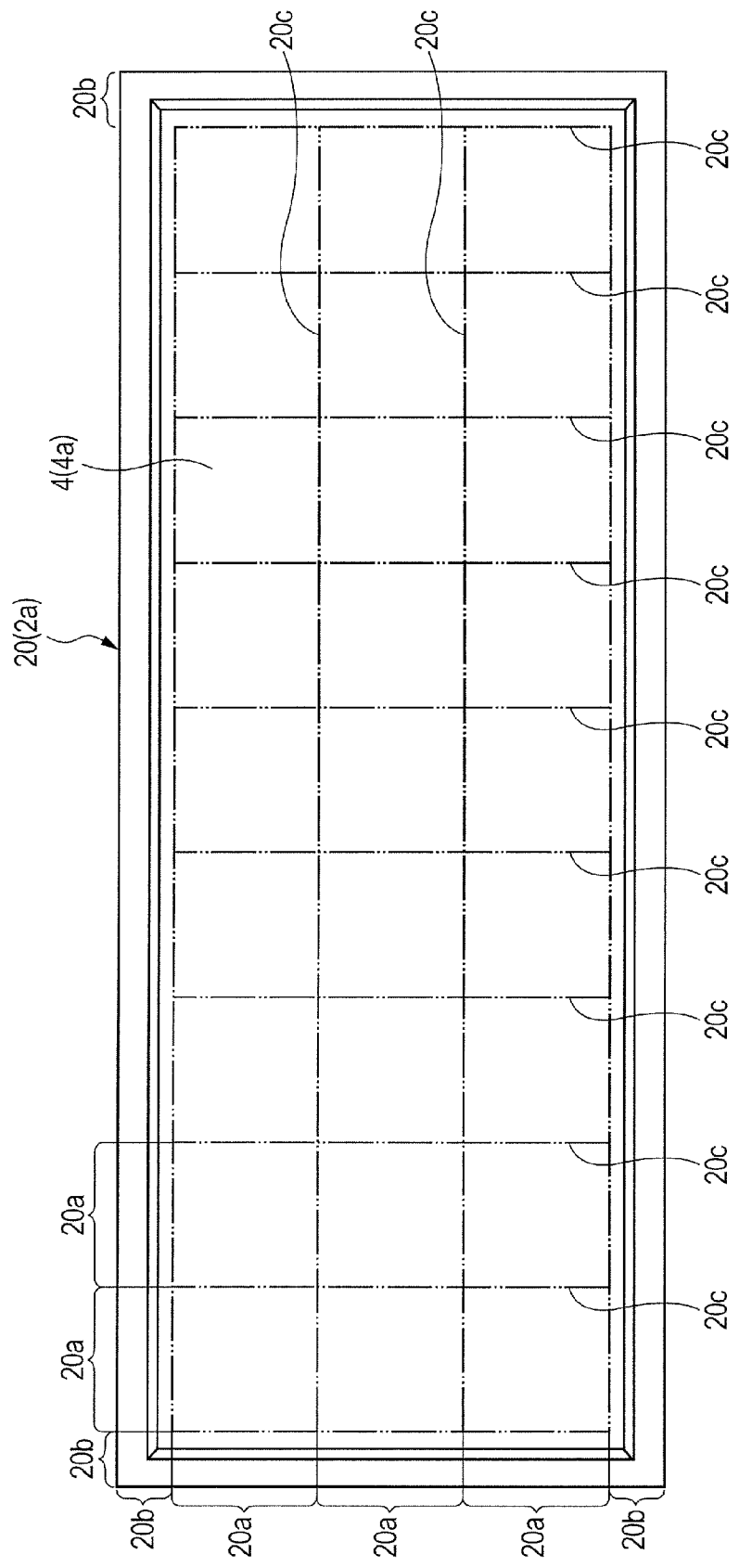
FIG. 43 is a plan view showing the entire structure of the seal member shown in FIG. 42.

Then, in a sealing step shown in FIG. 13, as shown in FIG. 42, the upper surface 2a of the wiring substrate 20, the logic chip LC, and the laminated body MCS with the memory chips MC1, MC2, MC3, and MC4 are sealed with resin to thereby form the seal member 4. FIG. 42 shows an enlarged cross-sectional view of the state of the stacked semiconductor chips sealed with the seal member formed over the wiring substrate shown in FIG. 36. FIG. 43 shows a plan view of the entire structure of the seal member shown in FIG. 42.

In this embodiment, as shown in FIG. 43, the seal member 4 is formed to seal the device regions 20a at one time. The formation of the seal member 4 is called the "block molding" method. A semiconductor package manufactured by the block molding method is called the "multi array package (MAP) semiconductor device". In the block molding method, the distance between the adjacent device regions 20a can be decreased, so that an effective area of one piece of the wiring substrate 20 is increased. In other words, the number of products that can be obtained from one wiring substrate 20 is increased. In this way, the effective area of the one wiring substrate 20 is increased, which can make the manufacturing process more efficient.

In this embodiment, the seal member 4 is formed by the so-called transfer molding method which involves press-fitting resin heated and softened in a molding die (not shown), molding the resin therein, and thermally curing the resin. The seal member 4 formed by the transfer mold method has a high durability, for example, like the seal member 6 sealing the laminated body MCS shown in FIG. 42, as compared to a member produced by curing a liquid resin. The seal member 4 is appropriate as a protective member. Filler particles, such as silica (silicone dioxide; $SiO_2$) particles, are mixed into the thermosetting resin, which can improve the function of the seal member 4 (for example, resistance to warpage).

In this embodiment, bonding portions (electric connection portions) between the stacked semiconductor chips 3 are sealed by the adhesive materials NCL1, NCL2, and seal member 6. In a modified example to which this embodiment can be applied, the seal member 4 is not formed. In this case, the full sealing step can be omitted.

<Ball Mounting Step>

Figure 44:
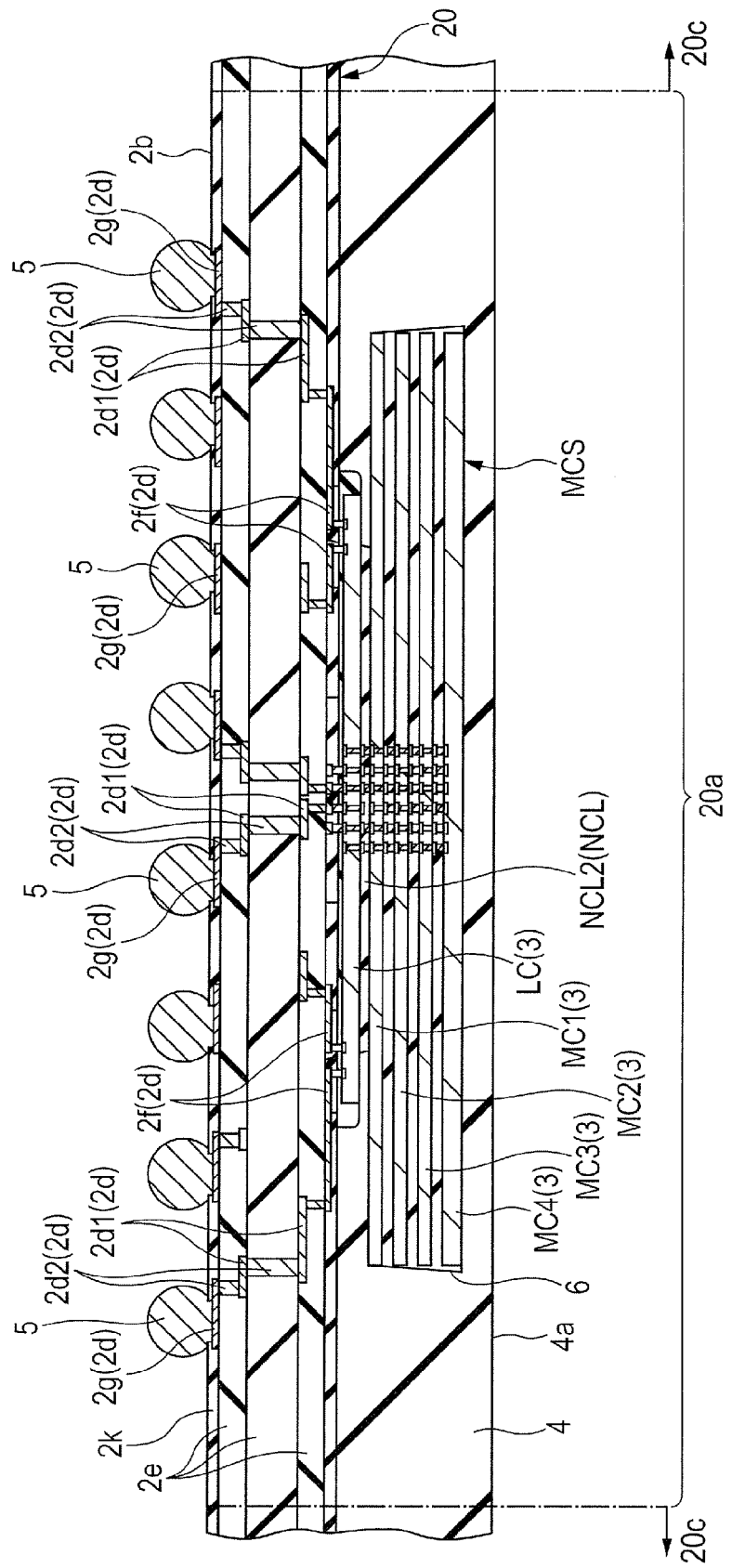
FIG. 44 is an enlarged cross-sectional view showing the state of solder balls bonded to lands of the wiring substrate shown in FIG. 37.

Then, in a ball mounting step shown in FIG. 13, as shown in FIG. 44, the solder balls 5 serving as the external terminal are bonded to the lands 2g formed on the lower surface 2b of the wiring substrate 20. FIG. 44 shows an enlarged cross-sectional view of the state of the solder balls bonded to lands of the wiring substrate shown in FIG. 37.

In this step, as shown in FIG. 44, after turning the wiring substrate 20 upside down, the solder balls 5 are arranged over the respective lands 2g exposed at the lower surface 2b of the wiring substrate 20, and then heated, so that the solder balls 5 are bonded to the lands 2g. In this step, the solder balls 5 are electrically coupled to the semiconductor chips 3 (logic chip LC, and memory chips MC1, MC2, MC3, and MC4) via the wiring substrate 20. The technique described in this embodiment is not limited to the application to the so-called ball grid array (BGA) semiconductor device with solder balls 5 bonded thereto in an array. For example, a modified example of this embodiment can be applied to the so-called land grid array (LGA) semiconductor device which is shipped with the lands 2g exposed without forming the solder balls 5, or with a solder paste thinner than the solder ball 5 attached to the lands 2g. The LGA semiconductor device can omit the ball mount step.

<Singulating Step>

Figure 45:
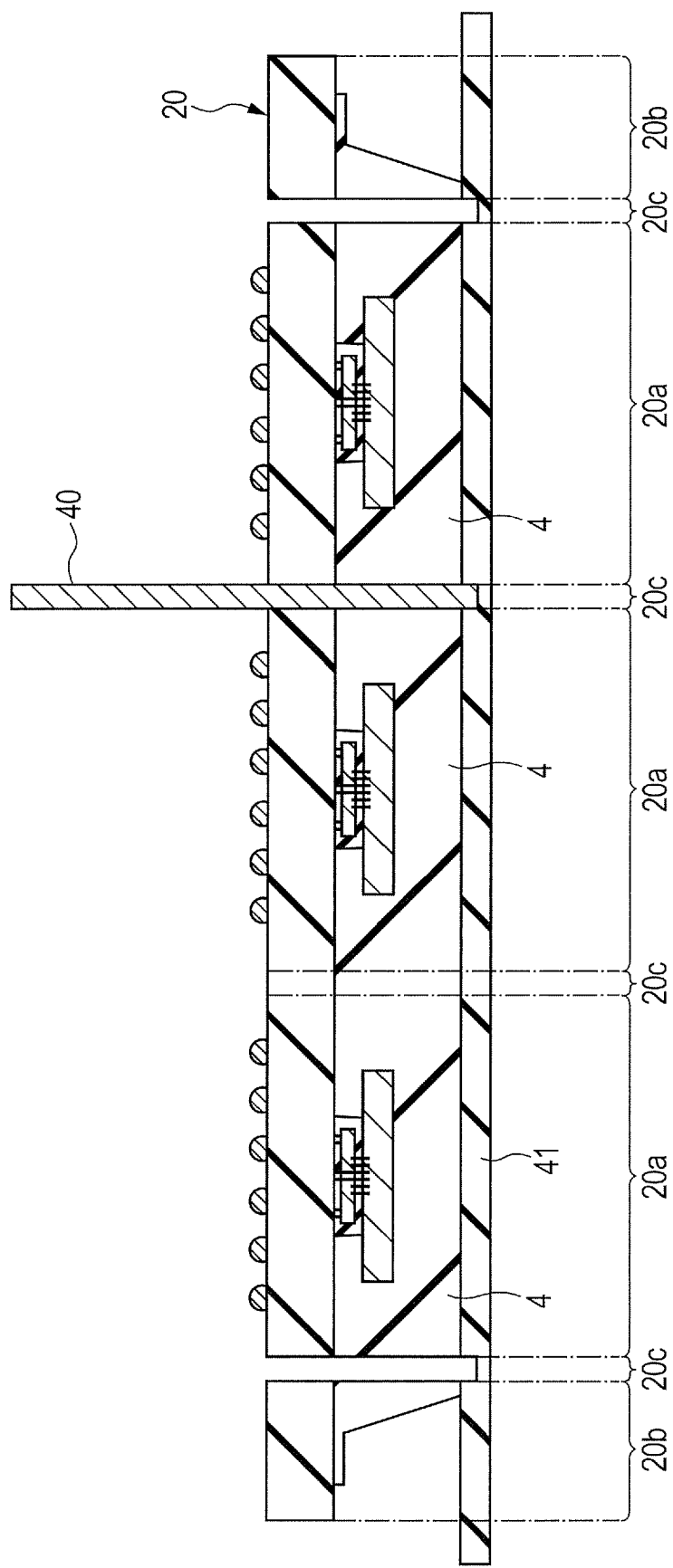
FIG. 45 is a cross-sectional view showing the singulated multi-piece wiring substrate shown in FIG. 44.

Then, in a singulating step shown in FIG. 13, as shown in FIG. 45, the wiring substrate 20 is divided every device region 20a. FIG. 45 shows a cross-sectional view of the singulated multi-piece wiring substrate shown in FIG. 44.

In this step, as shown in FIG. 45, the wiring substrate 20 and the seal member 4 are cut along the dicing lines (dicing regions) 20c to obtain the singulated semiconductor devices 1 (see FIG. 4). In the embodiment, cutting methods are not specifically limited, but in the example shown in FIG. 45, the wiring substrate 20 and seal member 4 bonded and fixed to a tape material (dicing tape) 41 are cut using the dicing blade (rotary blade) 40 from the lower surface 2b of the wiring substrate 20. The technique described in this embodiment is applied not only to the case of using the wiring substrate 20 as a multi-piece substrate with the device regions 20a, but also to, for example, a semiconductor device having semiconductor chips 3 stacked over the wiring substrate 2 (see FIG. 4) corresponding to only one semiconductor device. In this case, the singulating step can be omitted.

Throughout the above steps, the semiconductor device 1 described with reference to FIGS. 1 to 11 can be obtained. Thereafter, necessary checking and testing, such as an appearance check or an electric test, are performed on each semiconductor device. Then, the semiconductor device is shipped, or mounted on a mounting substrate (not shown).

<Shape of Alignment Mark>

Figure 46:
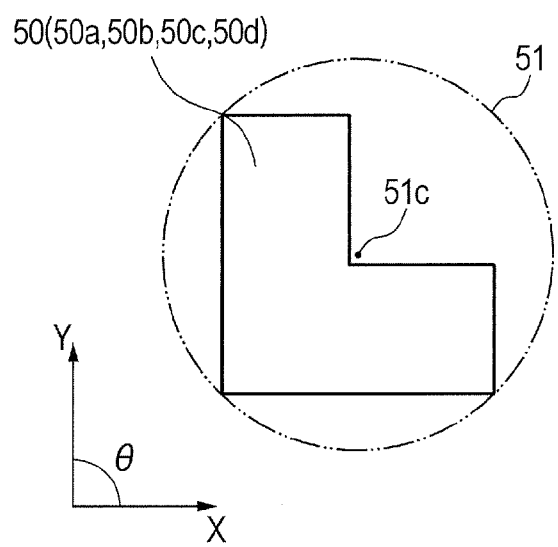
FIG. 46 is an enlarged plan view showing the alignment mark shown in FIGS. 3, 7, 9, and 10.
Figure 47:
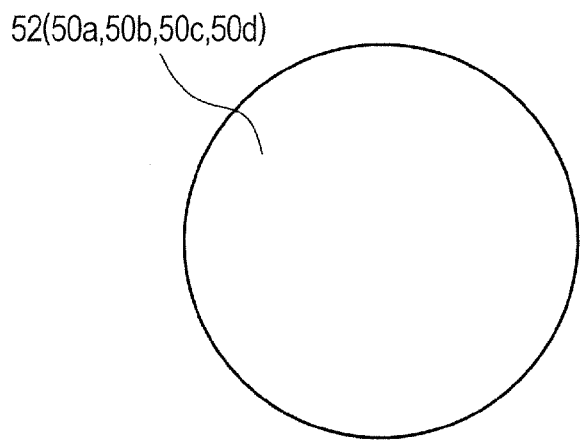
FIG. 47 is an enlarged plan view showing a first modified example corresponding to FIG. 46.
Figure 48:
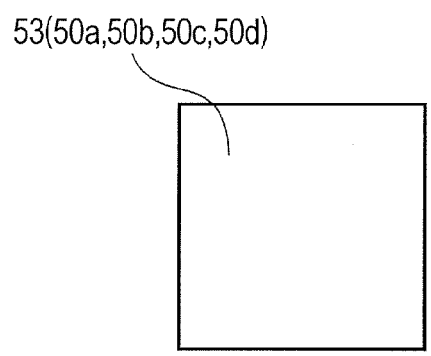
FIG. 48 is an enlarged plan view showing a second modified example corresponding to FIG. 46.
Figure 49:
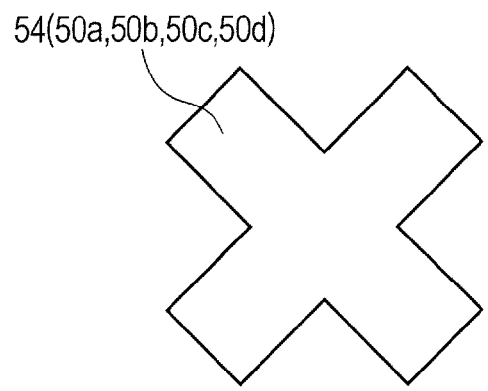
FIG. 49 is an enlarged plan view showing a third modified example corresponding to FIG. 46.

Then, preferable embodiments of the shape of the alignment mark in the plan view will be described later. FIG. 46 shows an enlarged plan view of the alignment mark shown in FIGS. 3, 7, 9, and 10. FIGS. 47 to 49 are enlarged plan views of modified examples corresponding to FIG. 46.

An alignment mark 50 shown in FIG. 46 forms a polygonal shape (a L-like shape shown in FIG. 46) in plan view. The polygonal shape has an asymmetric shape with respect to the center of a circumcircle 51 of the polygonal shape. Thus, the planar shape of the alignment mark 50 is set to the asymmetric shape, so that not only the position of the alignment mark 50, but also an inclination of the alignment mark 50 in plan view can be detected.

Thus, for example, even when the alignment marks 50a, 50b, 50c, and 50d are individually formed, the X and Y coordinates of the alignment mark 50 and the position of the direction θ can be specified.

When two or more asymmetric alignment marks 50 are arranged in the same plane, it can be detected that the position of the chip in the direction shown in FIG. 46 is displaced by 180 degrees. For example, the alignment marks 50d shown in FIG. 7, and the alignment marks 50b shown in FIG. 9 are set in the asymmetric shape shown in FIG. 46, which can prevent or suppress the improper mounting, including the displacement of the mounting direction of the semiconductor chip 3 by 180 degrees, in the first chip mounting step and the second chip mounting step.

Like an alignment mark 52 shown in FIG. 47, the alignment mark having a circular shape in plan view can improve the processing accuracy as the circular shape can be easily processed as compared to the polygonal shape shown in FIG. 46. Even a part of the circular alignment mark 52 can hardly break, which can improve the detection accuracy.

Thus, for example, at least one of the alignment marks 50a, 50b, 50c, and 50d employs the circular alignment mark 52, which can improve the position detection accuracy of the position in which the alignment mark 52 is arranged. The alignment marks 50a, 50b, 50c, and 50d can be formed in a circular shape, like the alignment mark 52.

In this embodiment, as shown in FIG. 6, the back surface electrodes 3bp of the logic chip LC have only to surely face the front surface electrodes 3ap of the memory chip MC1. Thus, various modified examples can be applied within a range that can ensure the required alignment accuracy. For example, as shown in FIG. 48, an alignment mark 53 having a quadrilateral shape in plan view can be applied. For example, as shown in FIG. 49, an alignment mark 54 having an X-like shape in plan view can be applied. As mentioned above, a combination of the alignment marks 50, 52, 53, and 54 can be applied.

MODIFIED EXAMPLES

The invention made by the inventors has been specifically described based on the embodiments. However, the invention is not limited to the above embodiments, and various modifications and changes can be made without departing from the scope of the invention.

Modified Example 1

Figure 50:
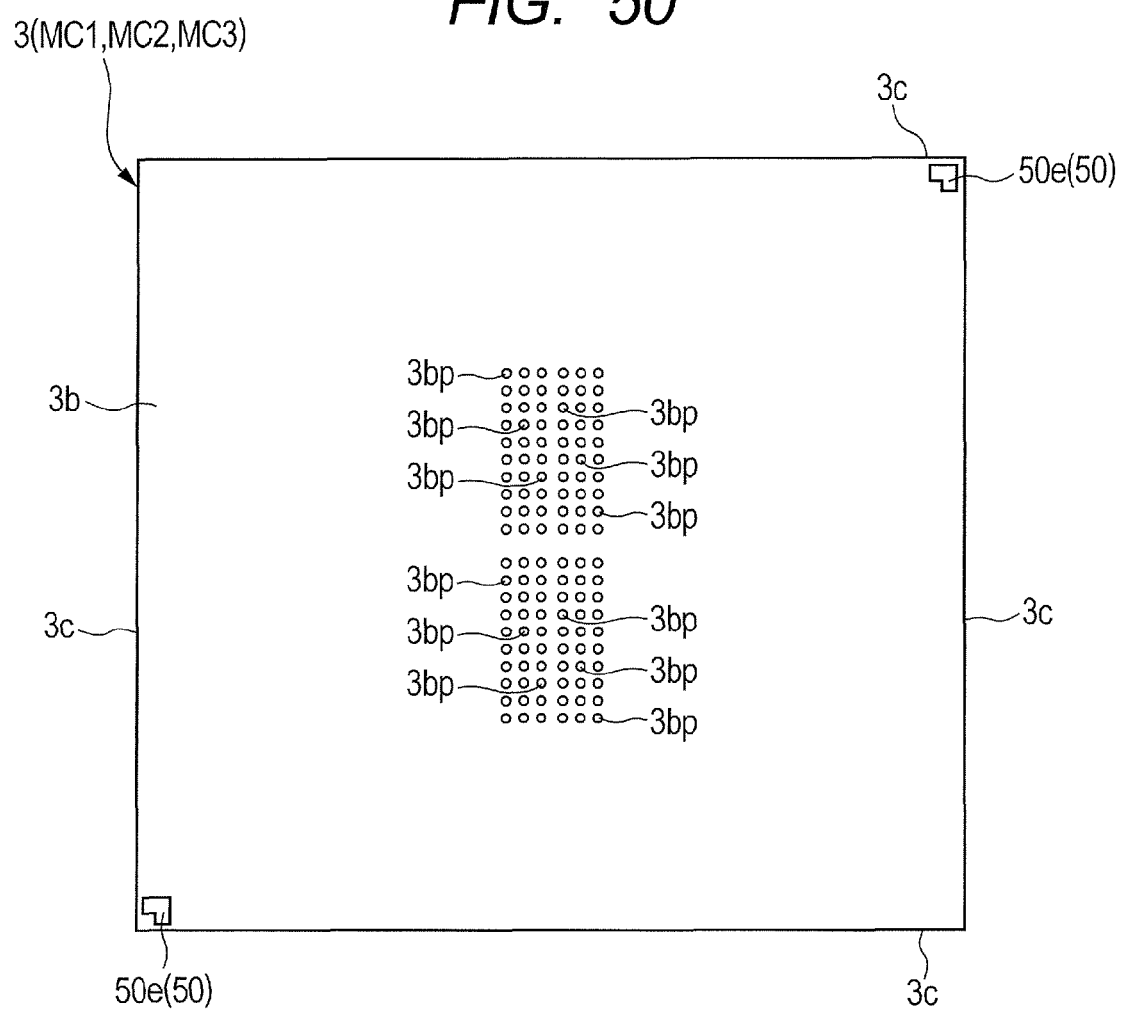
FIG. 50 is a plan view showing a modified example corresponding to FIG. 8.

For example, in the above embodiment, the technique for stacking the semiconductor chips 3 using the result of detection of the alignment mark 50 is applied in the first chip mounting step and the second chip mounting step. The technique can applied to the step of assembling the laminated body MCS, that is, the second chip provision step. FIG. 50 shows a plan view of a modified example corresponding to FIG. 8.

When applying the technique for stacking the semiconductor chips 3 using the result of detection of the alignment mark 50 in the second chip preparation step, as shown in FIG. 7, the alignment marks 50d are formed over the respective surfaces 3a of the memory chips MC1, MC2, MC3, and MC4 forming the laminated body MCS (see FIG. 4). As shown in FIG. 50, alignment marks 50e are formed over the back surface 3b of each of the memory chips MC1, MC2, and MC3.

In the present modified example, in stacking the memory chips MC1, MC2, MC3, and MC4, the alignment accuracy of the memory chips can be improved to thereby improve the electric connection reliability of the memory chips MC1, MC2, MC3, and MC4.

Second Modified Example

Figure 51:
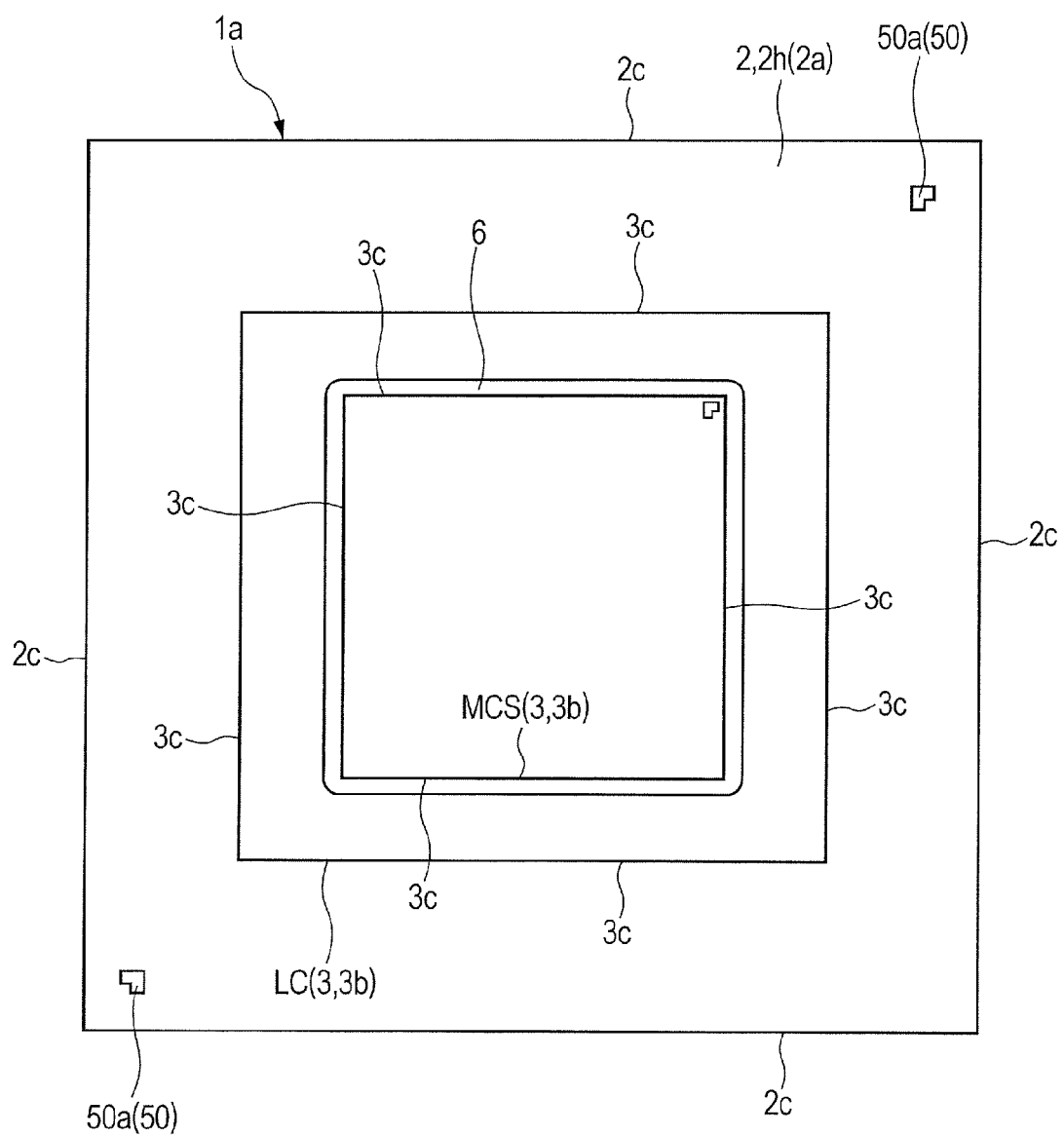
FIG. 51 is a perspective plan view showing a modified example corresponding to FIG. 3.

The above embodiment has described the planar size of the laminated body MCS mounted at the upper level is larger than the planar size of the logic chip LC mounted at the lower level. However, like the semiconductor device 1a shown in FIG. 51, as a second modified example, the invention can be applied to the case where the planar size of the laminated body MCS is smaller than that of the logic chip LC mounted at the lower level. FIG. 51 shows a perspective plane view of a modified example corresponding to FIG. 3.

Third Modified Example

The above embodiment has described a SiP semiconductor device 1 composed of the logic chip LC and the memory chips MC1, MC2, MC3, and MC4 as an example of the semiconductor chips 3 to be stacked (used). However, as a third example, the invention can also be applied to any combination other than a combination of the memory chip and the logic chip as long as the stacked chips 3 are electrically connected with each other.

Fourth Modified Example

In this embodiment, as shown in FIG. 6, the back surface electrodes 3bp are arranged on the side opposite to the front surface electrodes 3ap of the logic chip LC. The back surface electrodes 3bp are electrically connected with the front surface electrodes 3ap via the penetrating electrodes 3tsv. However, as a fourth modified example, the invention can also be applied to a semiconductor device including back surface electrodes 3bp formed at the lower semiconductor chip 3, and front surface electrodes 3ap formed at the upper semiconductor chip electrically connected with the back surface electrodes 3bp via the external terminals 7.

Fifth Modified Example

A combination of the modified examples can be applied without departing from the scope of the technical idea described in the embodiments.

What is claimed is:

1. A method of manufacturing a semiconductor device, comprising the steps of:
   (a) providing a wiring substrate including a first surface, a plurality of bonding leads formed on the first surface, a first alignment mark formed on the first surface, a second surface opposite to the first surface, and a plurality of lands formed on the second surface and electrically connected with the bonding leads, respectively;
   (b) after the step (a), arranging a first semiconductor chip over the first surface of the wiring substrate such that a first main surface of the first semiconductor chip faces the first surface of the wiring substrate, the first semiconductor chip including the first main surface, a first semiconductor element formed on the first main surface, a plurality of first main surface side pads formed on the first main surface and electrically connected with the first semiconductor element, a second alignment mark formed at the first main surface side, a plurality of first external terminals formed at the first main surface side pads, respectively, a first back surface opposite to the first main surface, a plurality of first back surface side pads formed on the first back surface and electrically connected with the first main surface side pads, and a third alignment mark formed on the first back surface;
   (c) after the step (b), while the first semiconductor chip being arranged over the wiring substrate, arranging a mark position detector between the wiring substrate and the first semiconductor chip with, and detecting the first alignment mark of the wiring substrate and the second alignment of the first semiconductor chip and thereby align the wiring substrate with the first semiconductor chip;
   (d) after the step (c), mounting the first semiconductor chip over the first surface of the wiring substrate, and electrically connecting the first external terminals with the bonding leads, respectively;
   (e) after the step (d), arranging a second semiconductor chip over the first back surface of the first semiconductor chip, the second semiconductor chip including a second main surface, a second semiconductor element formed on the second main surface, a plurality of second main surface side pads formed on the second main surface and electrically connected with the second semiconductor element, a fourth alignment mark formed at the second main surface side, a plurality of second external terminals formed at the second main surface side pads, respectively, and a second back surface opposite to the second main surface;
   (f) after the step (e), while the second semiconductor chip being arranged over the first semiconductor chip, arranging the mark position detector between the second semiconductor chip and the first semiconductor chip, and detecting the third alignment mark of the first semiconductor chip and the fourth alignment mark of the second semiconductor chip and thereby align the first semiconductor chip with the second semiconductor chip; and
   (g) after the step (c), mounting the second semiconductor chip over the first semiconductor chip, and electrically connecting the second external terminals with the first back surface side pads, respectively.

2. The method of manufacturing a semiconductor device according to claim 1, wherein in the step (f), the third alignment marks formed on the first back surface of the first semiconductor chip, and the fourth alignment marks formed at the second main surface side of the second semiconductor chip are detected.

3. The method of manufacturing a semiconductor device according to claim 1,
   wherein the second semiconductor chip is provided with a main storage circuit, and
   wherein the first semiconductor chip is provided with a control circuit for controlling driving of the main storage circuit, and an arithmetic processing circuit for performing arithmetic processing on data about a signal input and output to and from the second semiconductor chip or an external device.

4. The method of manufacturing a semiconductor device according to claim 1, wherein the first semiconductor chip includes a plurality of penetrating electrodes penetrating from one of the first main surface and the first back surface to the other, and electrically connecting the first main surface side pads with the first back surface side pads.

5. The method of manufacturing a semiconductor device according to claim 1, wherein each of the first, second, third, and fourth alignment marks has a polygonal shape in the plan view, and is asymmetric with respect to the center of a circumcircle of the polygonal shape.

6. The method of manufacturing a semiconductor device according to claim 2, wherein a planar size of the second semiconductor chip is larger than that of the first semiconductor chip.

7. The method of manufacturing a semiconductor device according to claim 2, wherein each of the second alignment mark and the fourth alignment mark has a polygonal shape in the plan view, and is asymmetric with respect to the center of a circumcircle of the polygonal shape.

8. The method of manufacturing a semiconductor device according to claim 2, wherein each of the first, second, third, and fourth alignment marks has a circular shape in the plan view.

9. The method of manufacturing a semiconductor device according to claim 6,
   wherein the third alignment mark of the first semiconductor chip is arranged at a periphery of the first back surface, and wherein the fourth alignment mark of the second semiconductor chip is arranged at a periphery of the second main surface.

10. The method of manufacturing a semiconductor device according to claim 9,
wherein the third alignment marks of the first semiconductor chips are arranged at a first corner of the first back surface and at a second corner positioned opposite to the first corner, the first back surface having a quadrilateral shape in plan view, and
wherein the fourth alignment marks of the second semiconductor chip are arranged at a third corner of the second main surface and at a fourth corner positioned opposite to the third corner, the second main surface having a quadrilateral shape in plan view.

11. The method of manufacturing a semiconductor device according to claim 10,
wherein the second semiconductor chip is provided with a first circuit, and
wherein the first semiconductor chip is provided with a control circuit for controlling driving of the first circuit.

12. The method of manufacturing a semiconductor device according to claim 3,
wherein the third alignment marks of the first semiconductor chips are arranged at a periphery of the first back surface with respect to the first back surface side pads, and
wherein the fourth alignment marks of the second semiconductor chips are arranged at a periphery of the second main surface with respect to the second main surface side pads.

13. The method of manufacturing a semiconductor device according to claim 3,
wherein the second main surface of the second semiconductor chip is provided with a plurality of circuit regions in which the main storage circuit is formed, and
wherein the fourth alignment marks of the second semiconductor chips are arranged at a periphery of the second main surface with respect to the circuit regions.

14. A semiconductor device, comprising:
a wiring substrate including a first surface, a plurality of bonding leads formed on the first surface, a first alignment mark formed on the first surface, a second surface opposite to the first surface, and a plurality of lands formed on the second surface and electrically connected with the bonding leads, respectively;
a first semiconductor chip including a first main surface, a first semiconductor element formed on the first main surface, a plurality of first main surface side pads formed on the first surface and electrically connected with the first semiconductor element, a second alignment mark formed at the first main surface side, a plurality of first external terminals formed at the first main surface side pads, respectively, and electrically connected with the bonding leads, a first back surface opposite to the first main surface, a plurality of first back surface side pads formed on the first back surface and electrically coupled to the first main surface side pads, and a third alignment mark formed at the first back surface, said first semiconductor chip being mounted over the first surface of the wiring substrate such that the first main surface faces the first surface of the wiring substrate; and
a second semiconductor chip arranged over the first back surface of the first semiconductor chip, the second semiconductor chip including a second main surface, a second semiconductor element formed on the second main surface, a plurality of second main surface side pads formed on the second surface and electrically connected with the second semiconductor element, a fourth alignment mark formed at the second main surface side, a plurality of second external terminals formed at the second main surface side pads, respectively, and electrically connected with the first back surface side pads, and a second back surface opposite to the second main surface.

15. The semiconductor device according to claim 14,
wherein the first back surface of the first semiconductor chip is provided with the third alignment marks, and
wherein the second main surface of the second semiconductor chip is provided with the fourth alignment marks.

16. The semiconductor device according to claim 15, wherein the second alignment mark and the fourth alignment mark have the polygonal shape in plan view, and asymmetric with respect to the center of a circumcircle of the polygonal shape.

17. The semiconductor device according to claim 15, wherein a planar size of the second semiconductor chip is larger than that of the first semiconductor chip.

18. The semiconductor device according to claim 17,
wherein the second semiconductor chip is provided with a main storage circuit, and
wherein the first semiconductor chip is provided with a control circuit for controlling driving of the main storage circuit, and an arithmetic processing circuit for performing arithmetic processing on data about a signal input and output to and from the second semiconductor chip or an external device.

19. The semiconductor device according to claim 18,
wherein the third alignment marks of the first semiconductor chips are arranged at a periphery of the first back surface with respect to the first back surface side pads, and
wherein the fourth alignment marks of the second semiconductor chips are arranged at a periphery of the second main surface with respect to the second main surface side pads.

20. The semiconductor device according to claim 18,
wherein the second main surface of the second semiconductor chip are provided with circuit regions where the main storage circuit is formed,
wherein the fourth alignment marks of the second semiconductor chips are arranged at a periphery of the second main surface with respect to the circuit regions.

* * * * *